(12) United States Patent
Rofougaran

(10) Patent No.: US 8,199,017 B2
(45) Date of Patent: Jun. 12, 2012

(54) RFID INTEGRATED CIRCUIT WITH INTEGRATED ANTENNA STRUCTURE

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/092,256

(22) Filed: Apr. 22, 2011

(65) Prior Publication Data

US 2011/0199213 A1 Aug. 18, 2011

Related U.S. Application Data

(63) Continuation of application No. 12/210,564, filed on Sep. 15, 2008, now Pat. No. 7,965,191, which is a continuation-in-part of application No. 11/648,826, filed on Dec. 29, 2006, now Pat. No. 7,893,878, and a continuation-in-part of application No. 11/472,205, filed on Jun. 21, 2006.

(51) Int. Cl.
*G08B 13/14* (2006.01)

(52) U.S. Cl. .................... 340/572.7; 340/572.4

(58) Field of Classification Search ............... 340/572.1, 340/572.4, 572.7, 539.11, 10.1, 10.3, 10.32; 235/487, 488; 343/700 MS, 741, 767, 895
See application file for complete search history.

(56) References Cited

U.S. PATENT DOCUMENTS

| | | | |
|---|---|---|---|
| 6,509,217 B1 * | 1/2003 | Reddy | 438/153 |
| 7,095,372 B2 * | 8/2006 | Soler Castany et al. | 343/700 MS |
| 7,212,125 B2 * | 5/2007 | Shanks et al. | 340/572.7 |
| 7,336,243 B2 * | 2/2008 | Jo et al. | 343/895 |
| 7,576,657 B2 * | 8/2009 | Duron et al. | 340/572.7 |
| 7,804,407 B2 * | 9/2010 | Copeland | 340/572.1 |
| 2007/0262866 A1 * | 11/2007 | Eveland | 340/572.7 |

* cited by examiner

*Primary Examiner* — Van T. Trieu
(74) *Attorney, Agent, or Firm* — Garlick & Markison; Bruce E. Stuckman

(57) ABSTRACT

An integrated circuit for use in an RFID tag includes an integrated circuit die having a circuit, a radio frequency identification (RFID) interface for providing communication between the circuit and a remote RFID reader via RF signaling between the RFID interface and the remote RFID reader. An antenna section facilitates the RF signaling between the RFID and the remote RFID reader. A substrate is coupled to support the first integrated circuit die and at least a portion of the antenna section.

18 Claims, 51 Drawing Sheets

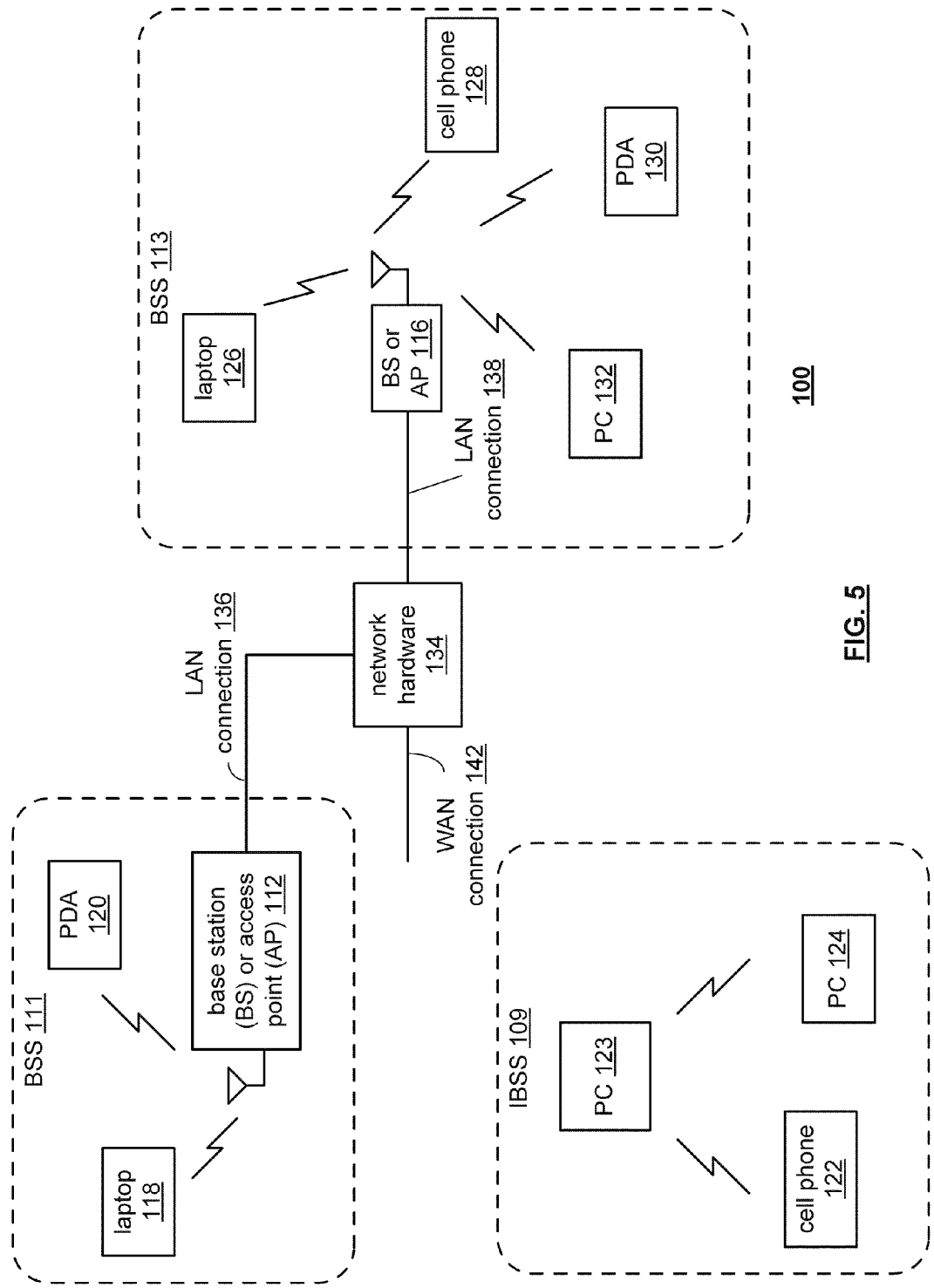

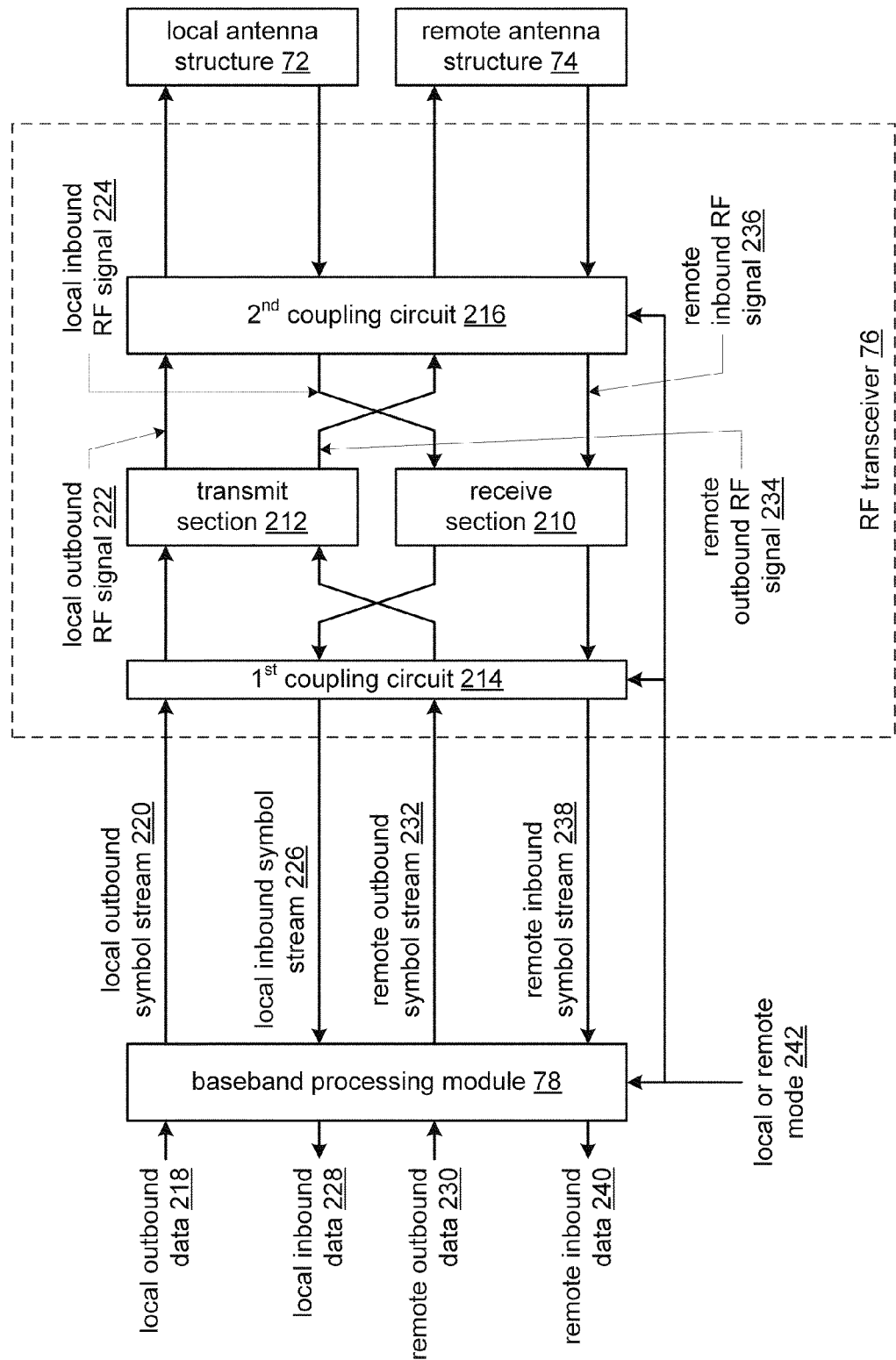

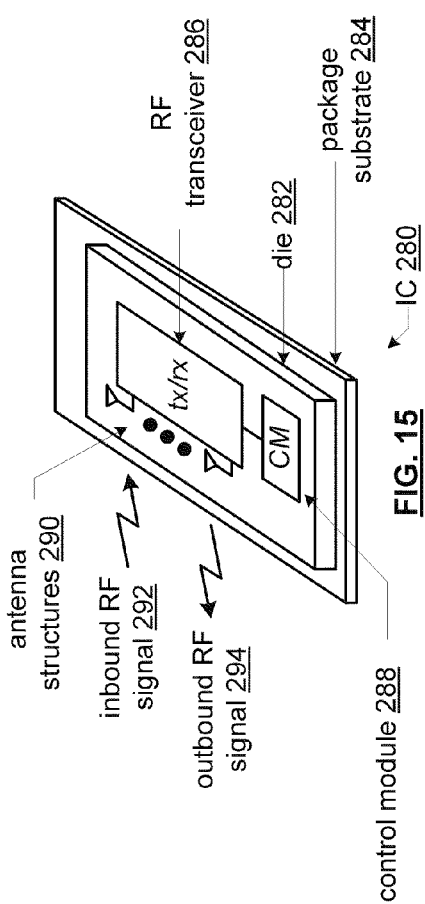
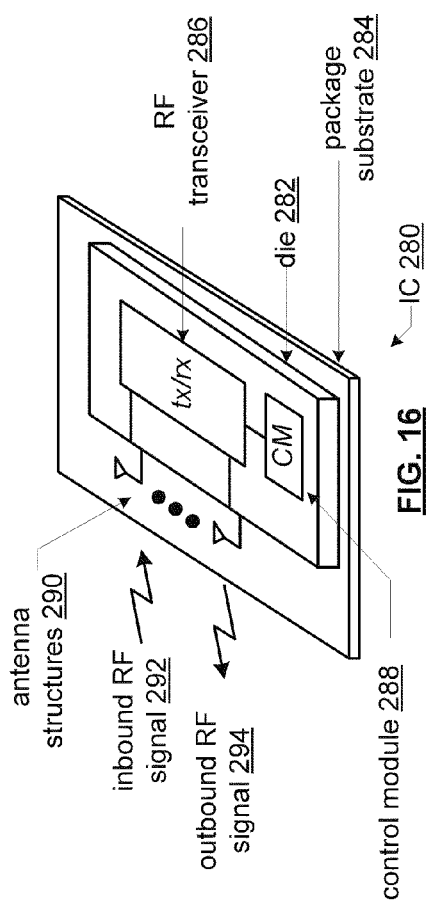

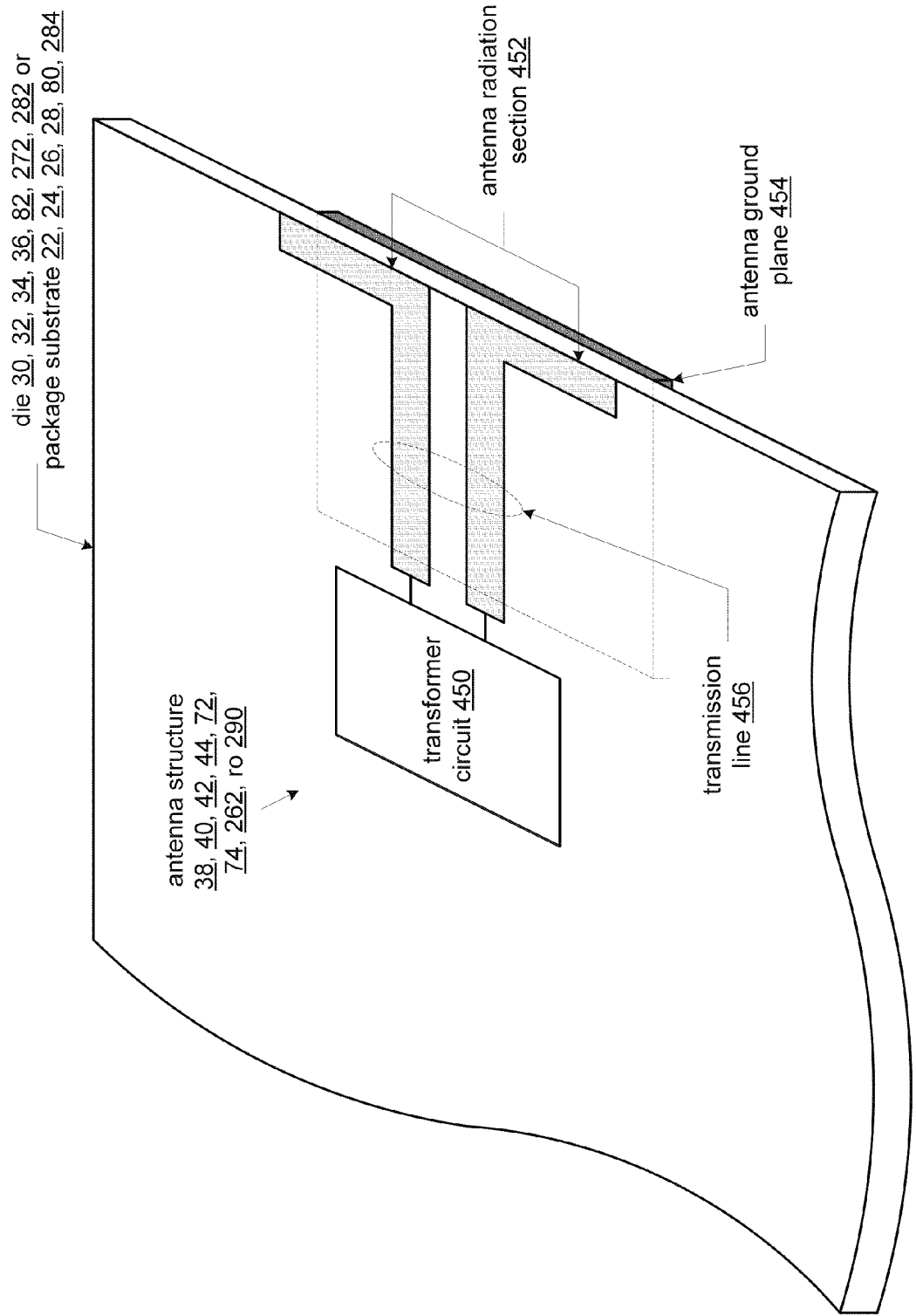

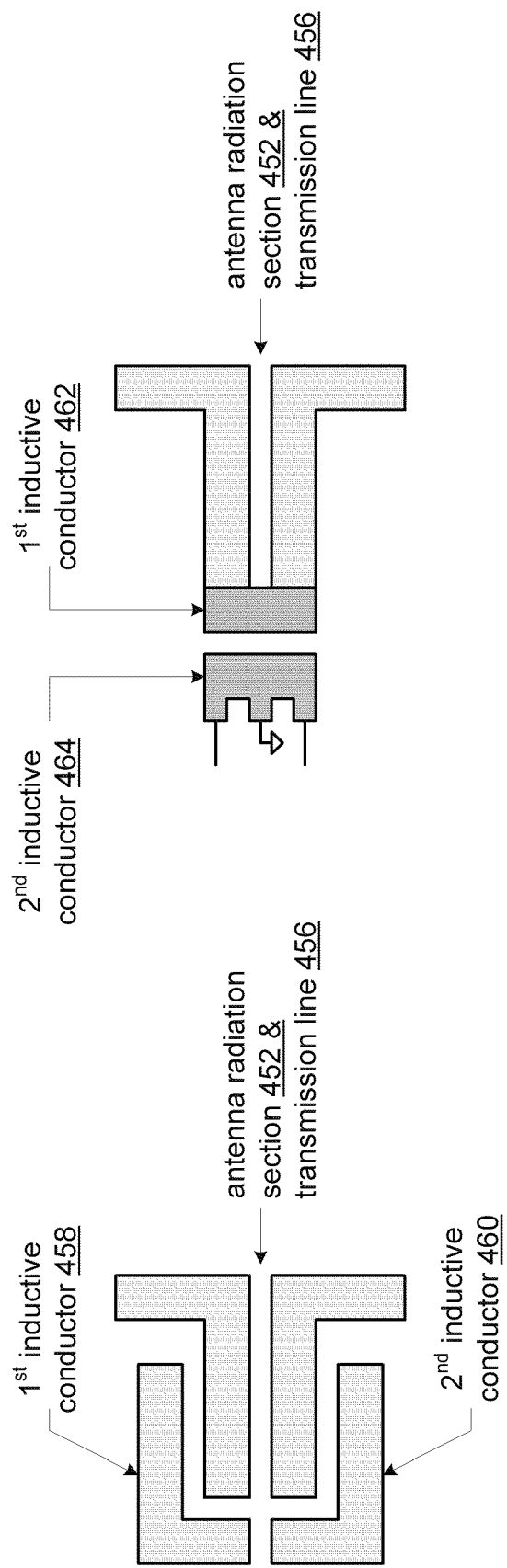

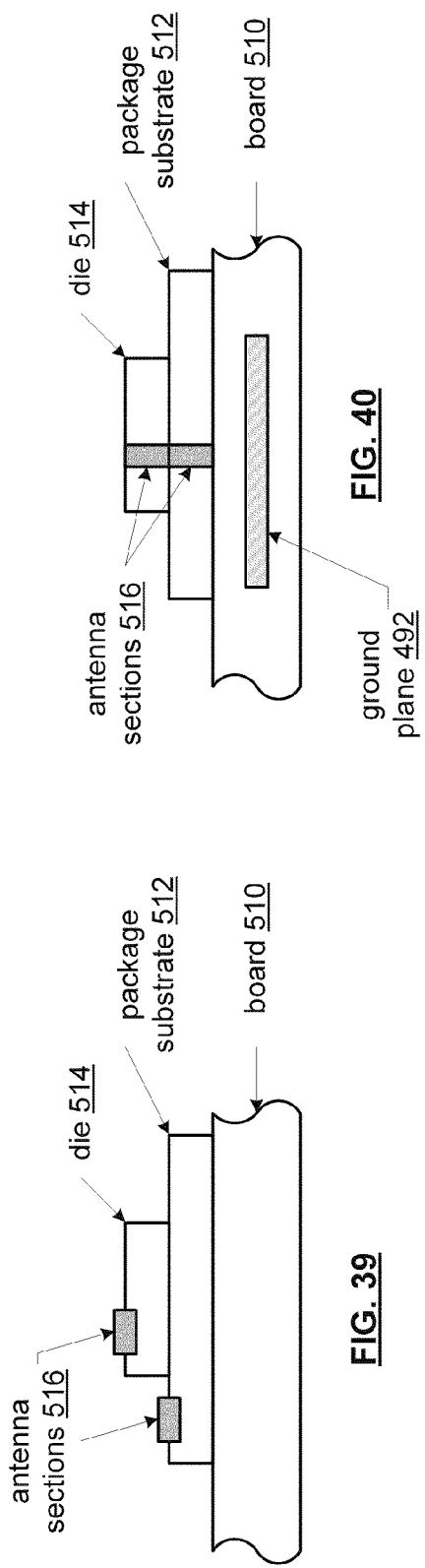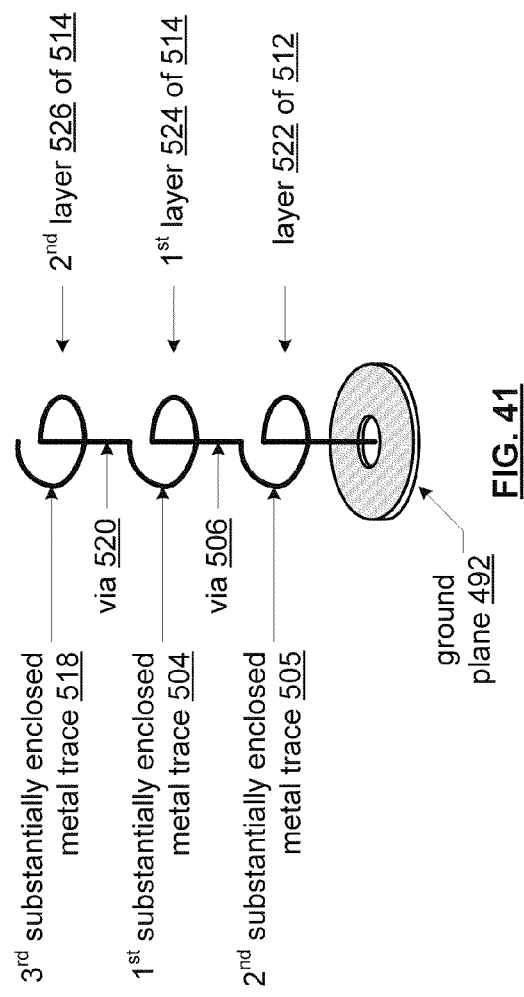

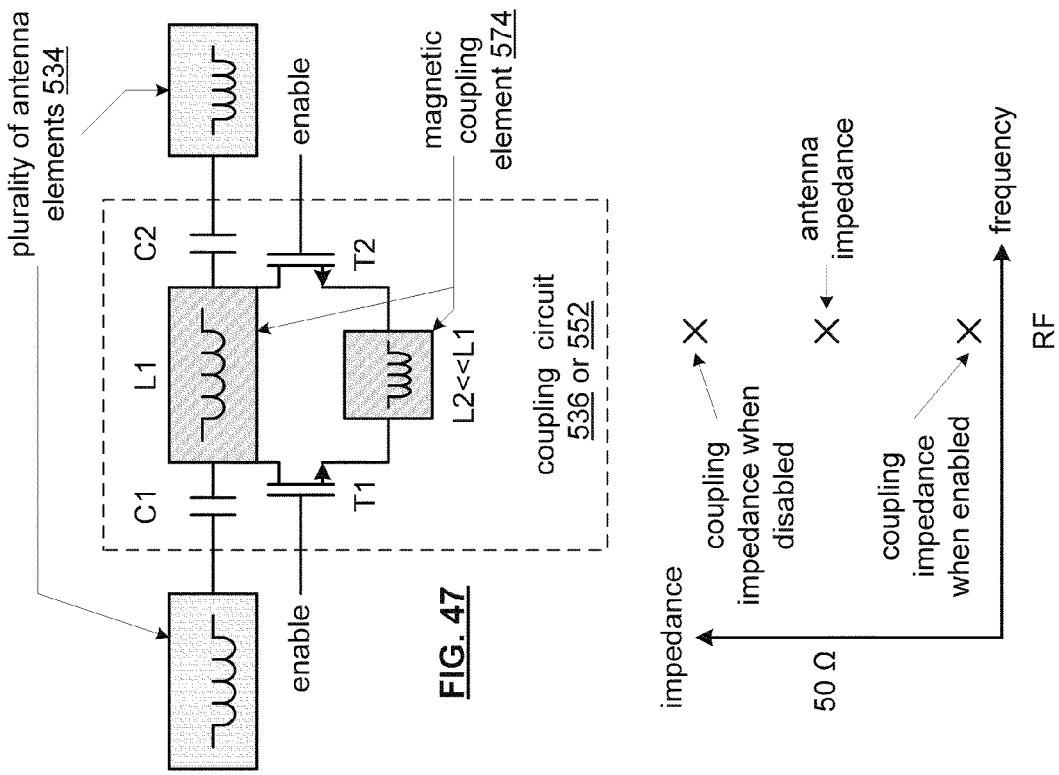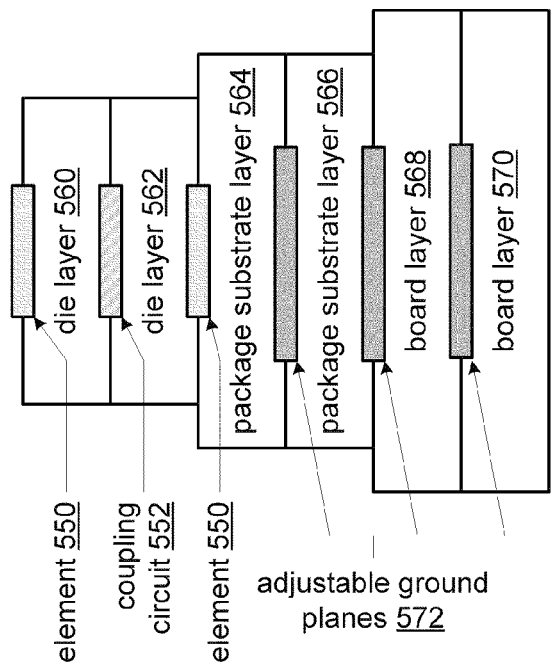

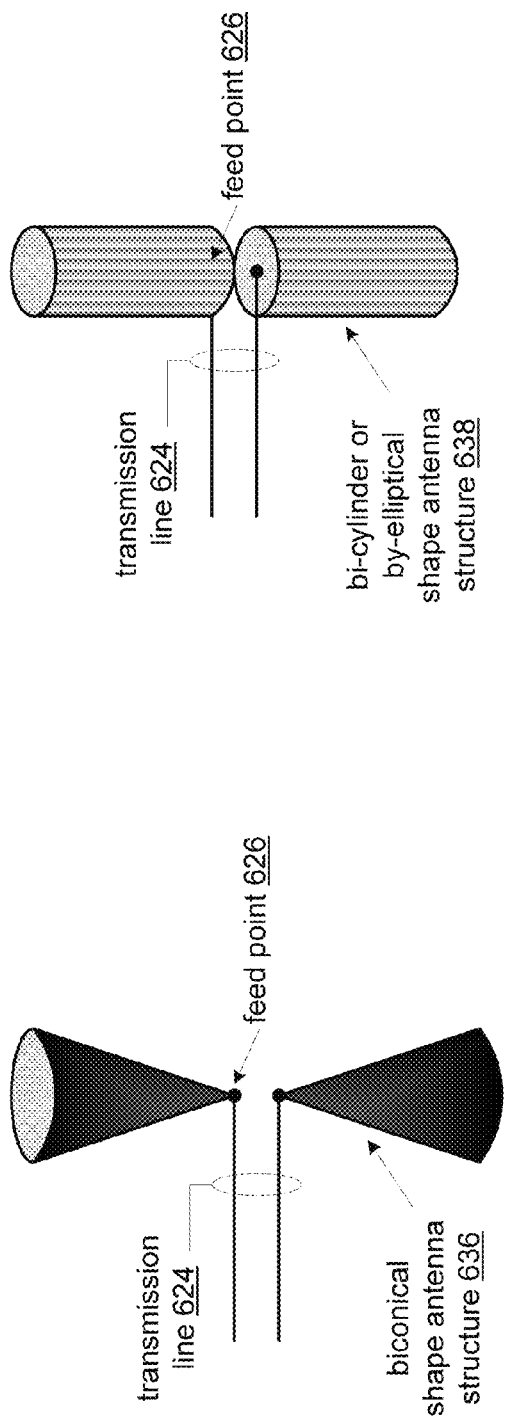
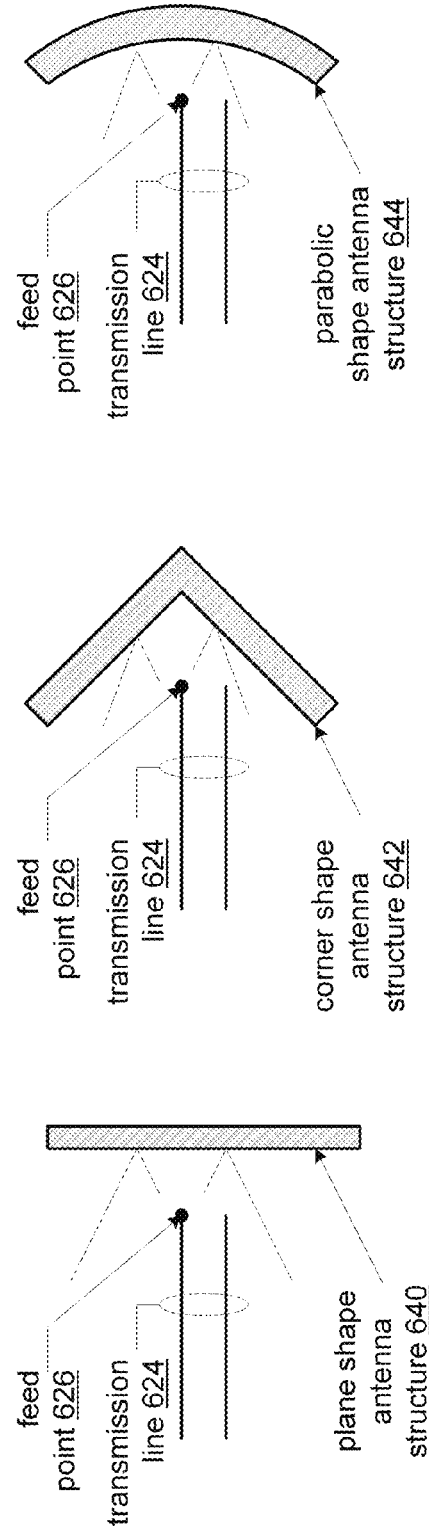

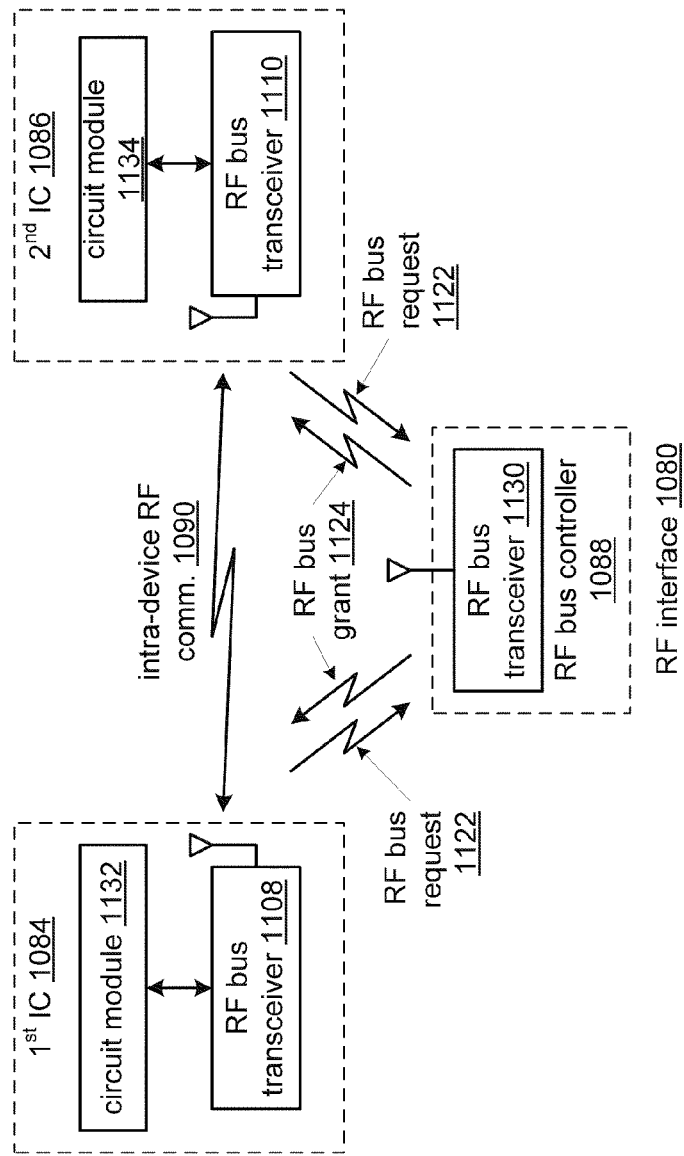

RFID INTEGRATED CIRCUIT WITH INTEGRATED ANTENNA STRUCTURE

CROSS REFERENCE TO RELATED PATENTS

1. The present U.S. Utility Patent Application claims priority pursuant to 35 U.S.C. §120, as a continuation, to U.S. patent application Ser. No. 12/210,564, entitled "RFID INTEGRATED CIRCUIT WITH INTEGRATED ANTENNA STRUCTURE," filed Sep. 15, 2008, and issued as U.S. Pat. No. 7,965,191, which claims priority under 35 U.S.C. 120 as a continuation-in-part of the following U.S. patent applications:

U.S. patent application Ser. No. 11/648,826, entitled "AN INTEGRATED CIRCUIT ANTENNA STRUCTURE," filed Dec. 29, 2006; issued as U.S. Pat. No. 7,893,878; and U.S. patent application Ser. No. 11/472,205, entitled "INTEGRATED CIRCUIT ASSEMBLY INCLUDING RFID AND COMPONENTS THEREOF," filed Jun. 21, 2006, pending;

which are hereby incorporated herein by reference in their entirety and made part of the present U.S. Utility Patent Application for all purposes.

2. The present application is further related to the following U.S. patent applications that are commonly owned, the contents of which are hereby incorporated by reference thereto:

U.S. Utility patent application Ser. No. 12/210,595 entitled "INTEGRATED CIRCUIT WITH POWER SUPPLY LINE ANTENNA STRUCTURE AND METHODS FOR USE THEREWITH," filed Sep. 15, 2008, pending;

U.S. Utility patent application Ser. No. 12/210,616, entitled "INTEGRATED CIRCUIT WITH BONDING WIRE ANTENNA STRUCTURE AND METHODS FOR USE THEREWITH," filed Sep. 15, 2008, pending; and U.S. Utility patent application Ser. No. 12/210,648, entitled "INTEGRATED CIRCUIT WITH ELECTROMAGNETIC INTRACHIP COMMUNICATION AND METHODS FOR USE THEREWITH," filed Sep. 15, 2008, pending.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to wireless communication and more particularly to integrated circuits used to support wireless communications.

2. Description of Related Art

Communication systems are known to support wireless and wire lined communications between wireless and/or wire lined communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Since the wireless part of a wireless communication begins and ends with the antenna, a properly designed antenna structure is an important component of wireless communication devices. As is known, the antenna structure is designed to have a desired impedance (e.g., 50 Ohms) at an operating frequency, a desired bandwidth centered at the desired operating frequency, and a desired length (e.g., ¼ wavelength of the operating frequency for a monopole antenna). As is further known, the antenna structure may include a single monopole or dipole antenna, a diversity antenna structure, the same polarization, different polarization, and/or any number of other electro-magnetic properties.

One popular antenna structure for RF transceivers is a three-dimensional in-air helix antenna, which resembles an expanded spring. The in-air helix antenna provides a magnetic omni-directional mono pole antenna. Other types of three-dimensional antennas include aperture antennas of a rectangular shape, horn shaped, etc; three-dimensional dipole antennas having a conical shape, a cylinder shape, an elliptical shape, etc.; and reflector antennas having a plane reflector, a corner reflector, or a parabolic reflector. An issue with such three-dimensional antennas is that they cannot be implemented in the substantially two-dimensional space of an integrated circuit (IC) and/or on the printed circuit board (PCB) supporting the IC.

Two-dimensional antennas are known to include a meandering pattern or a micro strip configuration. For efficient antenna operation, the length of an antenna should be ¼ wavelength for a monopole antenna and ½ wavelength for a dipole antenna, where the wavelength ($\lambda$)=c/f, where c is the speed of light and f is frequency. For example, a ¼ wavelength antenna at 900 MHz has a total length of approximately 8.3 centimeters (i.e., $0.25*(3\times10^8$ m/s)/($900\times10^6$ c/s) $=0.25*33$ cm, where m/s is meters per second and c/s is cycles per second). As another example, a ¼ wavelength antenna at 2400 MHz has a total length of approximately 3.1 cm (i.e., $0.25*(3\times10^8$ m/s)/($2.4\times10^9$ c/s)$=0.25*12.5$ cm). As such, due to the antenna size, it cannot be implemented on-chip since a relatively complex IC having millions of transistors has a size of 2 to 20 millimeters by 2 to 20 millimeters.

As IC fabrication technology continues to advance, ICs will become smaller and smaller with more and more transistors. While this advancement allows for reduction in size of electronic devices, it does present a design challenge of providing and receiving signals, data, clock signals, operational instructions, etc., to and from a plurality of ICs of the device. Currently, this is addressed by improvements in IC packaging and multiple layer PCBs. For example, ICs may include a ball-grid array of 100-200 pins in a small space (e.g., 2 to 20 millimeters by 2 to 20 millimeters). A multiple layer PCB includes traces for each one of the pins of the IC to route to at least one other component on the PCB. Clearly, advancements in communication between ICs is needed to adequately support the forth-coming improvements in IC fabrication.

Therefore, a need exists for an integrated circuit antenna structure and wireless communication applications thereof.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 5 is a schematic block diagram of an embodiment of a wireless communication system in accordance with the present invention;

FIG. 11 is a schematic block diagram of another embodiment of an IC in accordance with the present invention;

FIGS. 13-16 are diagrams of various embodiments of an IC in accordance with the present invention;

FIGS. 28-42 are diagrams of various embodiments of an antenna structure in accordance with the present invention;

FIGS. 44-46 are diagrams of various embodiments of an antenna structure in accordance with the present invention;

FIG. 47 is a diagram of an embodiment of a coupling circuit in accordance with the present invention;

FIG. 48 is a diagram of impedance v. frequency for an embodiment of a coupling circuit in accordance with the present invention;

FIGS. 53-66 are diagrams of various embodiments of an antenna structure in accordance with the present invention;

FIGS. 82-83 are schematic block diagrams of other embodiments of a device in accordance with the present invention;

FIG. 84 is a diagram of an embodiment of a frame of an intra-device wireless communication in accordance with the present invention.

DETAILED DESCRIPTION OF THE INVENTION

Figure 1:
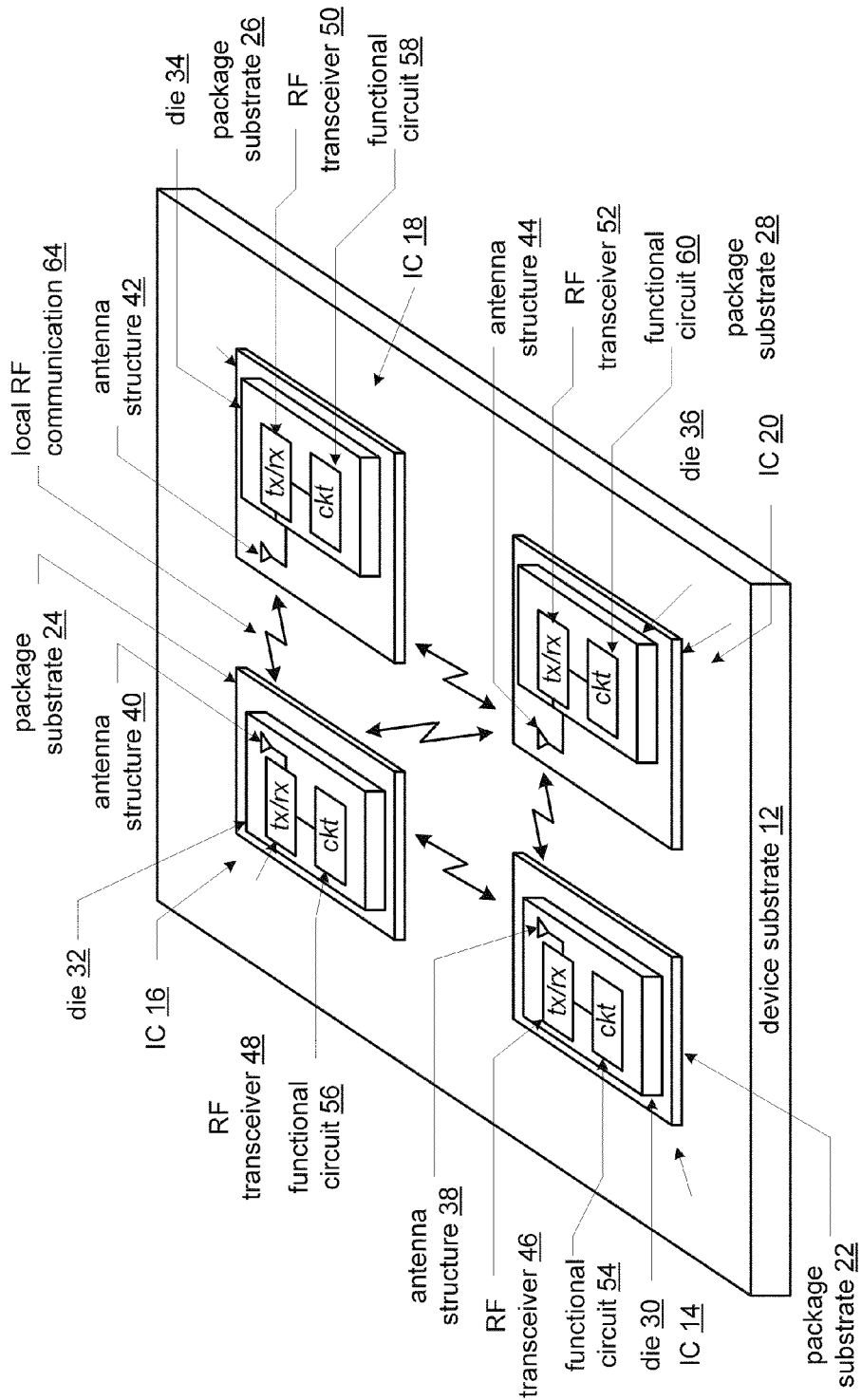
FIG. 1 is a diagram of an embodiment of a device including a plurality of integrated circuits in accordance with the present invention.

FIG. 1 is a diagram of an embodiment of a device 10 that includes a device substrate 12 and a plurality of integrated circuits (IC) 14-20. Each of the ICs 14-20 includes a package substrate 22-28 and a die 30-36. Dies 30 and 32 of ICs 14 and 16 include an antenna structure 38, 40, a radio frequency (RF) transceiver 46, 48, and a functional circuit 54, 56. Dies 34 and 36 of ICs 18 and 20 include an RF transceiver 50, 52 and a function circuit 58, 60. Package substrates 26 and 28 of ICs 18 and 20 include an antenna structure 42, 44 coupled to the RF transceiver 50, 52.

The device 10 may be any type of electronic equipment that includes integrated circuits. For example, but far from an exhaustive list, the device 10 may be a personal computer, a laptop computer, a hand held computer, a wireless local area network (WLAN) access point, a WLAN station, a cellular telephone, an audio entertainment device, a video entertainment device, a video game control and/or console, a radio, a cordless telephone, a cable set top box, a satellite receiver, network infrastructure equipment, a cellular telephone base station, and Bluetooth head set. Accordingly, the functional circuit 54-60 may include one or more of a WLAN baseband processing module, a WLAN RF transceiver, a RFID transceiver, a cellular voice baseband processing module, a cellular voice RF transceiver, a cellular data baseband processing module, a cellular data RF transceiver, a local infrastructure communication (LIC) baseband processing module, a gateway processing module, a router processing module, a game controller circuit, a game console circuit, a microprocessor, a microcontroller, and memory.

In one embodiment, the dies 30-36 may be fabricated using complimentary metal oxide (CMOS) technology and the package substrate may be a printed circuit board (PCB). In other embodiments, the dies 30-36 may be fabricated using Gallium-Arsenide technology, Silicon-Germanium technology, bi-polar, bi-CMOS, and/or any other type of IC fabrication technique. In such embodiments, the package substrate 22-28 may be a printed circuit board (PCB), a fiberglass board, a plastic board, and/or some other non-conductive material board. Note that if the antenna structure is on the die, the package substrate may simply function as a supporting structure for the die and contain little or no traces.

In an embodiment, the RF transceivers 46-52 provide local wireless communication (e.g., IC to IC communication). In this embodiment, when a functional circuit of one IC has information (e.g., data, operational instructions, files, etc.) to communication to another functional circuit of another IC, the RF transceiver of the first IC conveys the information via a wireless path to the RF transceiver of the second IC. In this manner, some to all of the IC to IC communications may be done wirelessly. As such, the device substrate 12 may include little or no conductive traces to provide communication paths between the ICs 14-20. For example, the device substrate 12 may be a fiberglass board, a plastic board, and/or some other non-conductive material board.

In one embodiment, a baseband processing module of the first IC converts outbound data (e.g., data, operational instructions, files, etc.) into an outbound symbol stream. The conversion of outbound data into an outbound symbol stream may be done in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the outbound data into the outbound system stream may include one or more of scrambling, encoding, puncturing, interleaving, constellation mapping, modulation, frequency to time domain conversion, space-time block encoding, space-frequency block encoding, beamforming, and digital baseband to IF conversion.

The RF transceiver of the first IC converts the outbound symbol stream into an outbound RF signal as will be subsequently described with reference to FIGS. 6-12 and 17-20. The antenna structure of the first IC is coupled to the RF transceiver and transmits the outbound RF signal, which has a carrier frequency within a frequency band of approximately 55 GHz to 64 GHz. Accordingly, the antenna structure includes electromagnetic properties to operate within the frequency band. Note that various embodiments of the antenna structure including optional waveguide implementations will be described in FIGS. 21-81. Further note that frequency band above 60 GHz may be used for the local communications.

The antenna structure of the second IC receives the RF signal as an inbound RF signal and provides them to the RF transceiver of the second IC. The RF transceiver converts, as will be subsequently described with reference to FIGS. 6-12 and 17-20, the inbound RF signal into an inbound symbol stream and provides the inbound symbol stream to a baseband processing module of the second IC. The baseband processing module of the second IC converts the inbound symbol stream into inbound data in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the inbound system stream into the inbound data may include one or more of descrambling, decoding, depuncturing, deinterleaving, constellation demapping, demodulation, time to frequency domain conversion, space-time block decoding, space-frequency block decoding, de-beamforming, and IF to digital baseband conversion. Note that the baseband processing modules of the first and second ICs may be on same die as RF transceivers or on a different die within the respective IC.

In other embodiments, each IC 14-20 may include a plurality of RF transceivers and antenna structures on-die and/or on-package substrate to support multiple simultaneous RF communications using one or more of frequency offset, phase offset, wave-guides (e.g., use waveguides to contain a majority of the RF energy), frequency reuse patterns, frequency division multiplexing, time division multiplexing, null-peak multiple path fading (e.g., ICs in nulls to attenuate signal strength and ICs in peaks to accentuate signal strength), frequency hopping, spread spectrum, space-time offsets, and space-frequency offsets. Note that the device 10 is shown to only include four ICs 14-20 for ease of illustrate, but may include more or less than four ICs in practical implementations.

Figure 2:
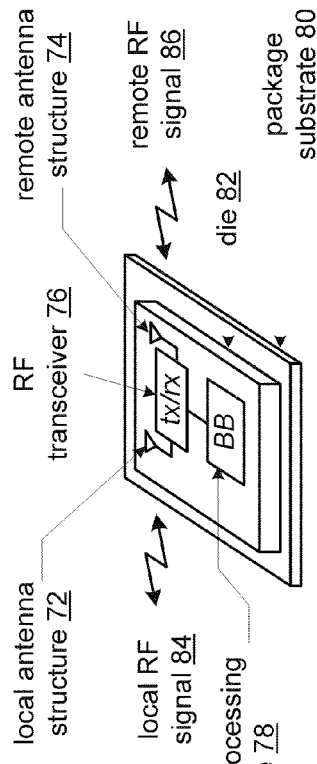
FIGS. 2-4 are diagrams of various embodiments of an integrated circuit (IC) in accordance with the present invention.

FIG. 2 is a diagram of an embodiment of an integrated circuit (IC) 70 that includes a package substrate 80 and a die 82. The die includes a baseband processing module 78, an RF transceiver 76, a local antenna structure 72, and a remote antenna structure 74. The baseband processing module 78 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 78 may have an associated memory and/or memory element, which may be a single memory device, a plurality of memory devices, and/or embedded circuitry of the processing module 78. Such a memory device may be a read-only memory, random access memory, volatile memory, non-volatile memory, static memory, dynamic memory, flash memory, cache memory, and/or any device that stores digital information. Note that when the processing module 78 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module 78 executes, hard coded and/or operational instructions corresponding to at least some of the steps and/or functions illustrated in FIGS. 2-20.

In one embodiment, the IC 70 supports local and remote communications, where local communications are of a very short range (e.g., less than 0.5 meters) and remote communications are of a longer range (e.g., greater than 1 meter). For example, local communications may be IC to IC communications, IC to board communications, and/or board to board communications within a device and remote communications may be cellular telephone communications, WLAN communications, RFID communications, Bluetooth piconet communications, walkie-talkie communications, etc. Further, the content of the remote communications may include graphics, digitized voice signals, digitized audio signals, digitized video signals, and/or outbound text signals.

To support a local communication, the baseband processing module 78 convert local outbound data into the local outbound symbol stream. The conversion of the local outbound data into the local outbound symbol stream may be done in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the outbound data into the outbound system stream may include one or more of scrambling, encoding, puncturing, interleaving, constellation mapping, modulation, frequency to time domain conversion, space-time block encoding, space-frequency block encoding, beamforming, and digital baseband to IF conversion.

The RF transceiver 76 converts the local outbound symbol stream into a local outbound RF signal and provides it to the local antenna structure 72. Various embodiments of the RF transceiver 76 will be described with reference to FIGS. 11 and 12.

The local antenna structure 72 transmits the local outbound RF signals 84 within a frequency band of approximately 55 GHz to 64 GHz. Accordingly, the local antenna structure 72 includes electromagnetic properties to operate within the frequency band. Note that various embodiments of the antenna structure will be described in FIGS. 21-81. Further note that frequency band above 60 GHz may be used for the local communications.

For local inbound signals, the local antenna structure 72 receives a local inbound RF signal 84, which has a carrier frequency within the frequency band of approximately 55 GHz to 64 GHz. The local antenna structure 72 provides the local inbound RF signal 84 to the RF transceiver, which converts the local inbound RF signal into a local inbound symbol stream.

The baseband processing module 78 converts the local inbound symbol stream into local inbound data in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the inbound system stream into the inbound data may include one or more of descrambling, decoding, depuncturing, deinterleaving, constellation demapping, demodulation, time to frequency domain conversion, space-time block decoding, space-frequency block decoding, de-beamforming, and IF to digital baseband conversion.

To support a remote communication, the baseband processing module 78 convert remote outbound data into a remote outbound symbol stream. The conversion of the remote outbound data into the remote outbound symbol stream may be done in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the outbound data into the outbound system stream may include one or more of scrambling, encoding, puncturing, interleaving, constellation mapping, modulation, frequency to time domain conversion, space-time block encoding, space-frequency block encoding, beamforming, and digital baseband to IF conversion.

The RF transceiver 76 converts the remote outbound symbol stream into a remote outbound RF signal and provides it to the remote antenna structure 74. The remote antenna structure 74 transmits the remote outbound RF signals 86 within a frequency band. The frequency band may be 900 MHz, 1800 MHz, 2.4 GHz, 5 GHz, or approximately 55 GHz to 64 GHz. Accordingly, the remote antenna structure 74 includes electromagnetic properties to operate within the frequency band. Note that various embodiments of the antenna structure will be described in FIGS. 21-81.

For remote inbound signals, the remote antenna structure 74 receives a remote inbound RF signal 86, which has a carrier frequency within the frequency band. The remote antenna structure 74 provides the remote inbound RF signal 86 to the RF transceiver, which converts the remote inbound RF signal into a remote inbound symbol stream.

The baseband processing module 78 converts the remote inbound symbol stream into remote inbound data in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the inbound system stream into the inbound data may include one or more of descrambling, decoding, depuncturing, deinterleaving, constellation demapping, demodulation, time to frequency domain conversion, space-time block decoding, space-frequency block decoding, de-beamforming, and IF to digital baseband conversion.

Figure 3:
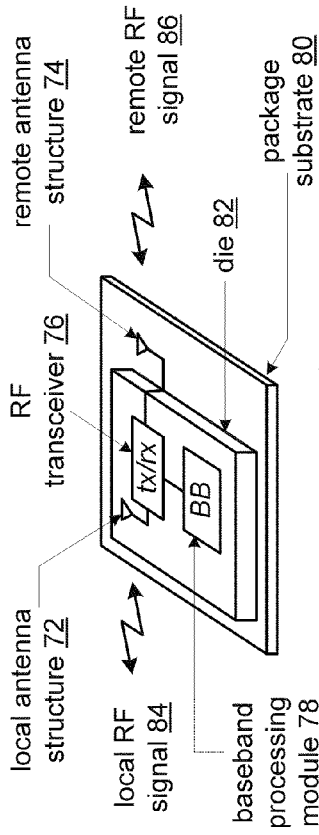

FIG. 3 is a diagram of an embodiment of an integrated circuit (IC) 70 that includes a package substrate 80 and a die 82. This embodiment is similar to that of FIG. 2 except that the remote antenna structure 74 is on the package substrate 80. Accordingly, IC 70 includes a connection from the remote antenna structure 74 on the package substrate 80 to the RF transceiver 76 on the die 82.

Figure 4:
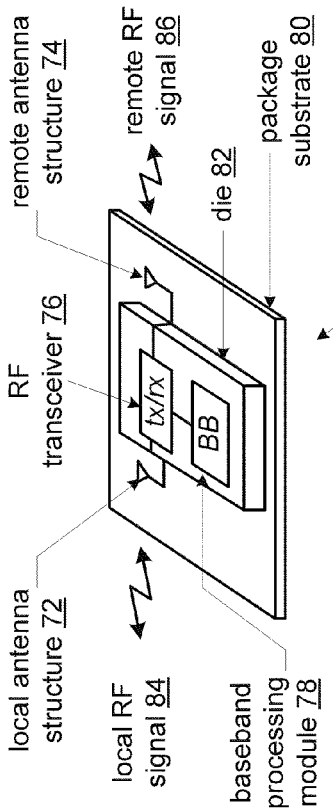

FIG. 4 is a diagram of an embodiment of an integrated circuit (IC) 70 that includes a package substrate 80 and a die 82. This embodiment is similar to that of FIG. 2 except that both the local antenna structure 72 and the remote antenna structure 74 on the package substrate 80. Accordingly, IC 70 includes connections from the remote antenna structure 74 on the package substrate 80 to the RF transceiver 76 on the die 82 and form the local antenna structure 72 on the package substrate 72 to the RF transceiver 76 on the die 82.

FIG. 5 is a schematic block diagram of an embodiment of a wireless communication system 100 that includes a plurality of base stations and/or access points 112, 116, a plurality of wireless communication devices 118-132 and a network hardware component 134. Note that the network hardware 134, which may be a router, switch, bridge, modem, system controller, et cetera provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128 that include a built in radio transceiver and/or have an associated radio transceiver such as the ones illustrate in FIGS. 2-4.

Wireless communication devices 122, 123, and 124 are located within an independent basic service set (IBSS) area 109 and communicate directly (i.e., point to point), which, with reference to FIGS. 2-4, is a remote communication. In this configuration, devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 11 and 13, respectively, and are operably coupled to the network hardware 134 via local area network connections 136, 138. Such a connection provides the base station or access point 112, 116 with connectivity to other devices within the system 100 and provides connectivity to other networks via the WAN connection 142. To communicate (e.g., remote communications) with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems and like-type systems, while access points, or master transceivers, are used for in-home or in-building wireless networks (e.g., IEEE 802.11 and versions thereof, Bluetooth, RFID, and/or any other type of radio frequency based network protocol). Regardless of the particular type of communication system, each wireless communication device includes a built-in radio and/or is coupled to a radio. Note that one or more of the wireless communication devices may include an RFID reader and/or an RFID tag.

Figure 6:
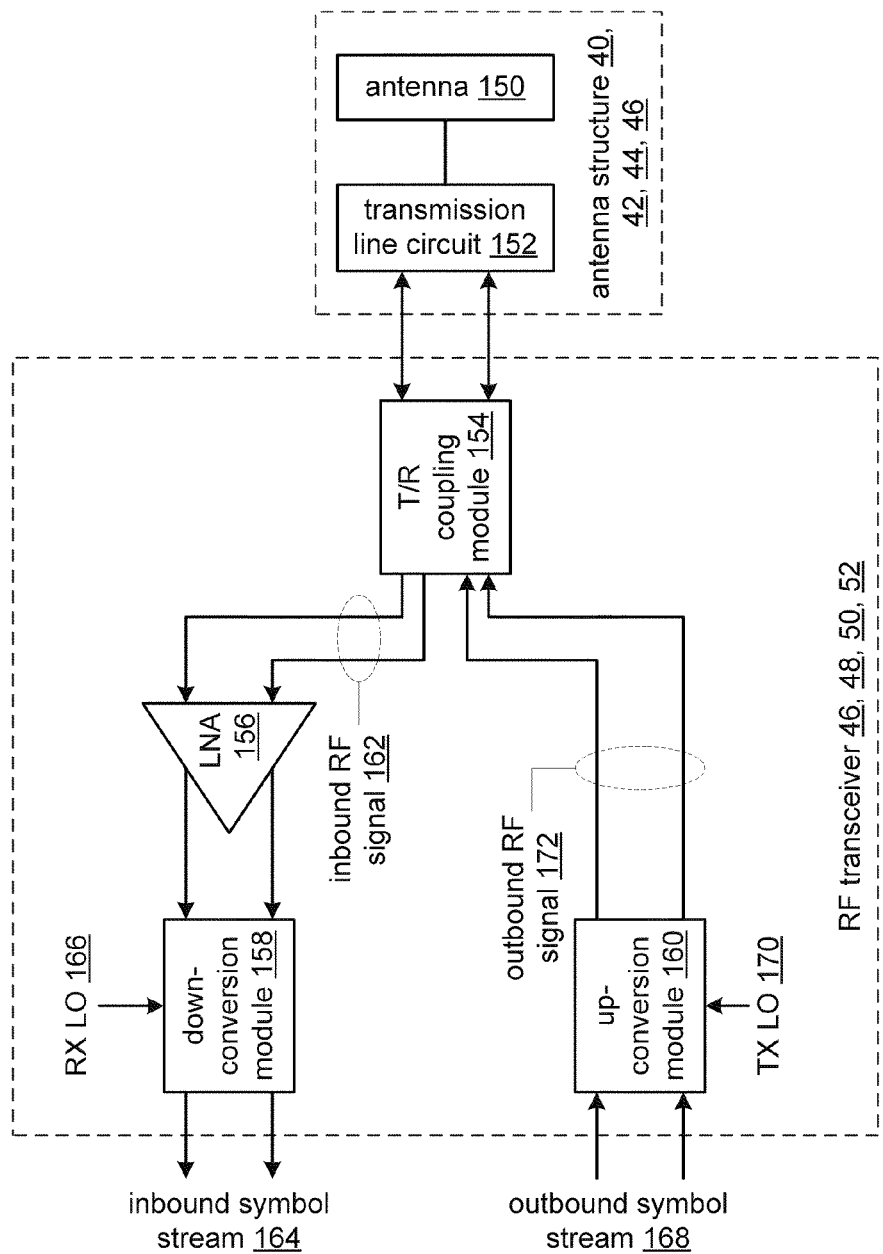
FIG. 6 is a schematic block diagram of an embodiment of an IC in accordance with the present invention.

FIG. 6 is a schematic block diagram of an embodiment of IC 14-20 that includes the antenna structure 40-46 and the RF transceiver 46-52. The antenna structure 40-46 includes an antenna 150 and a transmission line circuit 152. The RF transceiver 46-52 includes a transmit/receive (T/R) coupling module 154, a low noise amplifier (LNA) 156, a down-conversion module 158, and an up-conversion module 160.

The antenna 150, which may be any one of the antennas illustrated in FIGS. 21, 22, 28-32, 34-46, 53-56, and 58-81, receives an inbound RF signal and provides it to the transmission line circuit 152. The transmission line circuit 152, which includes one or more of a transmission line, a transformer, and an impedance matching circuit as illustrated in FIGS. 21, 22, 28-32, 34, 42-50, 53-56, and 58-81, provides the inbound RF signal to the T/R coupling module 154 of the RF transceiver 46-52. Note that the antenna structure 40-46 may be on the die, on the package substrate, or a combination thereof. For example, the antenna 150 may be on the package substrate while the transmission line circuit is on the die.

The T/R coupling module 154, which may be a T/R switch, or a transformer balun, provides the inbound RF signal 162 to the LNA 156. The LNA 156 amplifies the inbound RF signal 156 to produce an amplified inbound RF signal. The down-conversion module 158 converts the amplified inbound RF signal into the inbound symbol stream 164 based on a receive local oscillation 166. In one embodiment, the down-conversion module 158 includes a direct conversion topology such that the receive local oscillation 166 has a frequency corresponding to the carrier frequency of the inbound RF signal. In another embodiment, the down-conversion module 158 includes a superheterodyne topology. Note that while the inbound RF signal 162 and the inbound symbol stream 164 are shown as differential signals, they may be single-ended signals.

The up-conversion module 160 converts an outbound symbol stream 168 into an outbound RF signal 172 based on a transmit local oscillation 170. Various embodiments of the up-conversion module 160 will be subsequently described with reference to FIGS. 8-10. In this embodiment, the up-conversion module 160 provides the outbound RF signal 172 directly to the T/R coupling module 154. In other words, since the transmit power for a local communication is very small (e.g., <-25 dBm), a power amplifier is not needed. Thus, the up-conversion module 160 is directly coupled to the T/R coupling module 154.

The T/R coupling module 154 provides the outbound RF signal 172 to the transmission line circuit 152, which in turn, provides the outbound RF signal 172 to the antenna 150 for transmission.

Figure 7:
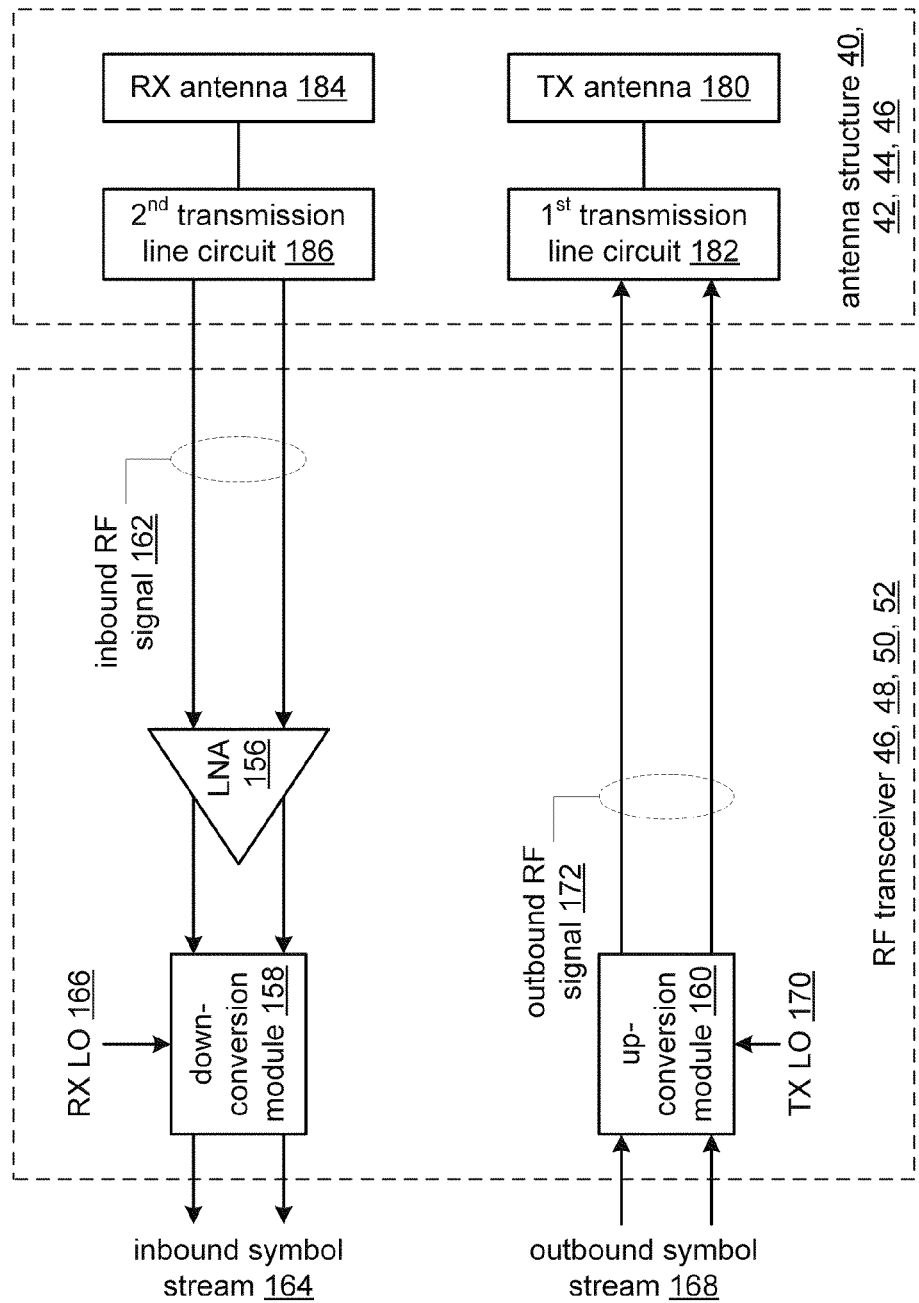
FIG. 7 is a schematic block diagram of another embodiment of an IC in accordance with the present invention.

FIG. 7 is a schematic block diagram of another embodiment of IC 14-20 that includes the antenna structure 40-46 and the RF transceiver 46-52. The antenna structure 40-46 includes a receive (RX) antenna 184, a $2^{nd}$ transmission line circuit 186, a transmit (TX) antenna 180, and a $1^{st}$ transmission line circuit 182. The RF transceiver 46-52 includes a low noise amplifier (LNA) 156, a down-conversion module 158, and an up-conversion module 160.

The RX antenna 184, which may be any one of the antennas illustrated in FIGS. 21, 22, 28-32, 34-46, 53-56, and 58-81, receives an inbound RF signal and provides it to the $2^{nd}$ transmission line circuit 186. The $2^{nd}$ transmission line circuit 186, which includes one or more of a transmission line, a transformer, and an impedance matching circuit as illustrated in FIGS. 21, 22, 28-32, 34, 42-50, 53-56, and 58-81, provides the inbound RF signal 162 to the LNA 156. The LNA 156 amplifies the inbound RF signal 156 to produce an amplified inbound RF signal. The down-conversion module 158 converts the amplified inbound RF signal into the inbound symbol stream 164 based on the receive local oscillation 166.

The up-conversion module 160 converts the outbound symbol stream 168 into an outbound RF signal 172 based on a transmit local oscillation 170. The up-conversion module 160 provides the outbound RF signal 172 to the $1^{st}$ transmission line circuit 182. The $1^{st}$ transmission line circuit 182, which includes one or more of a transmission line, a transformer, and an impedance matching circuit as illustrated in FIGS. 21, 22, 28-32, 34, 42-50, 53-56, and 58-81, provides the outbound RF signal 172 to the TX antenna 180 for transmission. Note that the antenna structure 40-46 may be on the die, on the package substrate, or a combination thereof. For example, the RX and/or TX antennas 184 and/or 180 may be on the package substrate while the transmission line circuits 182 and 186 are on the die.

Figure 8:
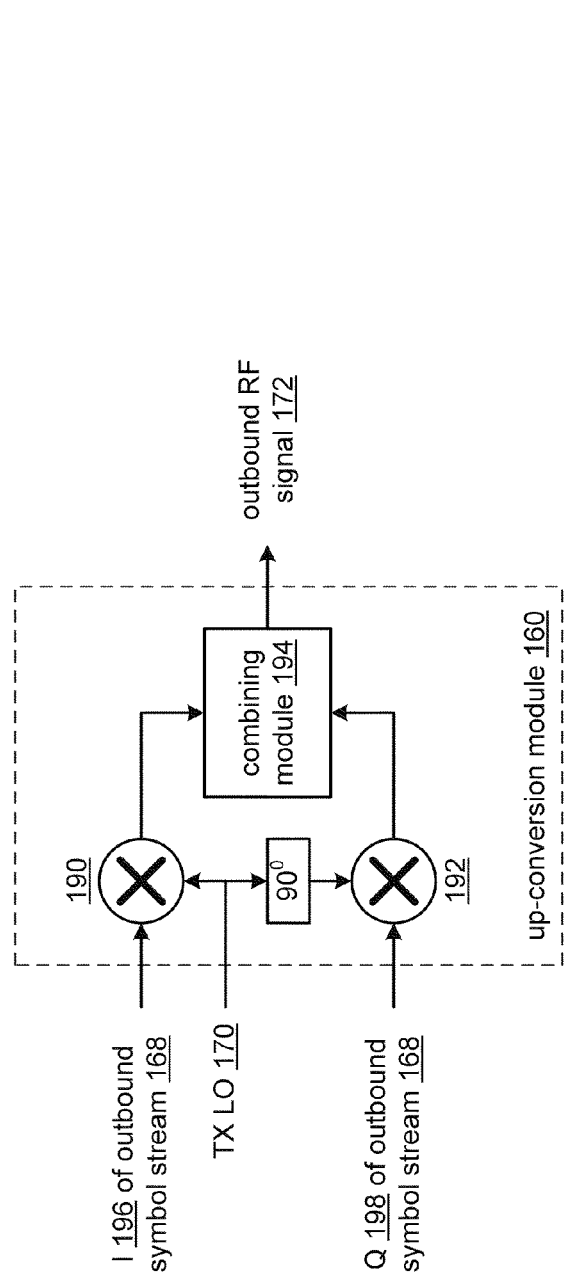
FIGS. 8-10 are schematic block diagrams of various embodiments of an up-conversion module in accordance with the present invention.

FIG. 8 is a schematic block diagram of an embodiment of the up-conversion module 160 that includes a first mixer 190, a second mixer 192, a ninety degree phase shift module, and a combining module 194. In this embodiment, the up-conversion module 160 converts a Cartesian-based outbound symbol stream 168 into the outbound RF signal 172.

In this embodiment, the first mixer 190 mixes an in-phase component 196 of the outbound symbol stream 168 with an in-phase component of the transmit local oscillation 170 to produce a first mixed signal. The second mixer 192 mixes a quadrature component 198 of the outbound symbol 169 stream with a quadrature component of the transmit local oscillation to produce a second mixed signal. The combining module 194 combines the first and second mixed signals to produce the outbound RF signal 172.

For example, if the I component 196 is expressed as $A_I \cos(\omega_{dn}+\Phi_n)$, the Q component 198 is expressed as $A_Q \sin(\omega_{dn}+\Phi_n)$, the I component of the local oscillation 170 is expressed as $\cos(\omega_{RF})$ and the Q component of the local oscillation 170 is represented as $\sin(\omega_{RF})$, then the first mixed signal is $\frac{1}{2}A_I\cos(\omega_{RF}-\omega_{dn}\Phi_n)+\frac{1}{2}A_I\cos(\omega_{RF}+\omega_{dn}+\Phi_n)$ and the second mixed signal is $\frac{1}{2}A_Q\cos(\omega_{RF}-\omega_{dn}-\Phi_n)+\frac{1}{2}A_Q\cos(\omega_{RF}+\omega_{dn}+\Phi_n)$. The combining module 194 then combines the two signals to produce the outbound RF signal 172, which may be expressed as $A\cos(\omega_{RF}+\omega_{dn}+\Phi_n)$. Note that the combining module 194 may be a subtraction module, may be a filtering module, and/or any other circuit to produce the outbound RF signal from the first and second mixed signals.

Figure 9:
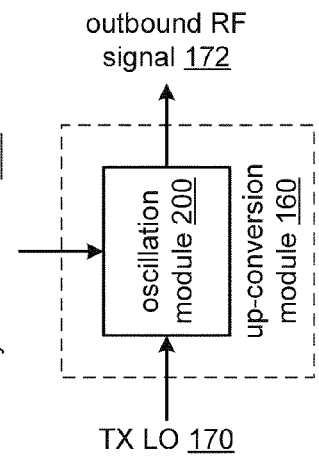

FIG. 9 is a schematic block diagram of an embodiment of the up-conversion module 160 that includes an oscillation module 200. In this embodiment, the up-conversion module 160 converts phase modulated-based outbound symbol stream into the outbound RF signal 172.

In operation, the oscillation module 200, which may be a phase locked loop, a fractional N synthesizer, and/or other oscillation generating circuit, utilizes the transmit local oscillation 170 as a reference oscillation to produce an oscillation at the frequency of the outbound RF signal 172. The phase of the oscillation is adjusted in accordance with the phase modulation information 202 of the outbound symbol stream 168 to produce the outbound RF signal.

Figure 10:
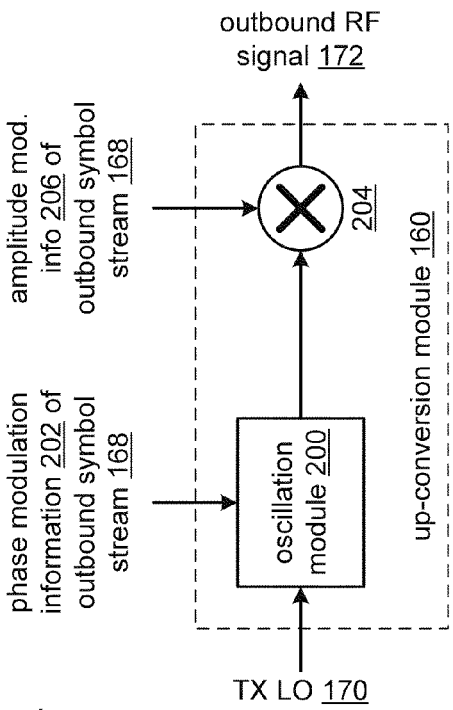

FIG. 10 is a schematic block diagram of an embodiment of the up-conversion module 160 that includes the oscillation module 200 and a multiplier 204. In this embodiment, the up-conversion module converts phase and amplitude modulated-based outbound symbol stream into the outbound RF signal 172.

In operation, the oscillation module 200, which may be a phase locked loop, a fractional N synthesizer, and/or other oscillation generating circuit, utilizes the transmit local oscillation 170 as a reference oscillation to produce an oscillation at the frequency of the outbound RF signal 172. The phase of the oscillation is adjusted in accordance with the phase modulation information 202 of the outbound symbol stream 168 to produce a phase modulated RF signal. The multiplier 204 multiplies the phase modulated RF signal with amplitude modulation information 206 of the outbound symbol stream 168 to produce the outbound RF signal.

FIG. 11 is a schematic block diagram of another embodiment of IC 70 that includes the local antenna structure 72, the remote antenna structure 74, the RF transceiver 76, and the baseband processing module 78. The RF transceiver 76 includes a receive section 210, a transmit section 212, a $1^{st}$ coupling circuit 214, and a $2^{nd}$ coupling circuit 216.

In this embodiment, the baseband processing module 78 converts local outbound data 218 into local outbound symbol stream 220. The first coupling circuit 214, which may be a switching network, a switch, a multiplexer, and/or any other type of selecting coupling circuit, provides the local outbound symbol stream 220 to the transmitter section 212 when the IC is in a local communication mode. The transmit section 212, which may include an up-conversion module as shown in FIGS. 8-10, converts the local outbound symbol stream into the local outbound RF signal 222. The second coupling circuit 216, which may be a switching network, a switch, a multiplexer, and/or any other type of selecting coupling circuit, provides the local outbound RF signal 222 to the local communication antenna structure 72 when the IC is in the local communication mode.

In the local communication mode 242, the second coupling circuit 216 also receives the local inbound RF signal 224 from the local communication antenna structure 72 and provides it to the receive section 210. The receive section 210 converts the local inbound RF signal 224 into the local inbound symbol stream 226. The first coupling circuit 214 provides the local inbound symbol stream 226 to the baseband processing module 78, which converts the local inbound symbol stream 226 into local inbound data 228.

In a remote communication mode 242, the baseband processing module 78 converts remote outbound data 230 into remote outbound symbol stream 232. The first coupling circuit 214 provides the remote outbound symbol stream 232 to the transmit section 212 when the IC is in a remote communication mode. The transmit section 212 converts the remote outbound symbol stream 232 into the remote outbound RF signal 234. The second coupling circuit 216 provides the remote outbound RF signal 234 to the remote communication antenna structure 74.

In the remote communication mode, the second coupling circuit 216 also receives the remote inbound RF signal 236 from the remote communication antenna structure 74 and provides it to the receive section 210. The receive section 210 converts the remote inbound RF signal 236 into the remote inbound symbol stream 238. The first coupling circuit 214 provides the remote inbound symbol stream 238 to the baseband processing module 78, which converts the remote inbound symbol stream 238 into remote inbound data 240. Note that the local RF signal 84 includes the local inbound and outbound RF signals 222 and 224 and the remote RF signal 86 includes the remote inbound and outbound RF signals 234 and 236. Further note that the remote inbound and outbound data 230 and 240 include one or more of graphics, digitized voice signals, digitized audio signals, digitized video signals, and text signals and the local inbound and outbound data 218 and 228 include one or more of chip-to-chip communication data and chip-to-board communication data.

Figure 12:
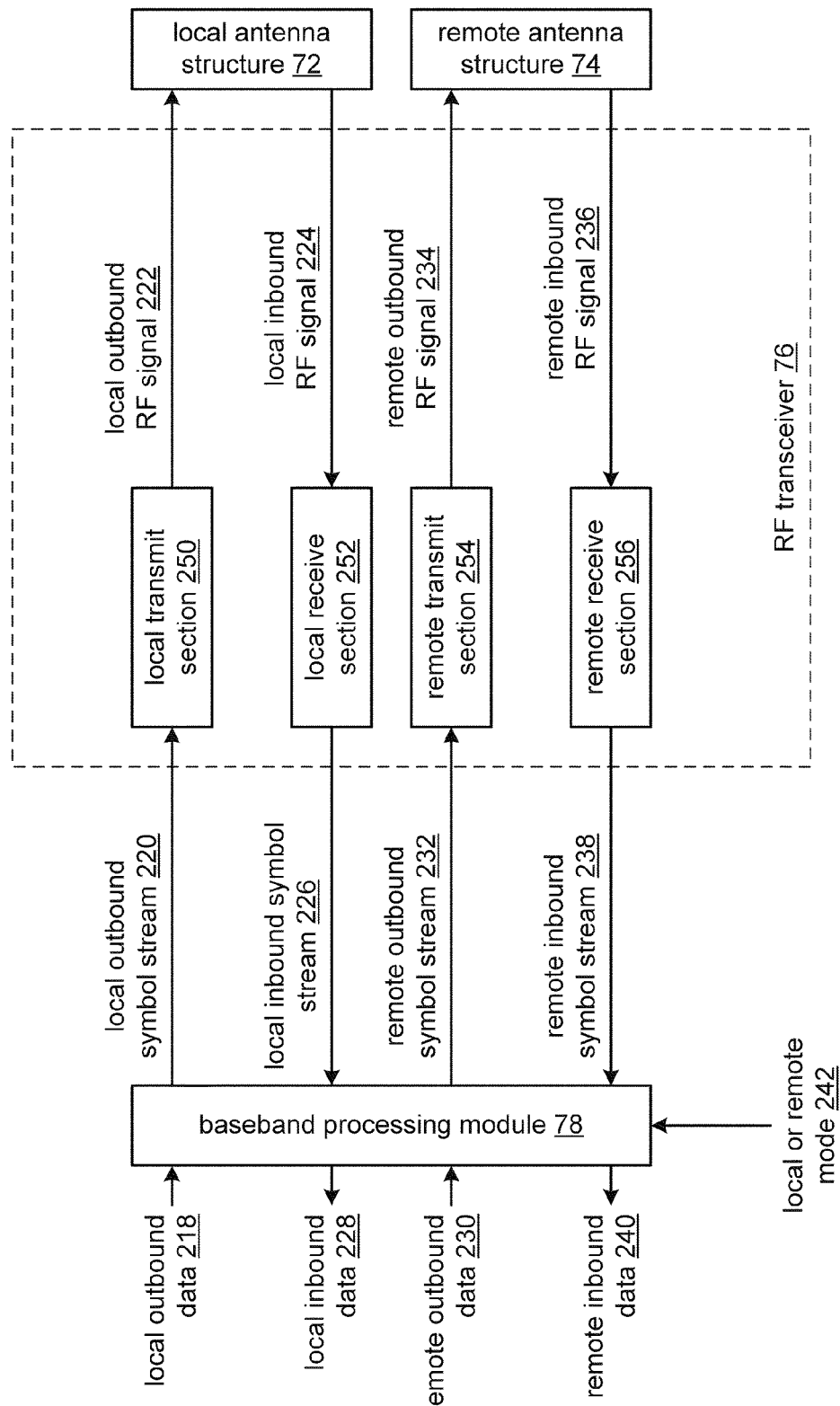
FIG. 12 is a schematic block diagram of another embodiment of an IC in accordance with the present invention.

FIG. 12 is a schematic block diagram of another embodiment of an IC 70 that includes the local antenna structure 72, the remote antenna structure 74, the RF transceiver 76, and the baseband processing module 78. The RF transceiver 76 includes a local transmit section 250, a local receive section 252, a remote transmit section 254, and a remote receive section 256.

In this embodiment, the baseband processing module 78 converts local outbound data 218 into local outbound symbol stream 220. The local transmit section 250, which may include an up-conversion module as shown in FIGS. 8-10, converts the local outbound symbol stream 220 into the local outbound RF signal 222. The local transmit section 250 provides the local outbound RF signal 222 to the local communication antenna structure 72 when the IC is in the local communication mode 242.

In the local communication mode 242, the local receive section 252 receives the local inbound RF signal 224 from the local communication antenna structure 72. The local receive section 252 converts the local inbound RF signal 224 into the local inbound symbol stream 226. The baseband processing module 78 converts the local inbound symbol stream 226 into local inbound data 228.

In a remote communication mode 242, the baseband processing module 78 converts remote outbound data 230 into remote outbound symbol stream 232. The remote transmit section 254 converts the remote outbound symbol stream 232 into the remote outbound RF signal 234 and provides it to the remote communication antenna structure 74.

In the remote communication mode, the remote receive section 256 receives the remote inbound RF signal 236 from the remote communication antenna structure 74. The receiver section 210 converts the remote inbound RF signal 236 into the remote inbound symbol stream 238. The baseband processing module 78 converts the remote inbound symbol stream 238 into remote inbound data 240.

Figure 13:
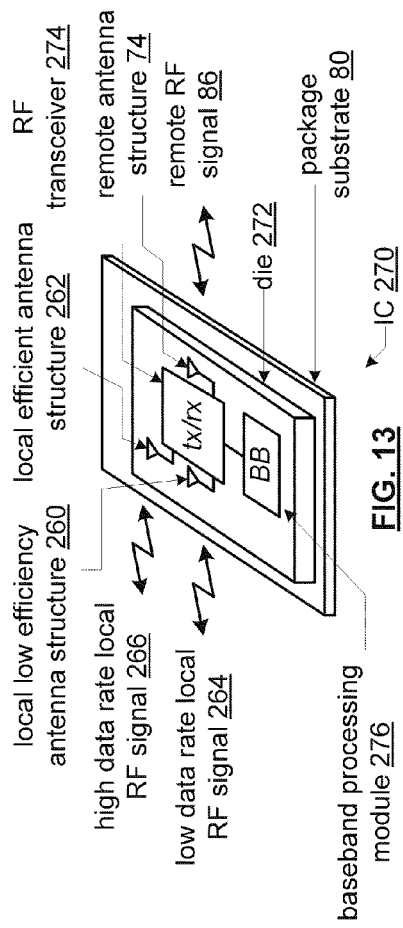

FIG. 13 is a diagram of an embodiment of an integrated circuit (IC) 270 that includes a package substrate 80 and a die 272. The die 272 includes a baseband processing module 276, an RF transceiver 274, a local low efficiency antenna structure 260, a local efficient antenna structure 262, and a remote antenna structure 74. The baseband processing module 276 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 276 may have an associated memory and/or memory element, which may be a single memory device, a plurality of memory devices, and/or embedded circuitry of the processing module 276. Such a memory device may be a read-only memory, random access memory, volatile memory, non-volatile memory, static memory, dynamic memory, flash memory, cache memory, and/or any device that stores digital information. Note that when the processing module 276 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module 276 executes, hard coded and/or operational instructions corresponding to at least some of the steps and/or functions illustrated in FIGS. 13-20.

In one embodiment, the IC 270 supports local low data rate, local high data rate, and remote communications, where the local communications are of a very short range (e.g., less than 0.5 meters) and the remote communications are of a longer range (e.g., greater than 1 meter). For example, local communications may be IC to IC communications, IC to board communications, and/or board to board communications within a device and remote communications may be cellular telephone communications, WLAN communications, Bluetooth piconet communications, walkie-talkie communications, etc. Further, the content of the remote communications may include graphics, digitized voice signals, digitized audio signals, digitized video signals, and/or outbound text signals.

To support a low data rate or high data rate local communication, the baseband processing module 276 convert local outbound data into the local outbound symbol stream. The conversion of the local outbound data into the local outbound symbol stream may be done in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the outbound data into the outbound system stream may include one or more of scrambling, encoding, puncturing, interleaving, constellation mapping, modulation, frequency to time domain conversion, space-time block encoding, space-frequency block encoding, beamforming, and digital baseband to IF conversion.

The RF transceiver 274 converts the low data rate or high data rate local outbound symbol stream into a low data rate or high data local outbound RF signal 264 or 266. The RF transceiver 274 provides the low data rate local outbound RF signal 264 to the local low efficiency antenna structure 260, which may include a small antenna (e.g., a length of $<=\frac{1}{10}$ wavelength) or infinitesimal antenna (e.g., a length of $<=\frac{1}{50}$ wavelength), and provides the high data rate local outbound RF signal 288 to the local efficient antenna structure 262, which may include a ¼ wavelength antenna or a ½ wavelength antenna.

The local low efficiency antenna structure 260 transmits the low data rate local outbound RF signal 264 within a frequency band of approximately 55 GHz to 64 GHz and the local efficient antenna structure 262 transmits the high data rate local outbound RF signal 266 within the same frequency band. Accordingly, the local antenna structures 260 and 262 include electromagnetic properties to operate within the frequency band. Note that various embodiments of the antenna structures 260 and/or 262 will be described in FIGS. 21-81. Further note that frequency band above 60 GHz may be used for the local communications.

For low data rate local inbound signals, the local low efficiency antenna structure 260 receives a low data rate local inbound RF signal 264, which has a carrier frequency within the frequency band of approximately 55 GHz to 64 GHz. The local low efficiency antenna structure 260 provides the low data rate local inbound RF signal 264 to the RF transceiver 274. For high data rate local inbound signals, the local efficient antenna structure 262 receives a high data rate local inbound RF signal 266 which has a carrier frequency within the frequency band of approximately 55 GHz to 64 GHz. The local efficient antenna structure 262 provides the high data rate local inbound RF signal 266 to the RF transceiver 274.

The RF transceiver 274 converts the low data rate or the high data local inbound RF signal into a local inbound symbol stream. The baseband processing module 276 converts the local inbound symbol stream into local inbound data in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the inbound system stream into the inbound data may include one or more of descrambling, decoding, depuncturing, deinterleaving, constellation demapping, demodulation, time to frequency domain conversion, space-time block decoding, space-frequency block decoding, de-beamforming, and IF to digital baseband conversion.

To support a remote communication, the baseband processing module 276 convert remote outbound data into a remote outbound symbol stream. The conversion of the remote outbound data into the remote outbound symbol stream may be done in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the outbound data into the outbound system stream may include one or more of scrambling, encoding, puncturing, interleaving, constellation mapping, modulation, frequency to time domain conversion, space-time block encoding, space-frequency block encoding, beamforming, and digital baseband to IF conversion.

The RF transceiver 274 converts the remote outbound symbol stream into a remote outbound RF signal 86 and provides it to the remote antenna structure 74. The remote antenna structure 74 transmits the remote outbound RF signals 86 within a frequency band. The frequency band may be 900 MHz, 1800 MHz, 2.4 GHz, 5 GHz, or approximately 55 GHz to 64 GHz. Accordingly, the remote antenna structure 74 includes electromagnetic properties to operate within the frequency band. Note that various embodiments of the antenna structure will be described in FIGS. 21-81.

For remote inbound signals, the remote antenna structure 74 receives a remote inbound RF signal 86, which has a carrier frequency within the frequency band. The remote antenna structure 74 provides the remote inbound RF signal 86 to the RF transceiver 274, which converts the remote inbound RF signal into a remote inbound symbol stream.

The baseband processing module 276 converts the remote inbound symbol stream into remote inbound data in accordance with one or more data modulation schemes, such as amplitude modulation (AM), frequency modulation (FM), phase modulation (PM), amplitude shift keying (ASK), phase shift keying (PSK), quadrature PSK (QSK), 8-PSK, frequency shift keying (FSK), minimum shift keying (MSK), Gaussian MSK (GMSK), quadrature amplitude modulation (QAM), a combination thereof, and/or alterations thereof. For example, the conversion of the inbound system stream into the inbound data may include one or more of descrambling, decoding, depuncturing, deinterleaving, constellation demapping, demodulation, time to frequency domain conversion, space-time block decoding, space-frequency block decoding, de-beamforming, and IF to digital baseband conversion.

Figure 14:
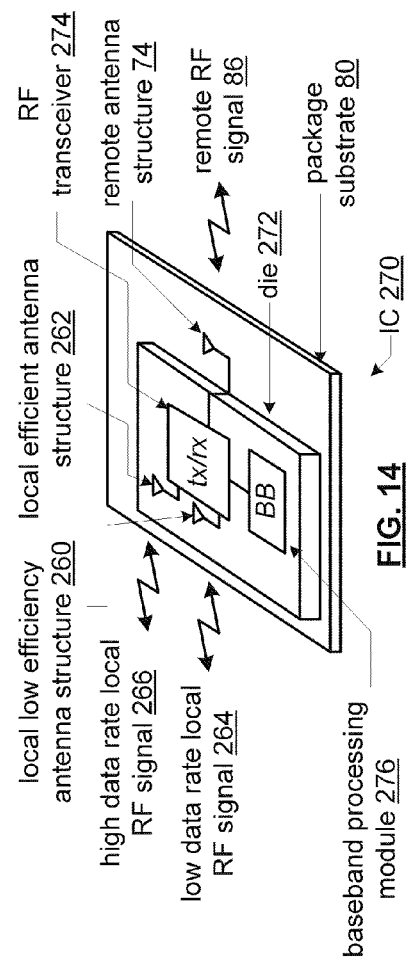

FIG. 14 is a diagram of an embodiment of an integrated circuit (IC) 270 that includes a package substrate 80 and a die 272. This embodiment is similar to that of FIG. 13 except that the remote antenna structure 74 is on the package substrate 80. Accordingly, IC 270 includes a connection from the remote antenna structure 74 on the package substrate 80 to the RF transceiver 274 on the die 272.

FIG. 15 is a diagram of an embodiment of an integrated circuit (IC) 280 that includes a package substrate 284 and a die 282. The die 282 includes a control module 288, an RF transceiver 286, a plurality of antenna structures 290. The control module 288 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The control module may have an associated memory and/or memory element, which may be a single memory device, a plurality of memory devices, and/or embedded circuitry of the control module. Such a memory device may be a read-only memory, random access memory, volatile memory, non-volatile memory, static memory, dynamic memory, flash memory, cache memory, and/or any device that stores digital information. Note that when the control module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the control module executes, hard coded and/or operational instructions corresponding to at least some of the steps and/or functions illustrated in FIGS. 15-20.

In operation, the control module 288 configures one or more of the plurality of antenna structures 290 to provide the inbound RF signal 292 to the RF transceiver 286. In addition, the control module 288 configures one or more of the plurality of antenna structures 290 to receive the outbound RF signal 294 from the RF transceiver 286. In this embodiment, the plurality of antenna structures 290 is on the die 282. In an alternate embodiment, a first antenna structure of the plurality of antenna structures 290 is on the die 282 and a second antenna structure of the plurality of antenna structures 290 is on the package substrate 284. Note that an antenna structure of the plurality of antenna structures 290 may include one or more of an antenna, a transmission line, a transformer, and an impedance matching circuit as will described with reference to FIGS. 21-81.

The RF transceiver 286 converts the inbound RF signal 292 into an inbound symbol stream. In one embodiment, the inbound RF signal 292 has a carrier frequency in a frequency band of approximately 55 GHz to 64 GHz. In addition, the RF transceiver 286 converts an outbound symbol stream into the outbound RF signal 294, which has a carrier frequency in the frequency band of approximately 55 GHz to 64 GHz.

FIG. 16 is a diagram of an embodiment of an integrated circuit (IC) 280 that includes a package substrate 284 and a die 282. This embodiment is similar to that of FIG. 15 except that the plurality of antenna structures 290 is on the package substrate 284. Accordingly, IC 280 includes a connection from the plurality of antenna structures 290 on the package substrate 284 to the RF transceiver 286 on the die 282.

Figure 17:
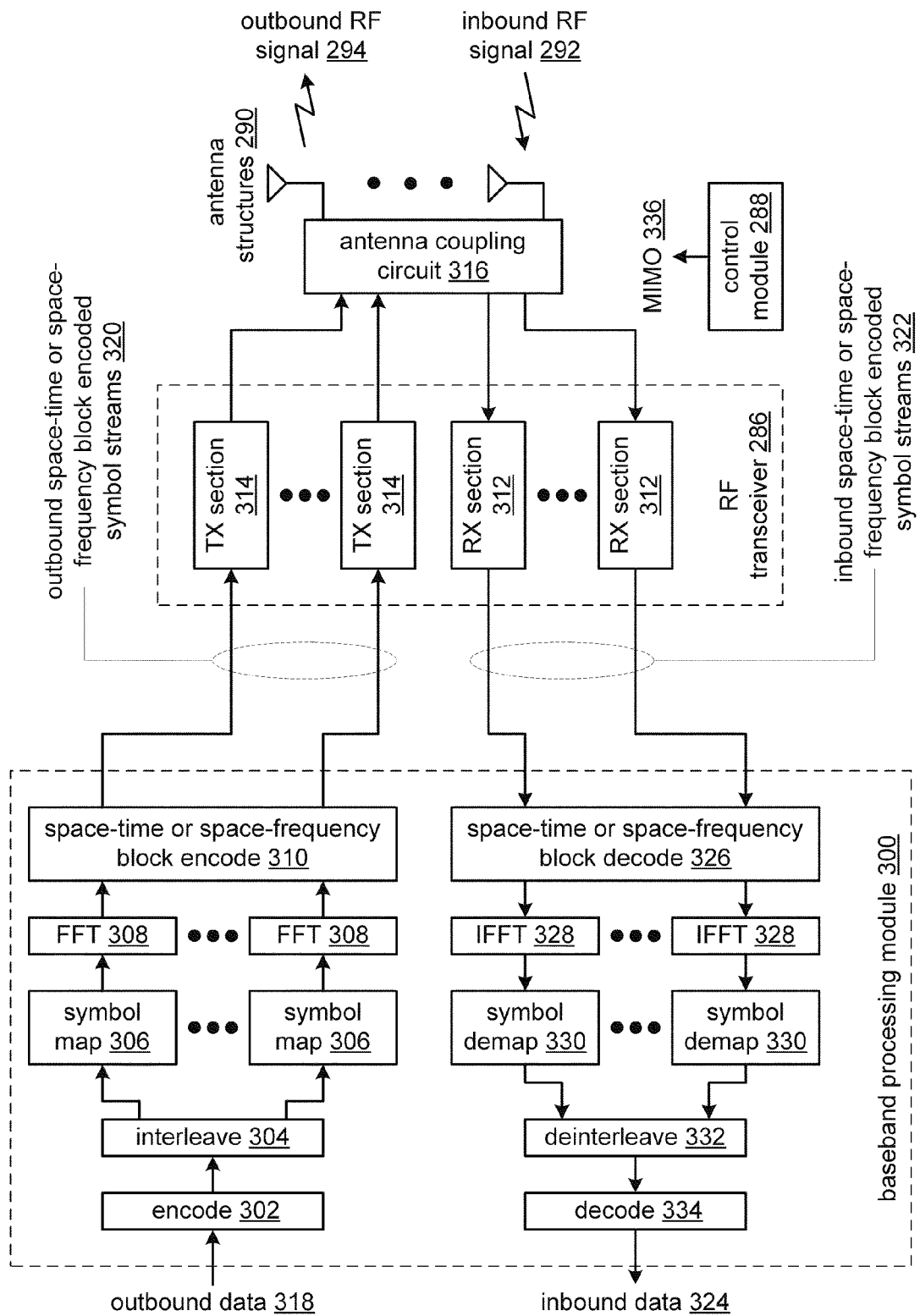
FIG. 17-20 are schematic block diagrams of various embodiments of an IC in accordance with the present invention.

FIG. 17 is a schematic block diagram of an embodiment of IC 280 that includes a baseband processing module 300, the RF transceiver 286, the control module 288, an antenna coupling circuit 316, and the plurality of antenna structures 290. The baseband processing module 300 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 276 may have an associated memory and/or memory element, which may be a single memory device, a plurality of memory devices, and/or embedded circuitry of the processing module 276. Such a memory device may be a read-only memory, random access memory, volatile memory, non-volatile memory, static memory, dynamic memory, flash memory, cache memory, and/or any device that stores digital information. Note that when the processing module 276 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module 276 executes, hard coded and/or operational instructions corresponding to at least some of the steps and/or functions illustrated in FIGS. 13-20.

In this embodiment, the control module 288, which may be a shared processing device with or a separate processing device from the baseband processing module 300, places the IC 280 into a multiple-input-multiple-output (MIMO) communication mode 336. In this mode, the baseband processing module 300 includes an encoding module 302, an interleaving module 304, a plurality of symbol mapping modules 306, a plurality of Fast Fourier Transform (FFT) modules 308, and a space-time or space-frequency block encoder 310 to convert outbound data 316 into an outbound space-time or space-frequency block encoded symbol streams 320. In one embodiment, the encoding module 302 performs one or more of scrambling, encoding, puncturing, and any other type of data encoding.

A plurality of transmit sections 314 of the RF transceiver 286 convert the outbound space-time or space-frequency block encoded symbol streams 320 into a plurality of outbound RF signals. The antenna coupling circuit 316, which may include one or more T/R switches, one or more transformer baluns, and/or one or more switching networks, provides the plurality of outbound RF signals to at least two of the plurality of antenna structures 290 in accordance with the MIMO setting 336 provided by the control module 288. The at least two of the plurality of antenna structures 290 transmit the plurality of outbound RF signals as the outbound RF signal 294.

The plurality of antenna structures 290 receives the inbound RF signal 292, which includes a plurality of inbound RF signals. At least two of the plurality of antenna structures are coupled to a plurality of receive sections 312 of the RF transceiver 286 via the coupling circuit 316. The receive sections 312 convert the plurality of inbound RF signals into inbound space-time or space-frequency block encoded symbol streams 322.

The baseband processing module includes a space-time or space-frequency decoding module 326, a plurality of inverse FFT (IFFT) modules 328, a plurality of symbol demapping modules 330, a deinterleaving module 322, and a decoding module 334 to convert the inbound space-time or space-frequency block encoded symbol streams 322 into inbound data 324. The decoding module 334 may perform one or more of de-puncturing, decoding, descrambling, and any other type of data decoding.

Figure 18:
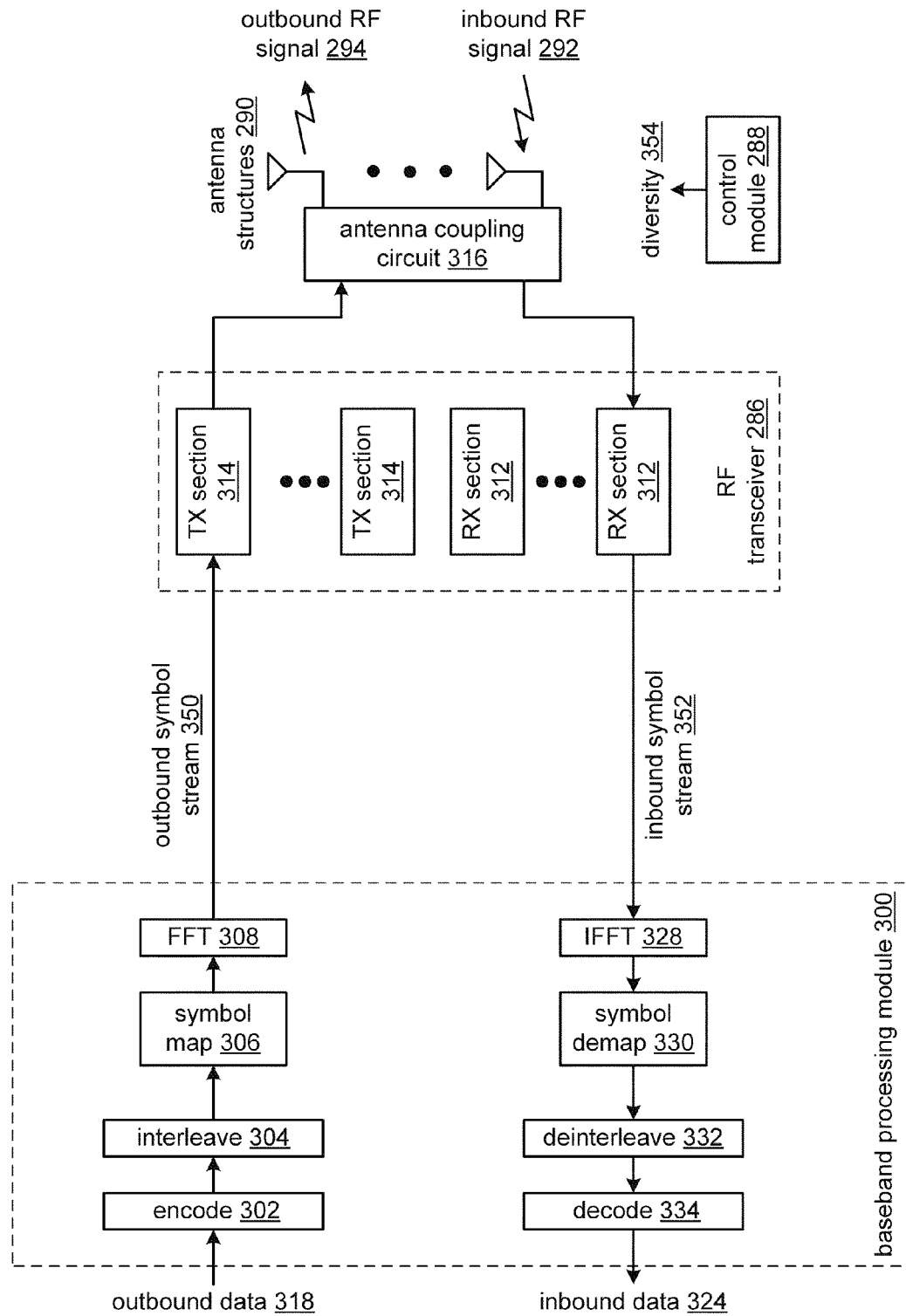

FIG. 18 is a schematic block diagram of an embodiment of IC 280 that includes the baseband processing module 300, the RF transceiver 286, the control module 288, an antenna coupling circuit 316, and the plurality of antenna structures 290. In this embodiment, the control module 288 places the IC 280 into a diversity mode 354. In this mode, the baseband processing module 300 includes the encoding module 302, the interleaving module 304, a symbol mapping module 306, and a Fast Fourier Transform (FFT) module 308 to convert outbound data 316 into an outbound symbol stream 350.

On of the plurality of transmit sections 314 of the RF transceiver 286 converts the outbound symbol stream 320 into an outbound RF signal 294. The antenna coupling circuit 316 provides the outbound RF signal 294 to one or more of the plurality of antenna structures 290 in accordance with the diversity setting 354 provided by the control module 288. In one embodiment, the plurality of antenna structures 290 have antennas that are physically spaced by ¼, ½, ¾, and/or a 1 wavelength apart to receive and/or transmit RF signals in a multi-path environment.

The plurality of antenna structures 290 receives the inbound RF signal 292. At least one of the plurality of antenna structures is coupled to one of the plurality of receive sections 312 of the RF transceiver 286 via the coupling circuit 316. The receive section 312 converts the inbound RF signal 292 into an inbound symbol stream 352.

The baseband processing module 300 includes an inverse FFT (IFFT) module 328, a symbol demapping module 330, a deinterleaving module 322, and a decoding module 334 to convert the inbound encoded symbol stream 352 into inbound data 324.

Figure 19:
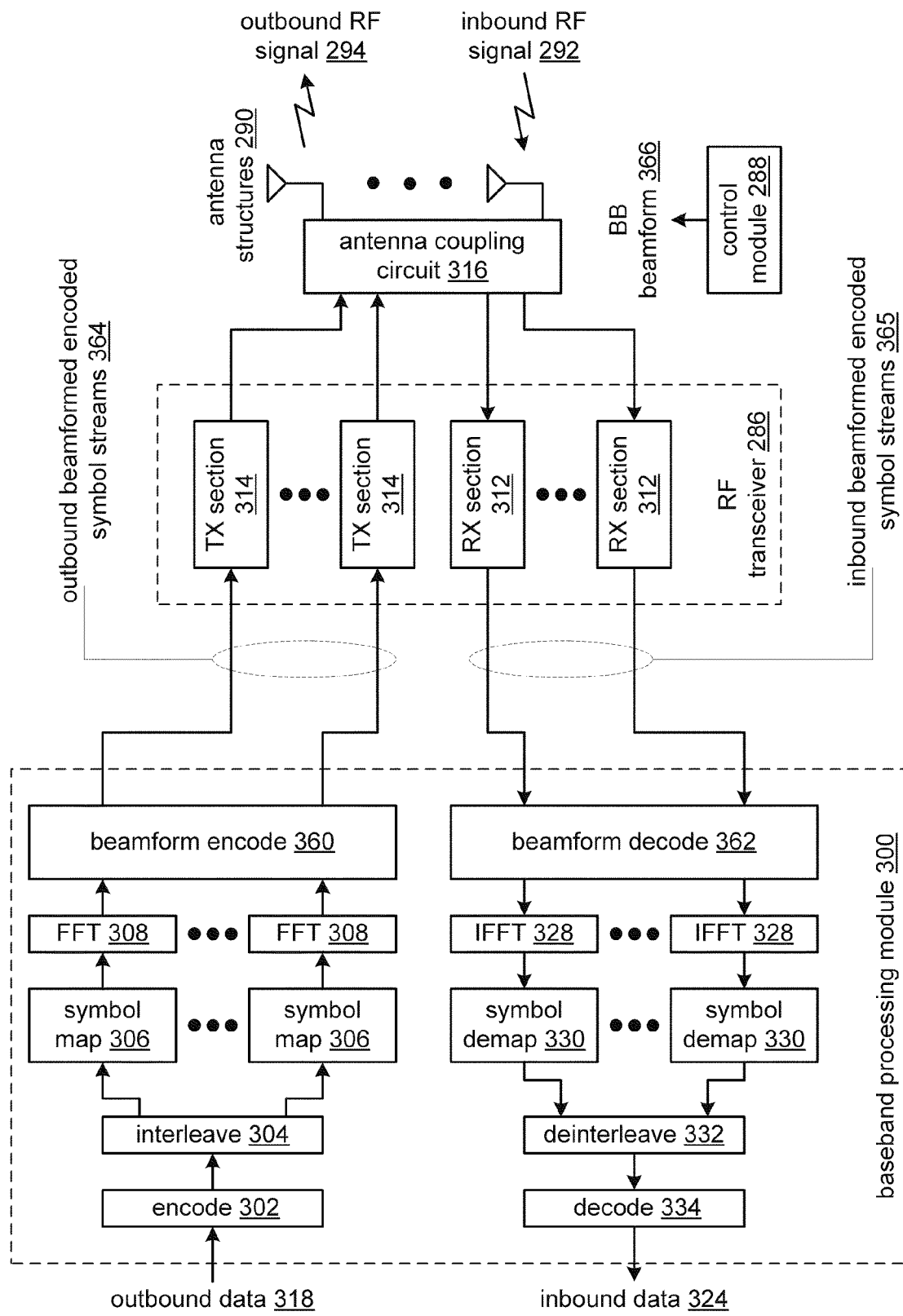

FIG. 19 is a schematic block diagram of an embodiment of IC 280 that includes a baseband processing module 300, the RF transceiver 286, the control module 288, an antenna coupling circuit 316, and the plurality of antenna structures 290. In this embodiment, the control module 288 places the IC 280 into a baseband (BB) beamforming mode 366. In this mode, the baseband processing module 300 includes the encoding module 302, the interleaving module 304, a plurality of symbol mapping modules 306, a plurality of Fast Fourier Transform (FFT) modules 308, and a beamforming encoder 310 to convert outbound data 316 into outbound beamformed encoded symbol streams 364.

A plurality of transmit sections 314 of the RF transceiver 286 convert the outbound beamformed encoded symbol streams 364 into a plurality of outbound RF signals. The antenna coupling circuit 316 provides the plurality of outbound RF signals to at least two of the plurality of antenna structures 290 in accordance with the beamforming setting 366 provided by the control module 288. The at least two of the plurality of antenna structures 290 transmit the plurality of outbound RF signals as the outbound RF signal 294.

The plurality of antenna structures 290 receives the inbound RF signal 292, which includes a plurality of inbound RF signals. At least two of the plurality of antenna structures are coupled to a plurality of receive sections 312 of the RF transceiver 286 via the coupling circuit 316. The receive sections 312 convert the plurality of inbound RF signals into inbound beamformed encoded symbol streams 365.

The baseband processing module includes a beamforming decoding module 326, a plurality of inverse FFT (IFFT) modules 328, a plurality of symbol demapping modules 330, a deinterleaving module 322, and a decoding module 334 to convert the inbound beamformed encoded symbol streams 365 into inbound data 324.

Figure 20:
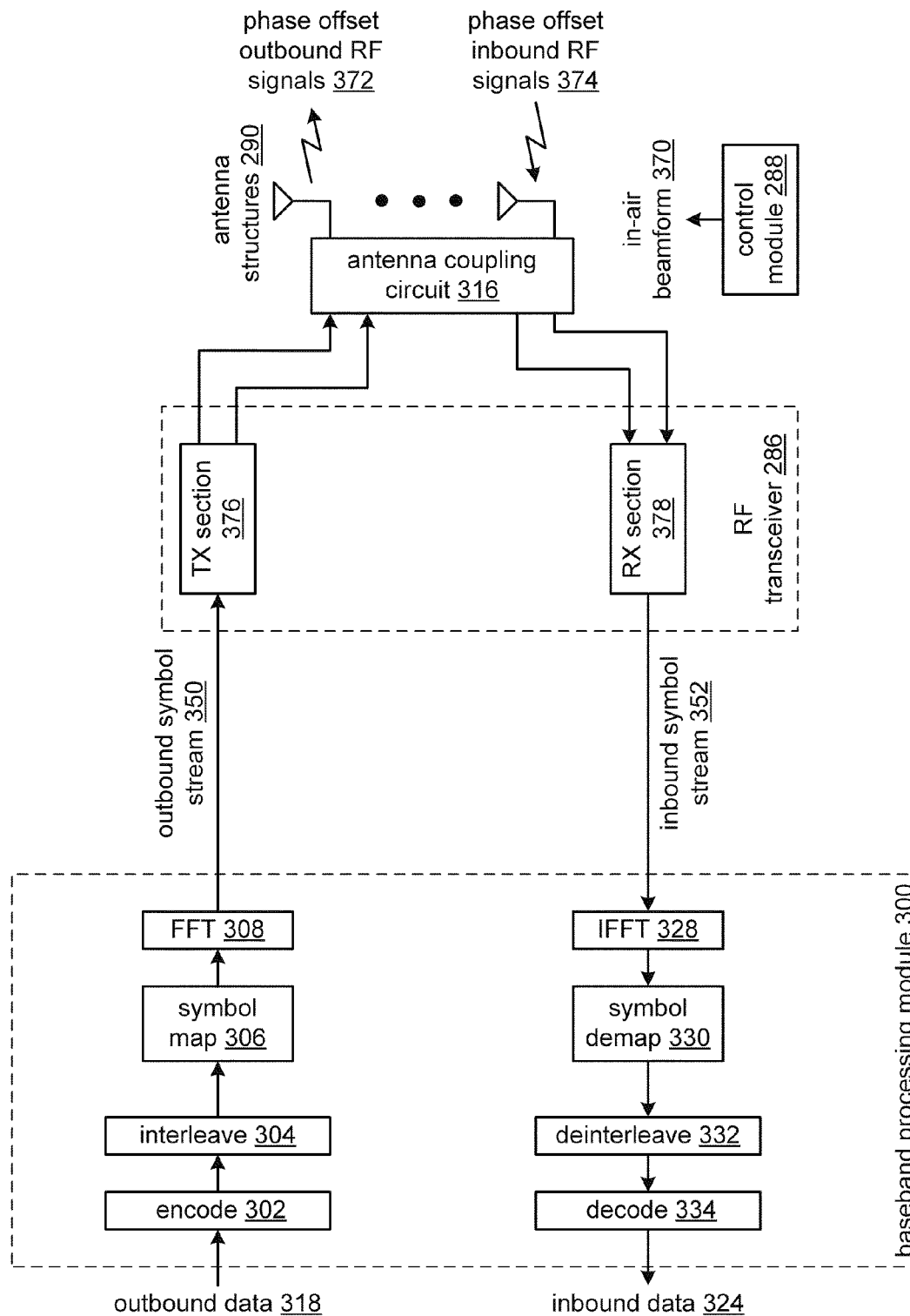

FIG. 20 is a schematic block diagram of an embodiment of IC 280 that includes a baseband processing module 300, the RF transceiver 286, the control module 288, an antenna coupling circuit 316, and the plurality of antenna structures 290. In this embodiment, the control module 288 places the IC 280 into an in-air beamforming mode 370. In this mode, the baseband processing module 300 includes the encoding module 302, the interleaving module 304, a symbol mapping module 306, and a Fast Fourier Transform (FFT) module 308 to convert outbound data 316 into an outbound symbol stream 350.

The transmit section 376 of the RF transceiver 286 converts the outbound symbol stream 320 into phase offset outbound RF signals of the outbound RF signal 294. For example, one phase offset outbound RF signal may have a phase offset of 0° and another may have a phase offset of 90°, such that the resulting in-air combining of the signals is at 45°. In addition to providing a phase offset, the transmit section 376 may adjust the amplitudes of the phase offset outbound RF signals to produce the desired phase offset. The antenna coupling circuit 316 provides the phase offset outbound RF signals to at least two of the plurality of antenna structures 290 in accordance with the in-air beamforming setting 370 provided by the control module 288.

The plurality of antenna structures 290 receives the inbound RF signal 292, which includes a plurality of inbound phase offset RF signals. At least two of the plurality of antenna structures is coupled to the receive section 378 of the RF transceiver 286 via the coupling circuit 316. The receive section 378 converts the plurality of inbound phase offset RF signals into an inbound symbol stream 352.

The baseband processing module 300 includes an inverse FFT (IFFT) module 328, a symbol demapping module 330, a deinterleaving module 322, and a decoding module 334 to convert the inbound encoded symbol stream 352 into inbound data 324.

Figure 22:
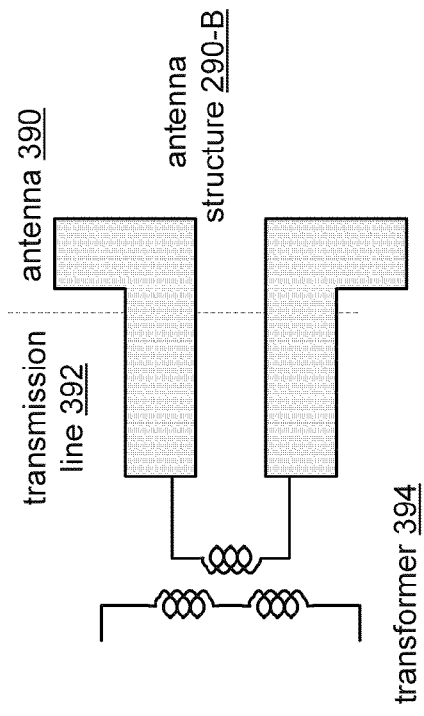
FIGS. 21 and 22 are diagrams of various embodiments of an antenna structure in accordance with the present invention.
Figure 21:
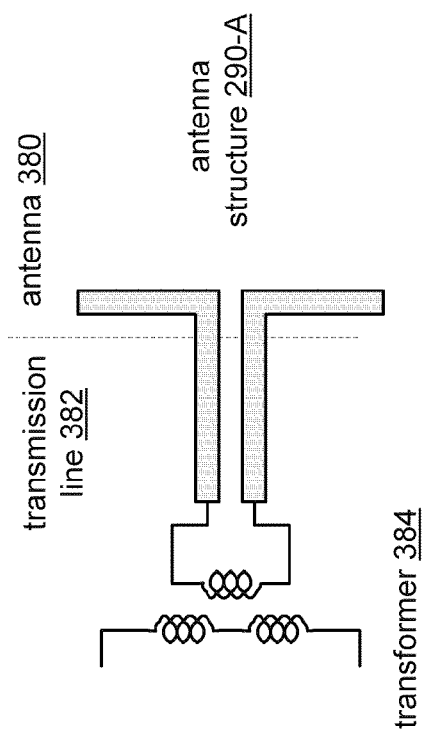

FIGS. 21 and 22 are diagrams of various embodiments of an antenna structure of the plurality of antenna structures 290 that includes an antenna 380, a transmission line 382 and a transformer 384. The antenna 380 is shown as a dipole antenna but may be of any configuration. For example, the antenna 380 may be any of the antennas illustrated in FIGS. 35-47, 53, 54, and 58-81. The transmission line 382 may be a tuned transmission line to substantially match the impedance of the antenna 380 and/or may include an impedance matching circuit. The antenna structure 290-A of FIG. 21 has an ultra narrow bandwidth (e.g., <0.5% of center frequency) and the antenna structure 290-B of FIG. 22 has a narrow bandwidth (approximately 5% of center frequency).

The bandwidth of an antenna having a length of ½ wavelength or less is primarily dictated by the antenna's quality factor (Q), which may be mathematically expressed as shown in Eq. 1 where $v_0$ is the resonant frequency, $2\delta v$ is the difference in frequency between the two half-power points (i.e., the bandwidth).

$$\frac{v_0}{2\partial v} = \frac{1}{Q} \qquad \text{Equation 1}$$

Equation 2 provides a basic quality factor equation for the antenna structure, where R is the resistance of the antenna structure, L is the inductance of the antenna structure, and C is the capacitor of the antenna structure.

$$Q = \frac{1}{R} * \sqrt{\frac{L}{C}} \qquad \text{Equation 2}$$

As such, by adjusting the resistance, inductance, and/or capacitance of an antenna structure, the bandwidth can be controlled. In particular, the smaller the quality factor, the narrower the bandwidth. In the present discussion, the antenna structure 290-A of FIG. 21 in comparison to the antenna structure 290-B of FIG. 22 includes a larger resistance and capacitor, thus it has a lower quality factor. Note that the capacitance is primarily established by the length of, and the distance between, the lines of the transmission line 382, the distance between the elements of the antenna 380, and any added capacitance to the antenna structure. Further note that the lines of the transmission line 382 and those of the antenna 380 may be on the same layer of an IC and/or package substrate and/or on different layers of the IC and/or package substrate.

Figure 23:
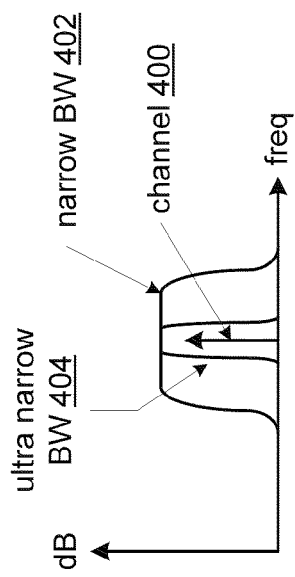
FIGS. 23 and 24 are frequency spectrum diagrams of an antenna structures in accordance with the present invention.

FIG. 23 is frequency spectrum diagram of antenna structures 290-A and 290-B of FIGS. 21 and 22 centered at the carrier frequency of a desired channel 400, which may be in the frequency range of 55 GHz to 64 GHz. As discussed above, the antenna structure 290-A has an ultra narrow bandwidth 404 and the antenna structure 290-B has a narrow bandwidth 402. In one embodiment, the antenna structure 290-A may be used for a transmit antenna structure while antenna structure 290-B may be used for a receive antenna structure. In another embodiment, the first antenna structure 290-A may be enabled to have a first polarization and the second antenna structure 290-B may be enabled to have a second polarization.

In another embodiment, the both antenna structures 290-A and 290-B may be enabled for signal combining of the inbound RF signal. In this embodiment, the first and second antenna structures 290-A and 290-B receive the inbound RF signal. The two representations of the inbound RF signal are then be combined (e.g., summed together, use one to provide data when the other has potential corruption, etc.) to produce a combined inbound RF signal. The combining may be done in one of the first and second antenna structures 290-A and 290-B (note: one of the structures would further include a summing module), in the RF transceiver, or at baseband by the control module or the baseband processing module.

Figure 24:
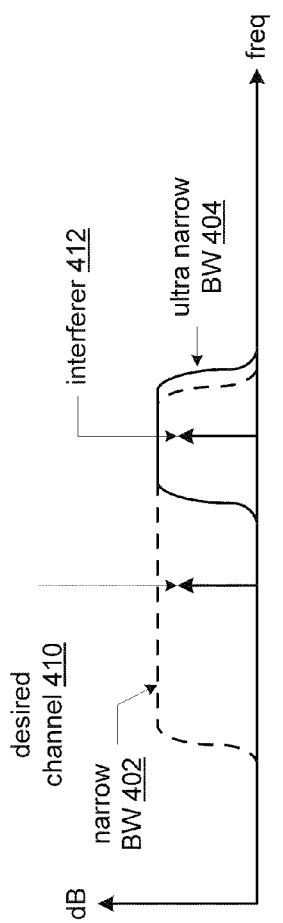

FIG. 24 is frequency spectrum diagram of the narrow bandwidth 402 of antenna structure 290-B centered at the carrier frequency of a desired channel 410, which may be in the frequency range of 55 GHz to 64 GHz, and the ultra narrow bandwidth 404 of antenna structure 290-A centered about an interferer 412. The interferer 412 may be adjacent channel interference, from another system, noise, and/or any unwanted signal. The circuit of FIG. 25 utilizes this antenna arrangement to cancel the interferer 410 with negligible effects on receiving the desired channel 410.

Figure 25:
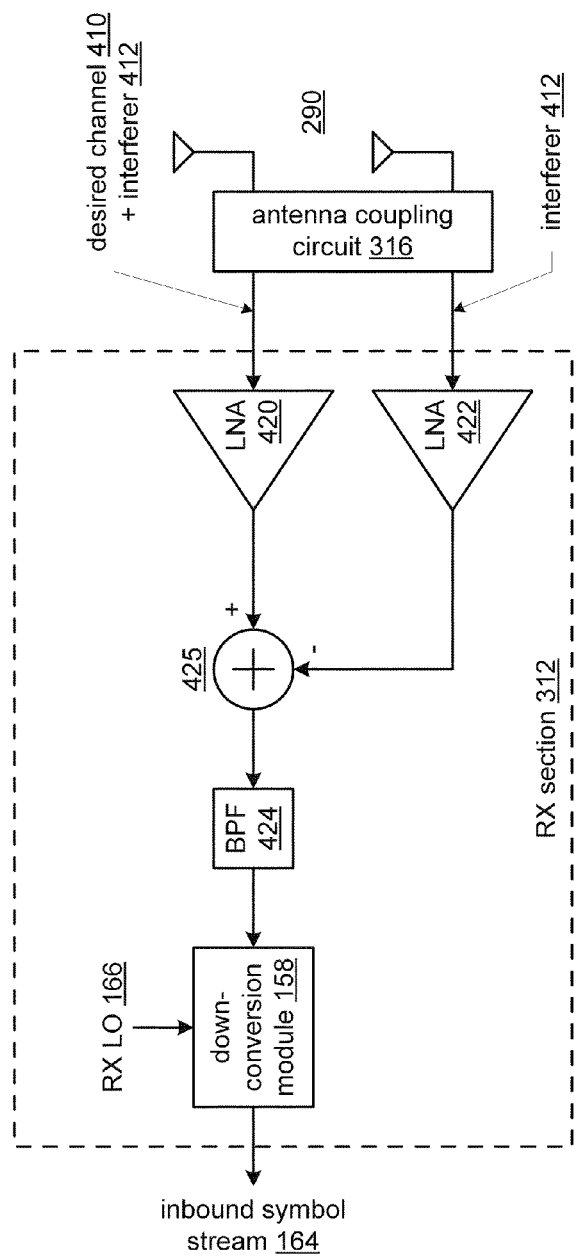
FIG. 25 is a schematic block diagram of another embodiment of an IC in accordance with the present invention.

FIG. 25 is a schematic block diagram of another embodiment of IC 280 that includes the plurality of antenna structures 290, the antenna coupling circuit 316, and the receive section 312. The receive section 312 includes two low noise amplifiers 420 and 422, a subtraction module 425, a bandpass filter (BPF) 424, and the down-conversion module 158. In this embodiment, the control module has enabled antenna structures 290-A and 290-B.

In operation, the narrow bandwidth antenna structure 290-B receives the inbound RF channel, which includes the desired channel 410 and the interferer 412 and provides it to the first LNA 420. The ultra narrow bandwidth antenna structure 290-A receives the interferer 412 and provides it to the second LNA 422. The gains of the first and second LNAs 420 and 422 may be separately controlled such that the magnitude of the interferer 412 outputted by both LNAs 420 and 422 is approximately equal. Further, the LNAs 420 and 422 may include a phase adjustment module to phase align the amplified interferer outputted by both LNAs 420 and 422.

The subtraction module 425 subtracts the output of the second LNA 422 (i.e., the amplified interferer) from the output of the first LNA 420 (i.e., the amplified desired channel and amplified interferer) to produce an amplified desired channel. The bandpass filter 424, which is tuned to the desired channel, further filters unwanted signals and provides the filtered and amplified desired channel component of the inbound RF signal to the down-conversion module 158. The down-conversion module 158 converts the filtered and amplified desired channel component into the inbound symbol stream 164 based on the receive local oscillation 166.

Figure 26:
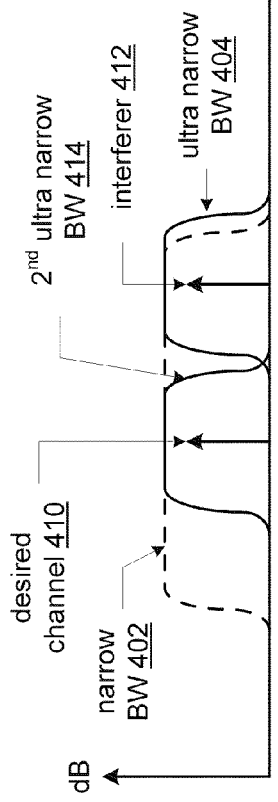
FIG. 26 is a frequency spectrum diagram of an antenna structure in accordance with the present invention.

FIG. 26 is frequency spectrum diagram of the narrow bandwidth 402 of antenna structure 290-B centered at the carrier frequency of a desired channel 410, the ultra narrow bandwidth 404 of antenna structure 290-A centered about an interferer 412, and another ultra narrow bandwidth antenna structure 290-C centered about the desired channel 410. The circuit of FIG. 27 utilizes this antenna arrangement to combine the desired channel and cancel the interferer 410 with negligible effects on receiving the desired channel 410.

Figure 27:
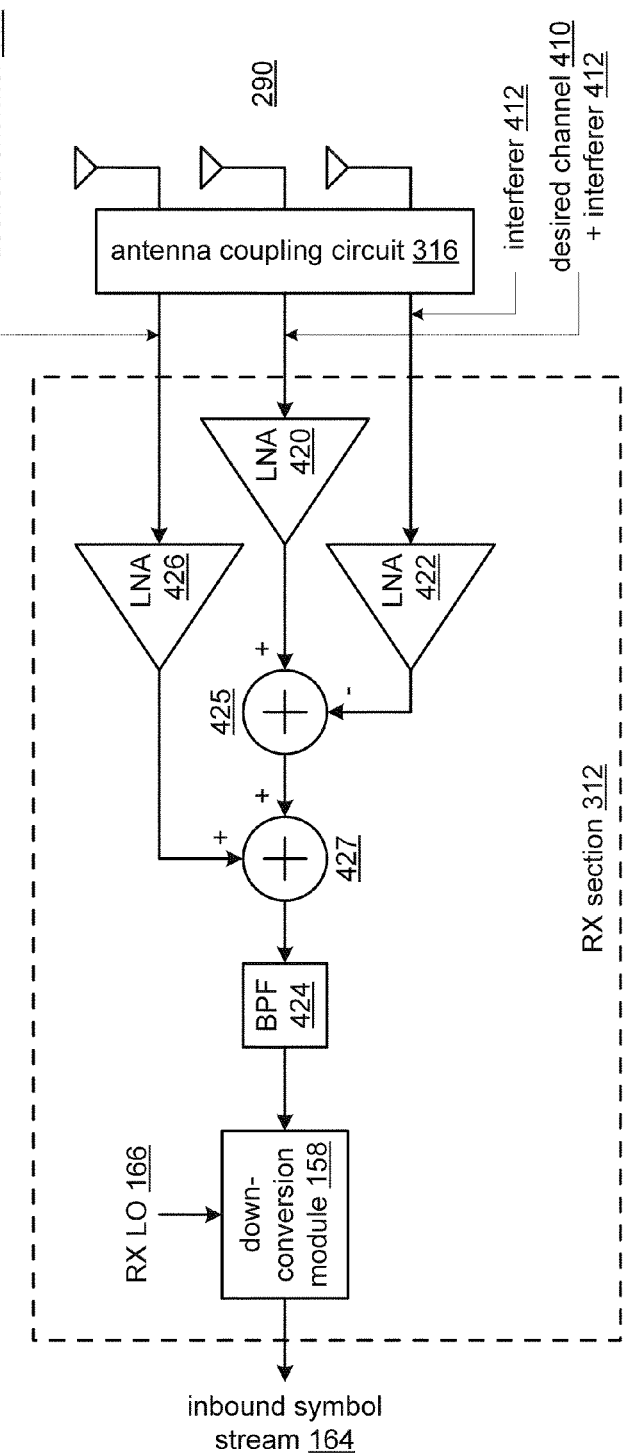
FIG. 27 is a schematic block diagram of another embodiment of an IC in accordance with the present invention.

FIG. 27 is a schematic block diagram of another embodiment of an IC 280 that includes the plurality of antenna structures 290, the antenna coupling circuit 316, and the receive section 312. The receive section 312 includes three low noise amplifiers 420, 422, and 426, the subtraction module 425, an adder 427, the bandpass filter (BPF) 424, and the down-conversion module 158. In this embodiment, the control module has enabled antenna structures 290-A, 290-B, and 290-C.

In operation, the narrow bandwidth antenna structure 290-B receives the inbound RF channel, which includes the desired channel 410 and the interferer 412 and provides it to the first LNA 420. The ultra narrow bandwidth antenna structure 290-A receives the interferer 412 and provides it to the second LNA 422. The ultra narrow bandwidth antenna structure 290-C receives the desired channel and provides it to the third LNA 426. The gains of the first, second, and third LNAs 420, 422, and 426 may be separately controlled such that the magnitude of the interferer 412 outputted by LNAs 420 and 422 is approximately equal. Further, the LNAs 420 and 422 may include a phase adjustment module to phase align the amplified interferer outputted by both LNAs 420 and 422.

The subtraction module 425 subtracts the output of the second LNA 422 (i.e., the amplified interferer) from the output of the first LNA 420 (i.e., the amplified desired channel and amplified interferer) to produce an amplified desired channel. The adder 427 adds the output of the subtraction module 425 (i.e., the desired channel) with the output of the third LNA 426 (i.e., the desired channel) to produce a combined desired channel. The bandpass filter 424, which is tuned to the desired channel, further filters unwanted signals from the combined desired channel and provides it to the down-conversion module 158. The down-conversion module 158 converts the filtered and amplified desired channel component into the inbound symbol stream 164 based on the receive local oscillation 166.

Figure 28:
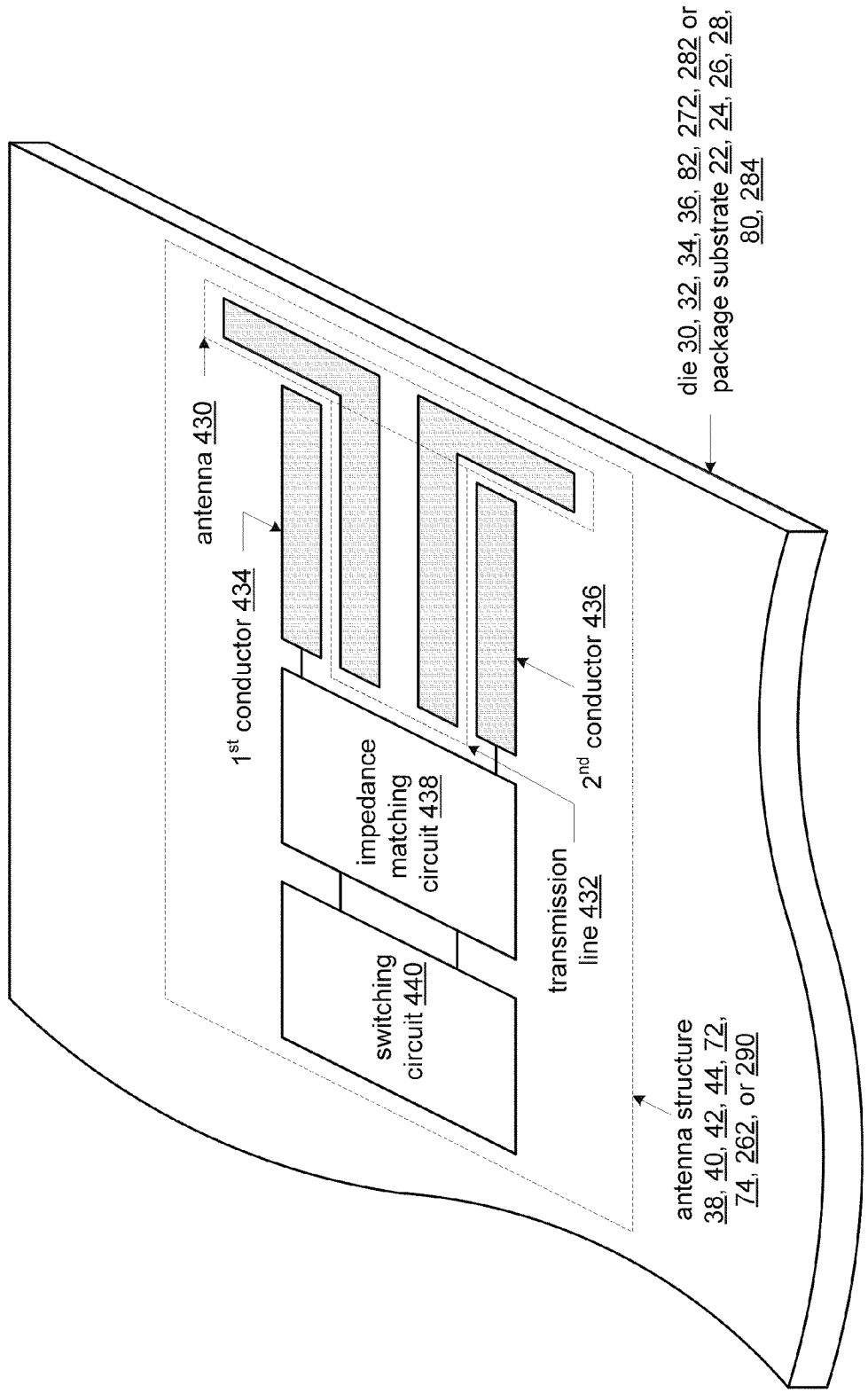

FIG. 28 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes one or more of an antenna 430, a transmission line 432, conductors 434, 436, an impedance matching circuit 438, and a switching circuit 440. The antenna 430 may be a microstrip on the die and/or on the package substrate to provide a half-wavelength dipole antenna or a quarter-wavelength monopole antenna. In other embodiments, the antenna 430 may be one or more of the antennas illustrated in FIGS. 35-46 51, and 53-81.

The transmission line 432, which may be a pair of microstrip lines on the die and/or on the package substrate, is electrically coupled to the antenna 430 and electromagnetically coupled to the impedance matching circuit 438 by the first and second conductors 434 and 436. In one embodiment, the electromagnetic coupling of the first conductor 434 to a first line of the transmission line 432 produces a first transformer and the electromagnetic coupling of the second conductor 436 to a second line of the transmission line produces a second transformer.

The impedance matching circuit 438, which may include one or more of an adjustable inductor circuit, an adjustable capacitor circuit, an adjustable resistor circuit, an inductor, a capacitor, and a resistor, in combination with the transmission line 432 and the first and second transformers establish the impedance for matching that of the antenna 430. The impedance matching circuit 438 may be implemented as shown in FIGS. 43-50.

The switching circuit 440 includes one or more switches, transistors, tri-state buffers, and tri-state drivers, to couple the impedance matching circuit 438 to the RF transceiver 286. In one embodiment, the switching circuit 440 is receives a coupling signal from the RF transceiver 286, the control module 288, and/or the baseband processing module 300, wherein the coupling signal indicates whether the switching circuit 440 is open (i.e., the impedance matching circuit 438 is not coupled to the RF transceiver 286) or closed (i.e., the impedance matching circuit 438 is coupled to the RF transceiver 286).

FIG. 29 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes an antenna (i.e., an antenna radiation section 452 and an antenna ground plane 454), a transmission line 456, and a transformer circuit 450. The antenna radiation section 452 may be a microstrip on the die and/or on the package substrate to provide a half-wavelength dipole antenna or a quarter-wavelength monopole antenna. In other embodiments, the antenna radiation section 452 may be implemented in accordance with one or more of the antennas illustrated in FIGS. 35-46 51, and 53-81.

The antenna ground plane is on a different layer of the die and/or of the package substrate and, from a first axis (e.g., parallel to the surface of the die and/or the package substrate), is parallel to the antenna radiation section 452 and, from a second axis (e.g., perpendicular to the surface of the die and/or the package substrate), is substantially encircling of the antenna radiation section 452 and may encircle to the transmission line 456.

Figure 32:
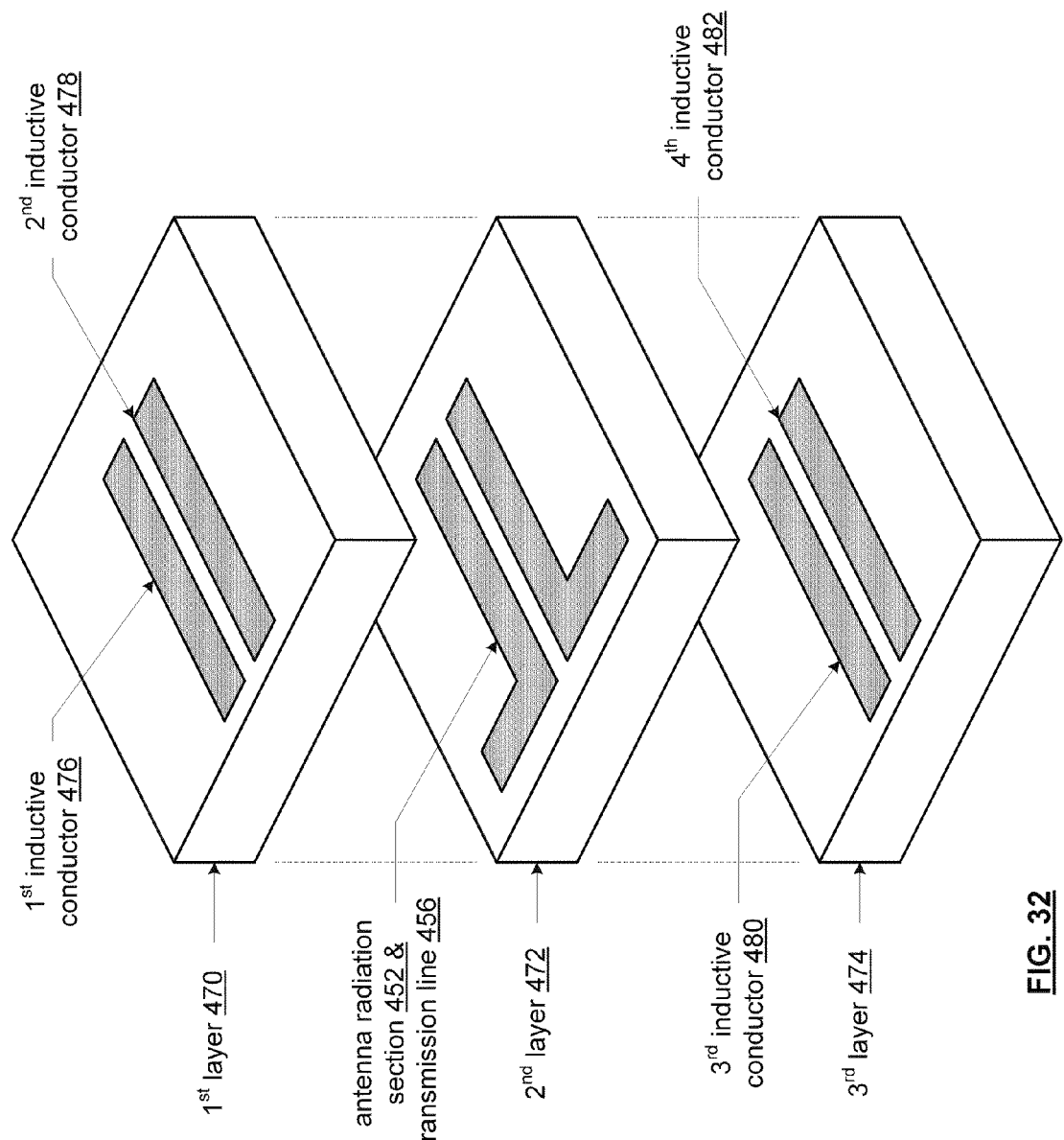

The transmission line 456, which includes a pair of microstrip lines on the die and/or on the package substrate, is electrically coupled to the antenna radiation section 452 and is electrically coupled to the transformer circuit 460. The coupling of the transformer circuit to the second line is further coupled to the antenna ground plane 454. Various embodiments of the transformer circuit 460 are shown in FIGS. 30-32.

FIG. 30 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes an antenna (i.e., an antenna radiation section 452 and an antenna ground plane 454), a transmission line 456, and a transformer circuit 450.

In this embodiment, a first conductor 458, which may be a microstrip, is electromagnetically coupled to the first line of the transmission line 456 to form a first transformer. A second conductor 460 is electromagnetically coupled to the second line of the transmission line 456 to form a second transformer. The first and second transformers of the transformer circuit 450 are used to couple the transmission line 456 to the RF transceiver and/or to an impedance matching circuit.

FIG. 31 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes an antenna (i.e., an antenna radiation section 452 and an antenna ground plane 454), a transmission line 456, and a transformer circuit 450.

In this embodiment, the transformer circuit 450 includes a first inductive conductor 462 and a second inductive conductor 464. The first inductive conductor 462 is coupled to the first and second lines to form a single-ended winding of a transformer. The second inductive conductor 464 includes a center tap that is coupled to ground. In addition, the second inductive conductor 464 is electromagnetically coupled to the first inductive conductor to form a differential winding of the transformer. The transformer may be used to couple the transmission line 456 to the RF transceiver and/or to an impedance matching circuit.

FIG. 32 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes an antenna (i.e., an antenna radiation section 452 and an antenna ground plane 454), a transmission line 456, and a transformer circuit 450.

In this embodiment, the transformer circuit 450 includes a first inductive conductor 476, a second inductive conductor 478, a third inductive conductor 480, and a fourth inductive conductor 482. Each of the inductive conductors 476-482 may be a microstrip on the die and/or on the package substrate. The first conductor 476 is on a first layer of the integrated circuit (i.e., the die and/or the package substrate) and is electromagnetically coupled to the first line of the transmission line 456 to form a first transformer of the transformer circuit 450. As shown, the first line and the antenna are on a second layer of the integrated circuit.

The second conductor 487 is on the first layer of the integrated circuit and is electromagnetically coupled to the second line of the transmission line 456 to form a second transformer. The third conductor 480 is on a third layer of the integrated circuit and is electromagnetically coupled to the first line of the transmission line 456 to form a third transformer. The fourth conductor 482 is on the third layer of the integrated circuit and is electromagnetically coupled to the second line of the transmission line to form a fourth transformer. In one embodiment, the first and second transformers support an inbound radio frequency signal and the third and fourth transformers support an outbound radio frequency signal.

Figure 33:
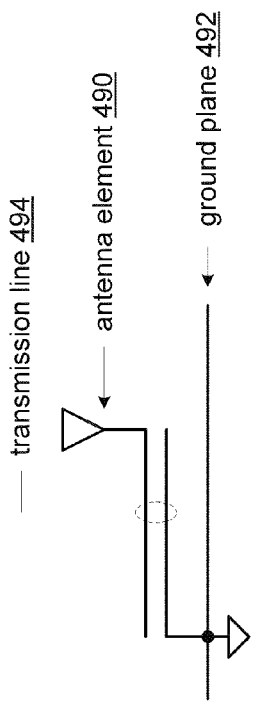

FIG. 33 is a schematic diagram of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes an antenna element 490, a ground plane 492, and a transmission line 494. The antenna element 490 may be one or more microstrips having a length in the range of approximately 1¼ millimeters to 2½ millimeters to provide a half-wavelength dipole antenna or a quarter-wavelength monopole antenna for RF signals in a frequency band of 55 GHz to 64 GHz. In an embodiment, the antenna element 490 is shaped to provide a horizontal dipole antenna or a vertical dipole antenna. In other embodiments, the antenna element 490 may be implemented in accordance with one or more of the antennas illustrated in FIGS. 34-46 51, and 53-81.

The ground plane 492 has a surface area larger than the surface area of the antenna element 490. The ground plane 490, from a first axial perspective, is substantially parallel to the antenna element 490 and, from a second axial perspective, is substantially co-located to the antenna element 490. The transmission line includes a first line and a second line, which are substantially parallel. In one embodiment, at least the first line of the transmission line 494 is electrically coupled to the antenna element 490.

Figure 34:
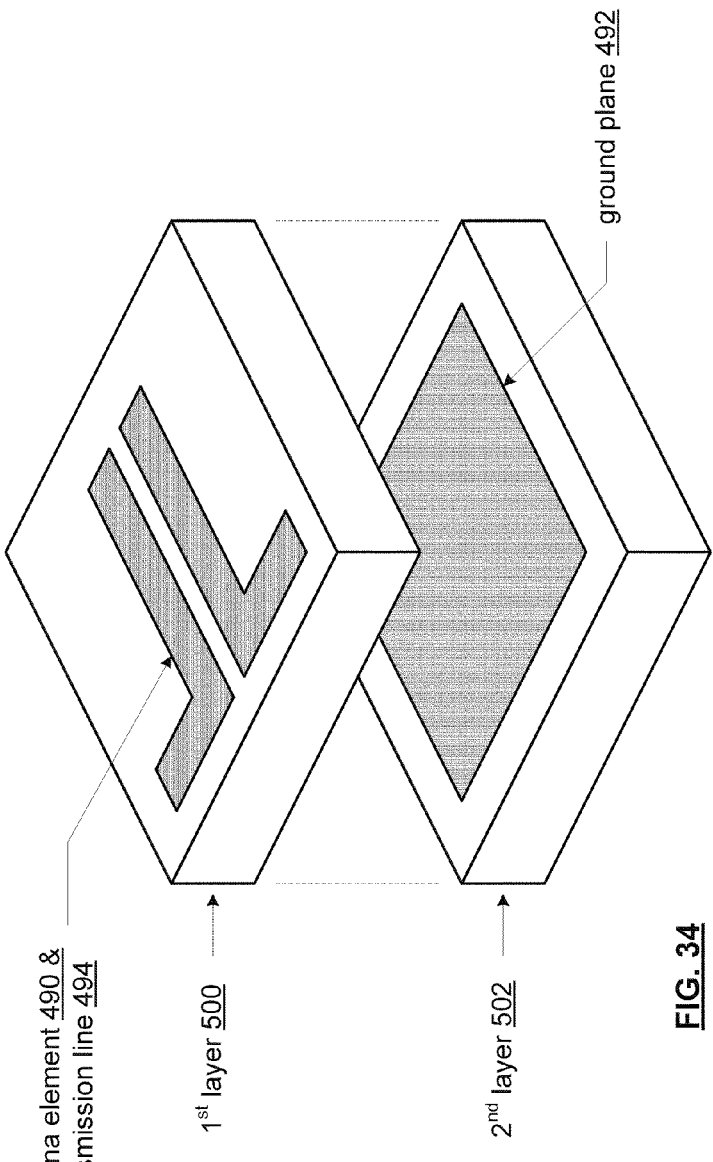

FIG. 34 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes the antenna element 490, the antenna ground plane 492, and the transmission line 494. In this embodiment, the antenna element 490 and the transmission line 494 are on a first layer 500 of the die and/or of the package substrate and the ground plane 492 is on a second layer 502 of the die and/or of the package substrate.

Figure 35:
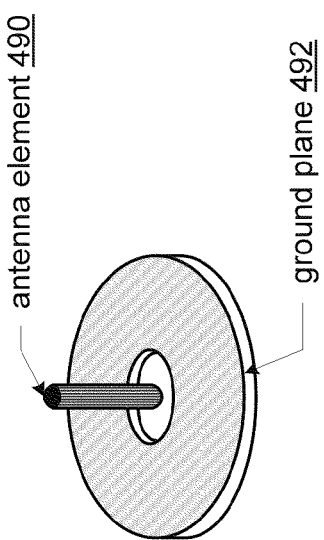

FIG. 35 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes the antenna element 490, the antenna ground plane 492, and the transmission line 494. In this embodiment, the antenna element 490 has is vertically positioned with respect to the ground plane 492 and has a length of approximately ¼ wavelength of the RF signals it transceives. The ground plane 492 may be circular shaped, elliptical shaped, rectangular shaped, or any other shape to provide an effective ground for the antenna element 490. The ground plane 492 includes an opening to enable the transmission line 494 to be coupled to the antenna element 490.

Figure 36:
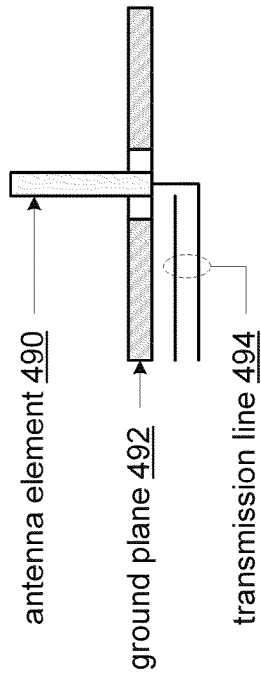

FIG. 36 is a cross sectional diagram of the embodiment of an antenna structure 38, 40, 42, 44, 72, 74, 282, or 290 on a die 30, 32, 34, 36, 82, 272, or 282 and/or on a package substrate 22, 24, 26, 28, 80, 284 of FIG. 35. The antenna structure 38, 40, 42, 44, 72, 74, 282, or 290 includes the antenna element 490, the antenna ground plane 492, and the transmission line 494. In this embodiment, the antenna element 490 has is vertically positioned with respect to the ground plane 492 and has a length of approximately ¼ wavelength of the RF signals it transceives. As shown, the ground plane 492 includes an opening to enable the transmission line 494 to be coupled to the antenna element 490.

Figure 37:
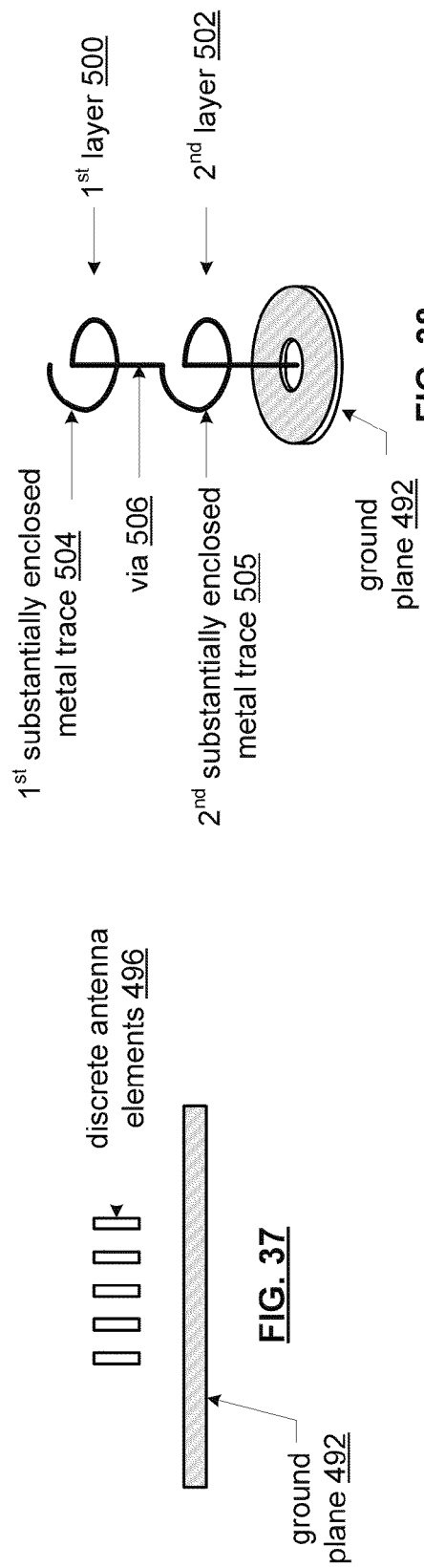

FIG. 37 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes a plurality of discrete antenna elements 496, the antenna ground plane 492, and the transmission line 494. In this embodiment, the plurality of discrete antenna elements 496 includes a plurality of infinitesimal antennas (i.e., have a length<=1/50 wavelength) or a plurality of small antennas (i.e., have a length<=1/10 wavelength) to provide a discrete antenna structure, which functions similarly to a continuous horizontal dipole antenna. The ground plane 492 may be circular shaped, elliptical shaped, rectangular shaped, or any other shape to provide an effective ground for the plurality of discrete antenna elements 496.

Figure 38:
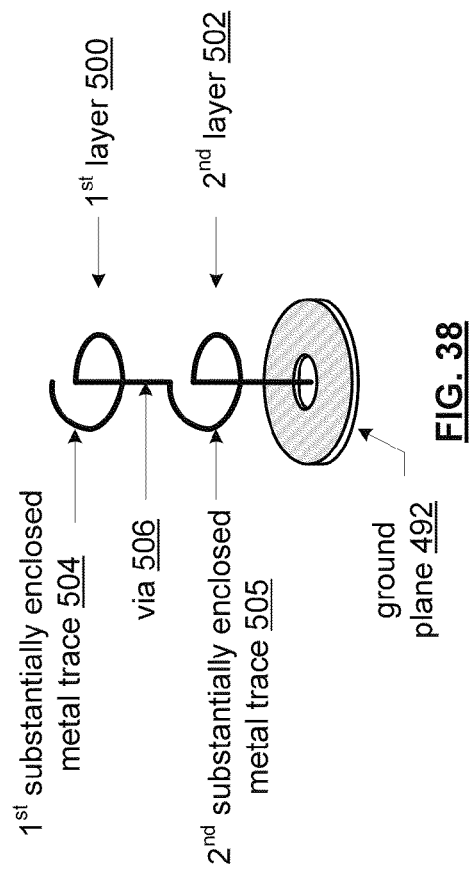

FIG. 38 is a diagram of an embodiment of an antenna structure 38, 40, 42, 44, 72, 74, 282, or 290 on a die 30, 32, 34, 36, 82, 272, or 282 and/or on a package substrate 22, 24, 26, 28, 80, 284. The antenna structure 38, 40, 42, 44, 72, 74, 282, or 290 includes the antenna element 490, the antenna ground plane 492, and the transmission line 494. In this embodiment, the antenna element 490 includes a plurality of substantially enclosed metal traces 504 and 505, and vias 506. The substantially enclosed metal traces 504 and 505 may have a circular shape, an elliptical shape, a square shape, a rectangular shape and/or any other shape.

In one embodiment, a first substantially enclosed metal trace 504 is on a first metal layer 500, a second substantially enclosed metal trace 505 is on a second metal layer 502, and a via 506 couples the first substantially enclosed metal trace 504 to the second substantially enclosed metal trace 505 to provide a helical antenna structure. The ground plane 492 may be circular shaped, elliptical shaped, rectangular shaped, or any other shape to provide an effective ground for the antenna element 490. The ground plane 492 includes an opening to enable the transmission line 494 to be coupled to the antenna element 490.

FIG. 39 is a diagram of an embodiment of an antenna structure 38, 40, 42, 44, 72, 74, 282, or 290 on a die 30, 32, 34, 36, 82, 272, or 282 (collectively or alternatively referred to as die 514 for this figure and FIGS. 40-41) and/or on a package substrate 22, 24, 26, 28, 80, 284 (collectively or alternatively referred to as package substrate 512 for this figure and FIGS. 40-41). The antenna structure 38, 40, 42, 44, 72, 74, 282, or 290 includes the antenna element 490, the antenna ground plane 492, and the transmission line 494. In this embodiment, the antenna element 490 includes a plurality of antenna sections 516, which may be microstrips and/or or metal traces, to produce a horizontal dipole antenna. As shown, some of the antenna sections 516 may be on the die 514 and other antenna sections 516 may be on the package substrate 512. As is further shown, the package substrate 512 is supported via a board 510. Note that the board 510 may be a printed circuit board, a fiberglass board, a plastic board, or any other non-conductive type board.

FIG. 40 is a diagram of an embodiment of an antenna structure 38, 40, 42, 44, 72, 74, 282, or 290 on a die 514 and/or on a package substrate 512. The antenna structure 38, 40, 42, 44, 72, 74, 282, or 290 includes the antenna element 490, the antenna ground plane 492, and the transmission line 494. In this embodiment, the antenna element 490 includes a plurality of antenna sections 516, which may be microstrips, vias, and/or or metal traces, to produce a vertical dipole antenna. As shown, some of the antenna sections 516 may be on the die 514 and other antenna sections 516 may be on the package substrate 512. As is further shown, the package substrate 512 is supported via a board 510, which may include the ground plane 492. Alternatively, the ground plane 492 may be included on the package substrate 512.

FIG. 41 is a diagram of an embodiment of an antenna structure 38, 40, 42, 44, 72, 74, 282, or 290 on a die 514 and/or on a package substrate 512. The antenna structure 38, 40, 42, 44, 72, 74, 282, or 290 includes the antenna element 490, the antenna ground plane 492, and the transmission line 494. In this embodiment, the antenna element 490 includes a plurality of substantially enclosed metal traces 504, 505, 518, and vias 506 and 520. The substantially enclosed metal traces 504, 505, and 518 may have a circular shape, an elliptical shape, a square shape, a rectangular shape and/or any other shape.

In one embodiment, a first substantially enclosed metal trace 504 is on a first metal layer 524 of the die 514, a second substantially enclosed metal trace 505 is on a layer 522 of the package substrate 512, a third substantially enclosed metal trace 518 is on a second metal layer 526 of the die 514, and vias 506 and 520 couple the first, second, and third substantially enclosed metal traces 504, 505, and 518 together to provide a helical antenna structure. The ground plane 492 may be circular shaped, elliptical shaped, rectangular shaped, or any other shape to provide an effective ground for the antenna element 490. The ground plane 492 includes an opening to enable the transmission line 494 to be coupled to the antenna element 490. Note that more or less substantially enclosed metal traces may be included on the die 514 and/or on the package substrate 512.

Figure 42:
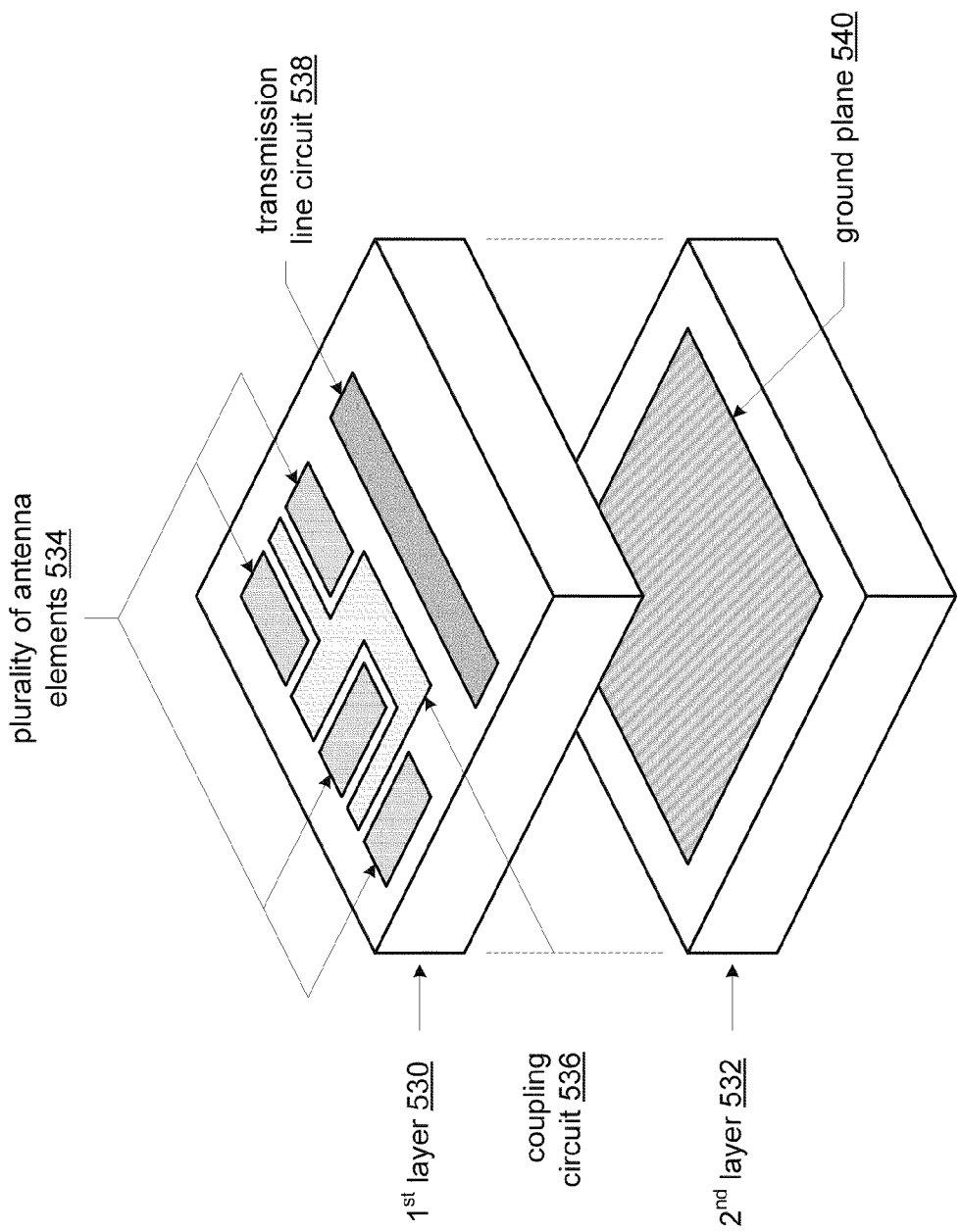

FIG. 42 is a diagram of an embodiment of an adjustable integrated circuit (IC) antenna structure that may be used for antenna 38, 40, 42, 44, 72, 74, 282, or 290. The adjustable IC antenna structure includes a plurality of antenna elements 534, a coupling circuit 536, a ground plane 540, and a transmission line circuit 538. In this illustration, the plurality of antenna elements 534, the coupling circuit 536, and the transmission line circuit 538 are on a first layer 530 of a die 30, 32, 34, 36, 82, 272, or 282 and/or of a package substrate 22, 24,

26, 28, 80, 284 of an IC. The ground plane 540 is proximally located to the plurality of antenna elements 534 but on a second layer 532 of the die 30, 32, 34, 36, 82, 272, or 282 and/or of the package substrate 22, 24, 26, 28, 80, 284. In other embodiments, the ground plane 540 may be on a different layer, may be on the same layer as the plurality of antenna elements 534, and/or on a board that supports the IC.

Each of the plurality of antenna elements 534 may be a metal trace on a metal layer of the die and/or substrate, may be a microstrip, may have the same geometric shape (e.g., square, rectangular, coil, spiral, etc.) as other antenna elements, may have a different geometric shape than the other antenna elements, may be horizontal with respect to the support surface of the die and/or substrate, may be vertical with respect to the support surface of the die and/or substrate, may have the same electromagnetic properties (e.g., impedance, inductance, reactance, capacitance, quality factor, resonant frequency, etc.) as other antenna elements, and/or may have different electromagnetic properties than the other antenna elements.

The coupling circuit 536, which may include plurality of magnetic coupling elements and/or a plurality of switches, couples at least one of the plurality of antenna elements into an antenna based on an antenna structure characteristic signal. The control module 288, an RF transceiver 46-52, 76, 274, 286 and/or a baseband processing module 78, 276, 300 may generate the antenna structure characteristic signal to control the coupling circuit 536 to couple the antenna elements 534 into an antenna having a desired effective length, a desired bandwidth, a desired impedance, a desired quality factor, and/or a desired frequency band. For example, the antenna elements 534 may be configured to produce an antenna having a frequency band of approximately 55 GHz to 64 GHz; to have an impedance of approximately 50 Ohms; to have an effective length of an infinitesimal antenna, of a small antenna, of ¼ wavelength, of ½ wavelength, or greater; etc. Embodiments of the coupling circuit 536 will be described in greater detail with reference to FIGS. 47 and 48.

The transmission line circuit 538 is coupled to provide an outbound radio frequency (RF) signal to the antenna and receive an inbound RF signal from the antenna. Note that the antenna elements 534 may be configured into any type of antenna including, but not limited to, an infinitesimal antenna, a small antenna, a micro strip antenna, a meandering line antenna, a monopole antenna, a dipole antenna, a helical antenna, a horizontal antenna, a vertical antenna, a reflector antenna, a lens type antenna, and an aperture antenna.

Figure 43:
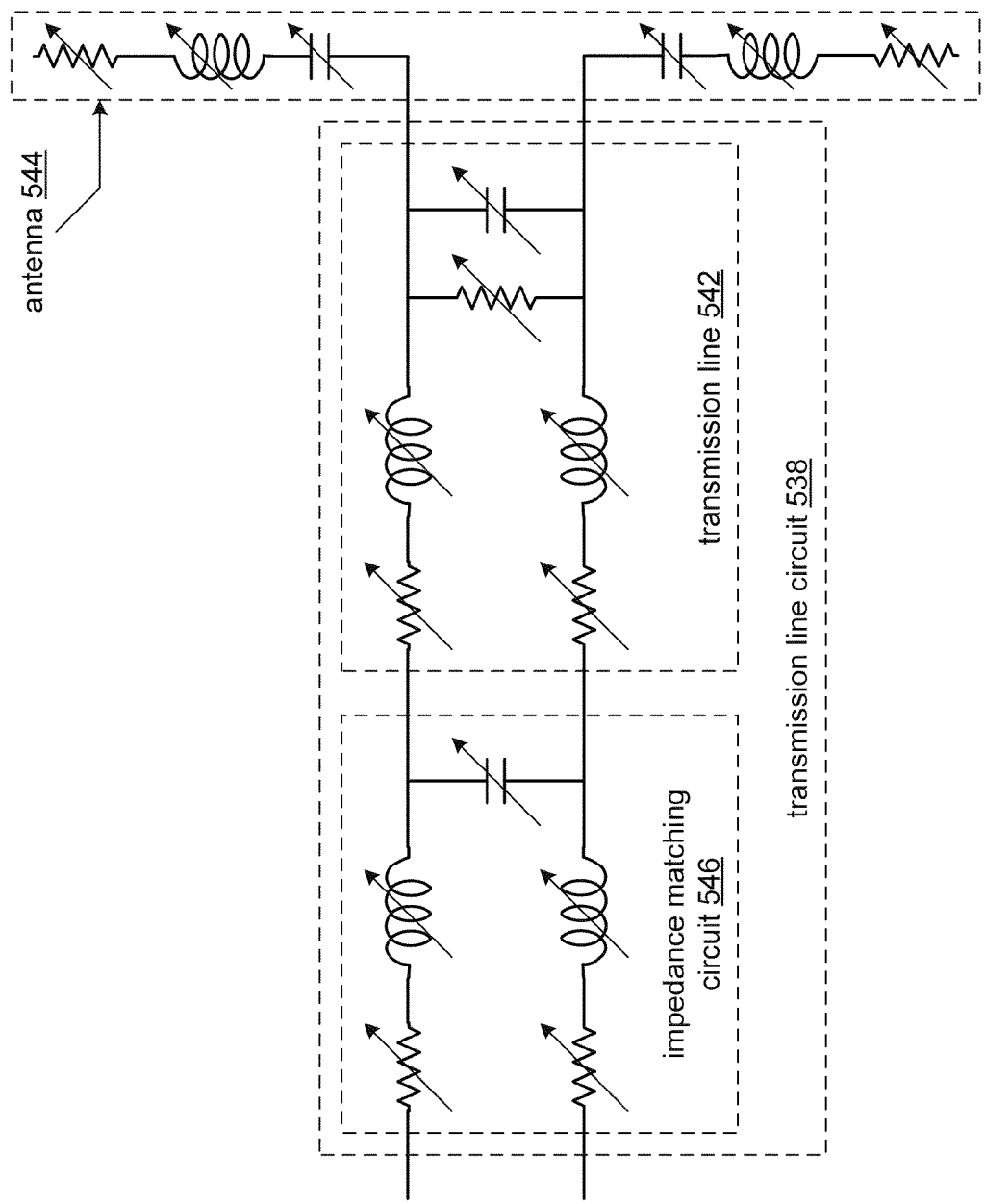
FIG. 43 is a schematic block diagram of an embodiment of an antenna structure in accordance with the present invention.

FIG. 43 is a schematic block diagram of an embodiment of an adjustable integrated circuit (IC) antenna structure that may be used for antenna 38, 40, 42, 44, 72, 74, 282, or 290. The adjustable IC antenna structure includes an antenna 544 and the transmission line circuit 538. The transmission line circuit 538 includes a transmission line 542 and an impedance matching circuit 546. In other embodiments, the transmission line circuit may further include a transformer circuit coupled to the impedance matching circuit 546 or coupled between the impedance matching circuit 546 and the transmission line 542.

The antenna 544 includes a plurality of impedances, a plurality of capacitances, and/or a plurality of inductances; one or more of which may be adjustable. The impedances, capacitances, and inductances are produced by the coupling of the plurality of antenna elements 534 into the antenna. As such, by different couplings of the antenna elements 534, the inductances, capacitances, and/or impedances of the antenna 544 may be adjusted.

The transmission line 542 includes a plurality of impedances, a plurality of capacitances, and/or a plurality of inductances; one or more of which may be adjustable. The impedances, capacitances, and inductances may be produced by coupling of a plurality of transmission line elements into the transmission line 542. As such, by different couplings of the transmission line elements, the inductances, capacitances, and/or impedances of the transmission line 542 may be adjusted. Each of the plurality of transmission line elements may be a metal trace on a metal layer of the die and/or substrate, may be a microstrip, may have the same geometric shape (e.g., square, rectangular, coil, spiral, etc.) as other transmission line elements, may have a different geometric shape than the other transmission line elements, may have the same electromagnetic properties (e.g., impedance, inductance, reactance, capacitance, quality factor, resonant frequency, etc.) as other transmission line elements, and/or may have different electromagnetic properties than the other transmission line elements.

The impedance matching circuit 546 includes a plurality of impedances, a plurality of capacitances, and/or a plurality of inductances; one or more of which may be adjustable. The impedances, capacitances, and inductances may be produced by coupling of a plurality of impedance matching elements (e.g., impedance elements, inductor elements, and/or capacitor elements) into the impedance matching circuit 546. As such, by different couplings of the impedance matching elements, the inductances, capacitances, and/or impedances of the impedance matching circuit 546 may be adjusted. Each of the plurality of impedance matching elements may be a metal trace on a metal layer of the die and/or substrate, may be a microstrip, may have the same geometric shape (e.g., square, rectangular, coil, spiral, etc.) as other impedance matching elements, may have a different geometric shape than the other impedance matching elements, may have the same electromagnetic properties (e.g., impedance, inductance, reactance, capacitance, quality factor, resonant frequency, etc.) as other impedance matching elements, and/or may have different electromagnetic properties than the other impedance matching elements.

If the transmission line circuit 538 includes a transformer circuit, the transformer circuit may include a plurality of impedances, a plurality of capacitances, and/or a plurality of inductances; one or more of which may be adjustable. The impedances, capacitances, and inductances may be produced by coupling of a plurality of transformer elements into the transformer circuit. As such, by different couplings of the transformer elements, the inductances, capacitances, and/or impedances of the transformer circuit may be adjusted. Each of the plurality of transformer elements may be a metal trace on a metal layer of the die and/or substrate, may be a microstrip, may have the same geometric shape (e.g., square, rectangular, coil, spiral, etc.) as other transformer elements, may have a different geometric shape than the other transformer elements, may have the same electromagnetic properties (e.g., impedance, inductance, reactance, capacitance, quality factor, resonant frequency, etc.) as other transformer elements, and/or may have different electromagnetic properties than the other transformer elements.

With adjustable properties of the antenna 544 and the transmission line circuit 538, the control module 288, the RF transceiver 46-52, 76, 274, 286 and/or the baseband processing module 78, 276, 300 may configure one or more antenna structures to have a desired effective length, a desired bandwidth, a desired impedance, a desired quality factor, and/or a desired frequency band. For example, the control module 288, the RF transceiver 46-52, 76, 274, 286 and/or the baseband processing module 78, 276, 300 may configure one antenna structure to have an ultra narrow bandwidth and another antenna structure to have a narrow bandwidth. As another example, the control module 288, the RF transceiver 46-52, 76, 274, 286 and/or the baseband processing module 78, 276, 300 may configure one antenna for one frequency range (e.g., a transmit frequency range) and another antenna for a second frequency range (e.g., a receive frequency range). As yet another example, the control module 288, the RF transceiver 46-52, 76, 274, 286 and/or the baseband processing module 78, 276, 300 may configure one antenna structure to have a first polarization and another antenna to have a second polarization.

Figure 44:
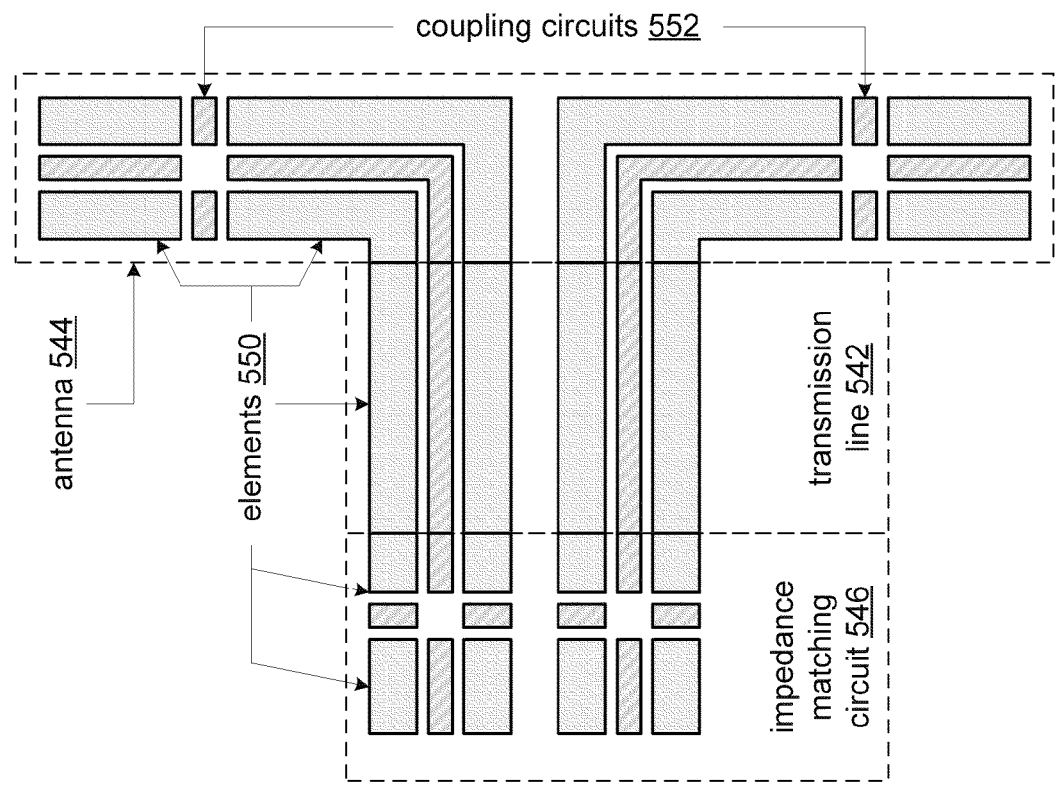

FIG. 44 is a diagram of an embodiment of an adjustable integrated circuit (IC) antenna structure that may be used for antenna 38, 40, 42, 44, 72, 74, 282, or 290. The adjustable IC antenna structure includes the antenna 544, the transmission line 542, and the impedance matching circuit 546 on the same layer of the die and/or package substrate. Note that the antenna structure may further include a transformer circuit coupled to the impedance matching circuit 546 or coupled between the impedance matching circuit 546 and the transmission line 542.

In this illustration, the transmission line 542 includes a plurality of transmission line elements 550 and a transmission line coupling circuit 552. The transmission line coupling circuit 552 couples at least one of the plurality of transmission line elements 550 into a transmission line 542 in accordance with a transmission line characteristic portion of the antenna structure characteristic signal.

The adjustable impedance matching circuit 546 includes a plurality of impedance matching elements 550 and a coupling circuit 552 to produce a tunable inductor and/or a tunable capacitor in accordance with an impedance characteristic portion of the antenna structure characteristic signal. In one embodiment, the tunable inductor includes a plurality of inductor elements 550 and an inductor coupling circuit 552. The inductor coupling circuit 552 couples at least one of the plurality of inductor elements 550 into an inductor having at least one of a desired inductance, a desire reactance, and a desired quality factor within a given frequency band based on the impedance characteristic portion of the antenna structure characteristic signal.

If the transmission line circuit includes a transformer, then the transformer includes a plurality of transformer elements 550 and a transformer coupling circuit 552. The transformer coupling circuit 552 couples at least one of the plurality of transformer elements 550 into a transformer in accordance with a transformer characteristic portion of the antenna structure characteristic signal. Note that each of the coupling circuit 552 may include a plurality of magnetic coupling elements and/or a plurality of switches or transistors.

Figure 45:
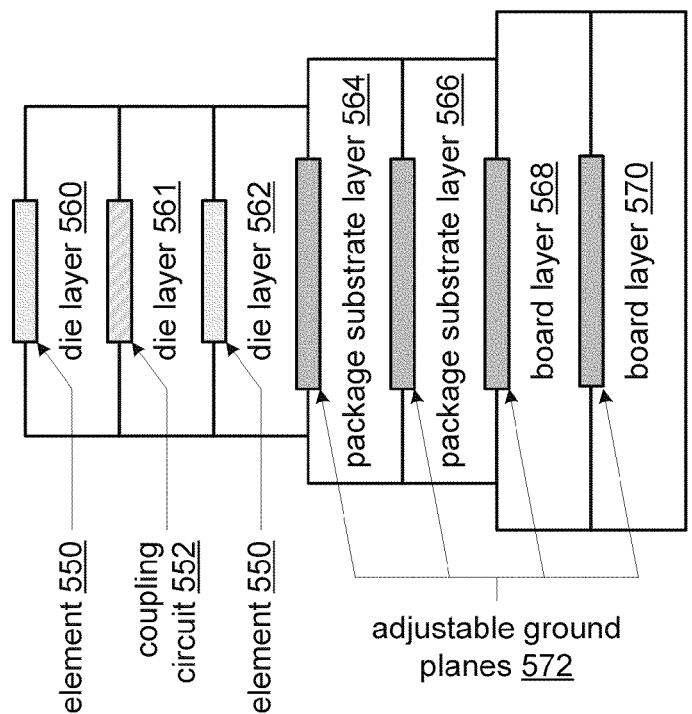

FIG. 45 is a diagram of an embodiment of an adjustable integrated circuit (IC) antenna structure that may be used for antenna 38, 40, 42, 44, 72, 74, 282, or 290. The adjustable IC antenna structure includes the antenna elements and the transmission line circuit elements 550 of die layers 560 and 562, the coupling circuits 552 on die layer 561, and one or more adjustable ground planes 572 on one or more layers of the package substrate 564, 566, and/or on one or more layers of the supporting board 568, 570.

In this embodiment, with the elements 550 on different layers, the electromagnetic coupling between them via the coupling circuits 552 is different than when the elements are on the same layer as shown in FIG. 44. Accordingly, a different desired effective length, a different desired bandwidth, a different desired impedance, a different desired quality factor, and/or a different desired frequency band may be obtained. In another embodiment, the antenna structure may include a combination of the elements 550 and coupling circuits 552 of FIGS. 44 and 45.

In an embodiment of this illustration, the adjustable ground plane 572 may include a plurality of ground planes and a ground plane selection circuit. The plurality of ground planes are on one or more layers of the package substrate and/or on one or more layers the supporting board. The ground plane selecting circuit is operable to select at least one of the plurality of ground planes in accordance with a ground plane portion of the antenna structure characteristic signal to provide the ground plane 540 of the antenna structure.

In an embodiment of this illustration, the adjustable ground plane 572 includes a plurality of ground plane elements and a ground plane coupling circuit. The ground plane coupling circuit is operable to couple at least one of the plurality of ground plane elements into the ground plane in accordance with a ground plane portion of the antenna structure characteristic signal.

FIG. 46 is a diagram of another embodiment of an adjustable integrated circuit (IC) antenna structure that may be used for antenna 38, 40, 42, 44, 72, 74, 282, or 290. The adjustable IC antenna structure includes the antenna elements and the transmission line circuit elements 550 of die layer 560 and on package substrate layer 564, the coupling circuits 552 on die layer 562, and one or more adjustable ground planes 572 on package substrate layer 566 and/or on one or more layers of the supporting board 568, 570.

In this embodiment, with the elements 550 on different layers, the electromagnetic coupling between them via the coupling circuits 552 is different than when the elements are on the same layer as shown in FIG. 44. Accordingly, a different desired effective length, a different desired bandwidth, a different desired impedance, a different desired quality factor, and/or a different desired frequency band may be obtained. In another embodiment, the antenna structure may include a combination of the elements 550 and coupling circuits 552 of FIGS. 44 and 46.

In an embodiment of this illustration, the adjustable ground plane 572 may include a plurality of ground planes and a ground plane selection circuit. The plurality of ground planes are on one or more layers of the package substrate and/or on one or more layers the supporting board. The ground plane selecting circuit is operable to select at least one of the plurality of ground planes in accordance with a ground plane portion of the antenna structure characteristic signal to provide the ground plane 540 of the antenna structure.

In an embodiment of this illustration, the adjustable ground plane 572 includes a plurality of ground plane elements and a ground plane coupling circuit. The ground plane coupling circuit is operable to couple at least one of the plurality of ground plane elements into the ground plane in accordance with a ground plane portion of the antenna structure characteristic signal.

FIG. 47 is a diagram of an embodiment of a coupling circuit 552 and/or 536 that includes a plurality of magnetic coupling elements 574 and switches T1 and T2. In one embodiment, a magnetic coupling element of the plurality of magnetic coupling elements 574 includes a metal trace proximal to first and second antenna elements 534 of the plurality of antenna elements. The metal trace provides magnetic coupling between the first and second antenna elements 534 when a corresponding portion of the antenna structure characteristic signal is in a first state (e.g., enabled) and substantially blocks coupling between the first and second antenna elements when the corresponding portion of the antenna structure characteristic signal is in a second state (e.g., disabled).

For example, a first magnetic coupling element L1 is placed between two elements 534 of the antenna, transmission line, impedance matching circuit, or the transformer. The first magnetic coupling element L1 may be on the same layer as the two elements 534 or on a layer between layers respectively supporting the two elements 534. As positioned, the first magnetic coupling element L1 has an inductance and creates a first capacitance C1 with the first element and creates a second capacitance C2 with the second element. A second magnetic coupling element L2 is coupled in parallel via switches T1 and T2 with the first magnetic coupling element L1. The values of L1, L2, C1, and C2 are designed to produce a low impedance with respect to the impedance of the antenna when the switches T1 and T2 are enabled and to have a high impedance with respect to the impedance of the antenna when the switches T1 and T2 are disabled.

As a specific example, the antenna is designed or configured to have an impedance of approximately 50 Ohms at a frequency of 60 GHz. In this example, when the switches are enabled, the serial combination of C1 and C2 have a capacitance of approximately 0.1 pico-Farads and the parallel combination of the L1 and L2 have an inductance of approximately 70 pico-Henries such that the serial combination of C1 and C2 resonant with the parallel combination of the L1 and L2 at approximately 60 GHz (e.g., $(2\pi f)^2=1/LC$). When the switches are disabled, the impedance of L1 at 60 GHz is substantially greater than the impedances of the first and second antenna elements 534. For example, a 1.3 nano-Henries inductor has an impedance of approximately 500 Ohms at 60 GHz. Such an inductor may be a coil on one or more layers of the die and/or substrate.

FIG. 48 is a diagram of impedance v. frequency for an embodiment of a coupling circuit 536 and/or 552. In the diagram, the impedance of the antenna at an RF frequency (e.g., 60 GHz) is approximately 50 Ohms. When the switches are enabled, the impedance of the coupling circuit 536 and/or 552 is much less than the 50 Ohms of the antenna. When the switches are disabled, the impedance of the coupling circuit 536 and/or 552 is much greater than the 50 Ohms of the antenna.

Figure 49:
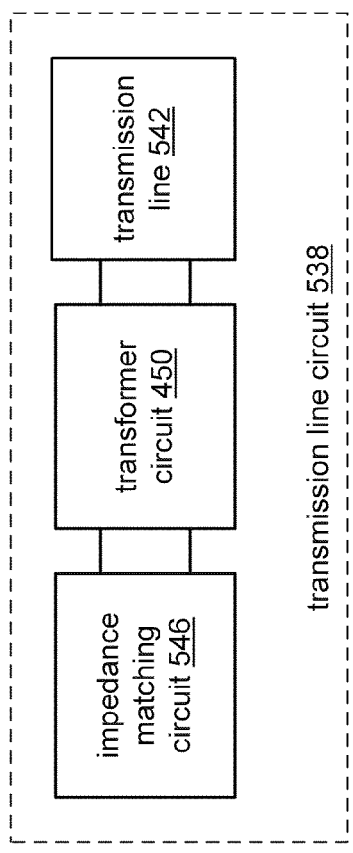
FIGS. 49 and 50 are schematic block diagrams of various embodiments of a transmission line circuit in accordance with the present invention.

FIG. 49 is schematic block diagram of an embodiment of a transmission line circuit 538 that includes the transmission line 542, the transformer circuit 450, and the impedance matching circuit 546. In this embodiment, the transformer circuit 450 is coupled between the impedance matching circuit 546 and the transmission line 542. Note that the transmission line circuit 538 may be shared by multiple antennas or may be used by only one antenna. For example, when multiple antennas are used, each antenna has its own transmission line circuit.

Figure 50:
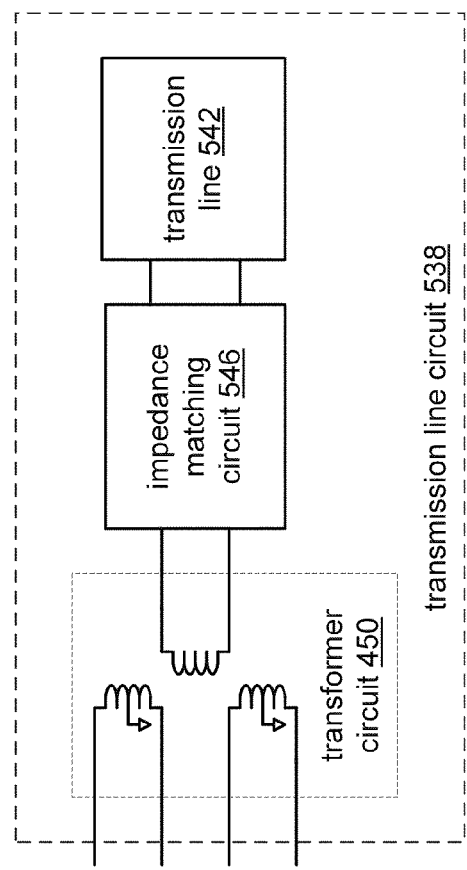

FIG. 50 is schematic block diagram of an embodiment of a transmission line circuit 538 that includes the transmission line 542, the transformer circuit 450, and the impedance matching circuit 546. In this embodiment, the transformer circuit 450 is coupled after the impedance matching circuit 546 and includes a single-ended winding coupled to the impedance matching circuit and a differential winding, which is coupled to the RF transceiver.

Figure 51:
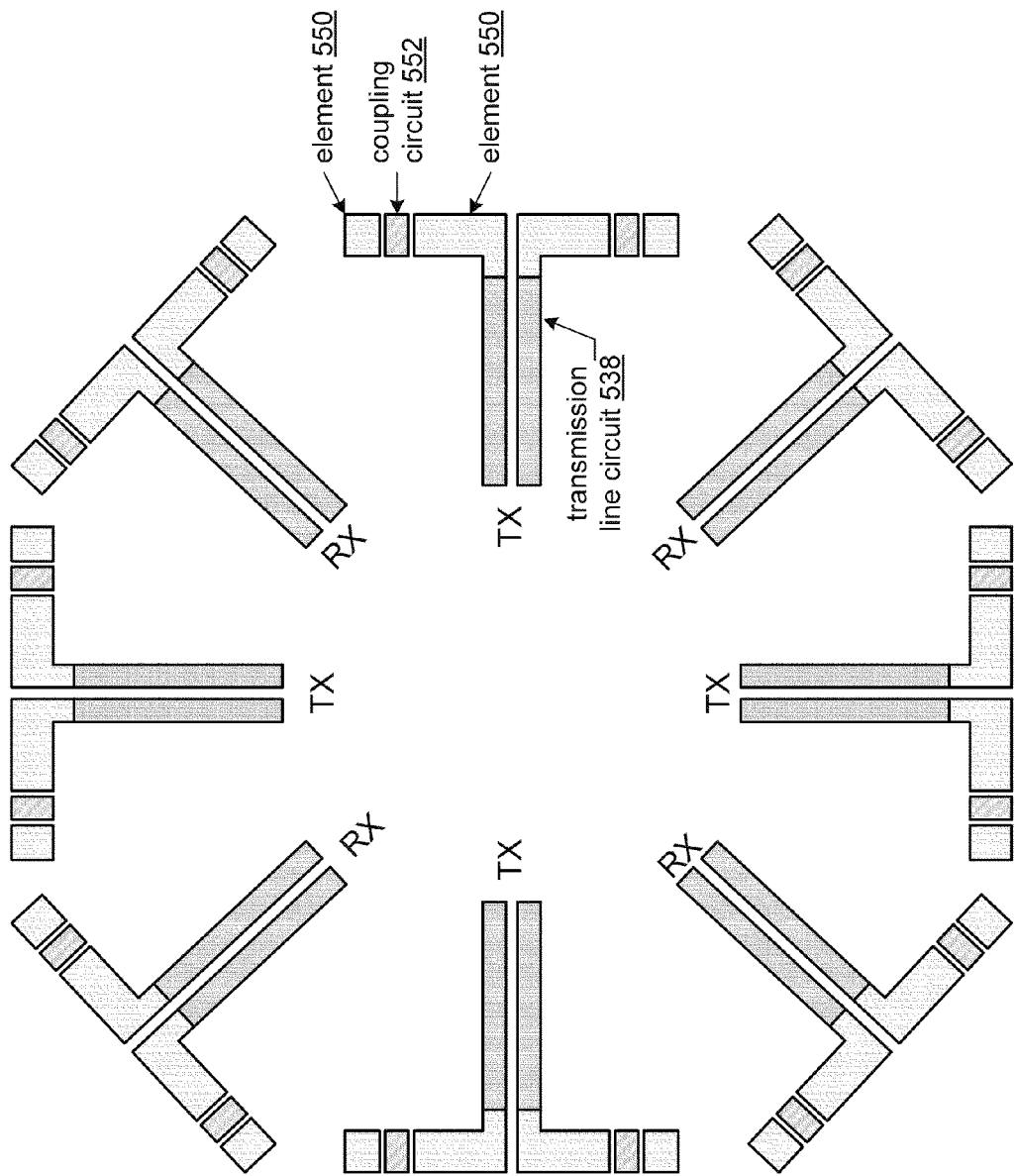
FIG. 51 is a diagram of an embodiment of an antenna structure in accordance with the present invention.

FIG. 51 is a diagram of an embodiment of an antenna array structure that includes a plurality of adjustable antenna structures. Each of the adjustable antenna structures includes the transmission line circuit 538, the antenna elements 550 and the coupling circuits 552. While the antenna structures are shown to have a dipole shape, they may be any other type of antenna structure including, but not limited to, an infinitesimal antenna, a small antenna, a micro strip antenna, a meandering line antenna, a monopole antenna, a dipole antenna, a helical antenna, a horizontal antenna, a vertical antenna, a reflector antenna, a lens type antenna, and an aperture antenna.

In this embodiment, the antenna array includes four transmit (TX) antenna structures and four receive (RX) antenna structures, where the RX antenna structures are interleaved with the TX antenna structures. In this arrangement, the RX antennas have a first directional circular polarization and the TX antennas have a second directional circuit polarization. Note that the antenna array may include more or less RX and TX antennas than those shown in the present figure.

Figure 52:
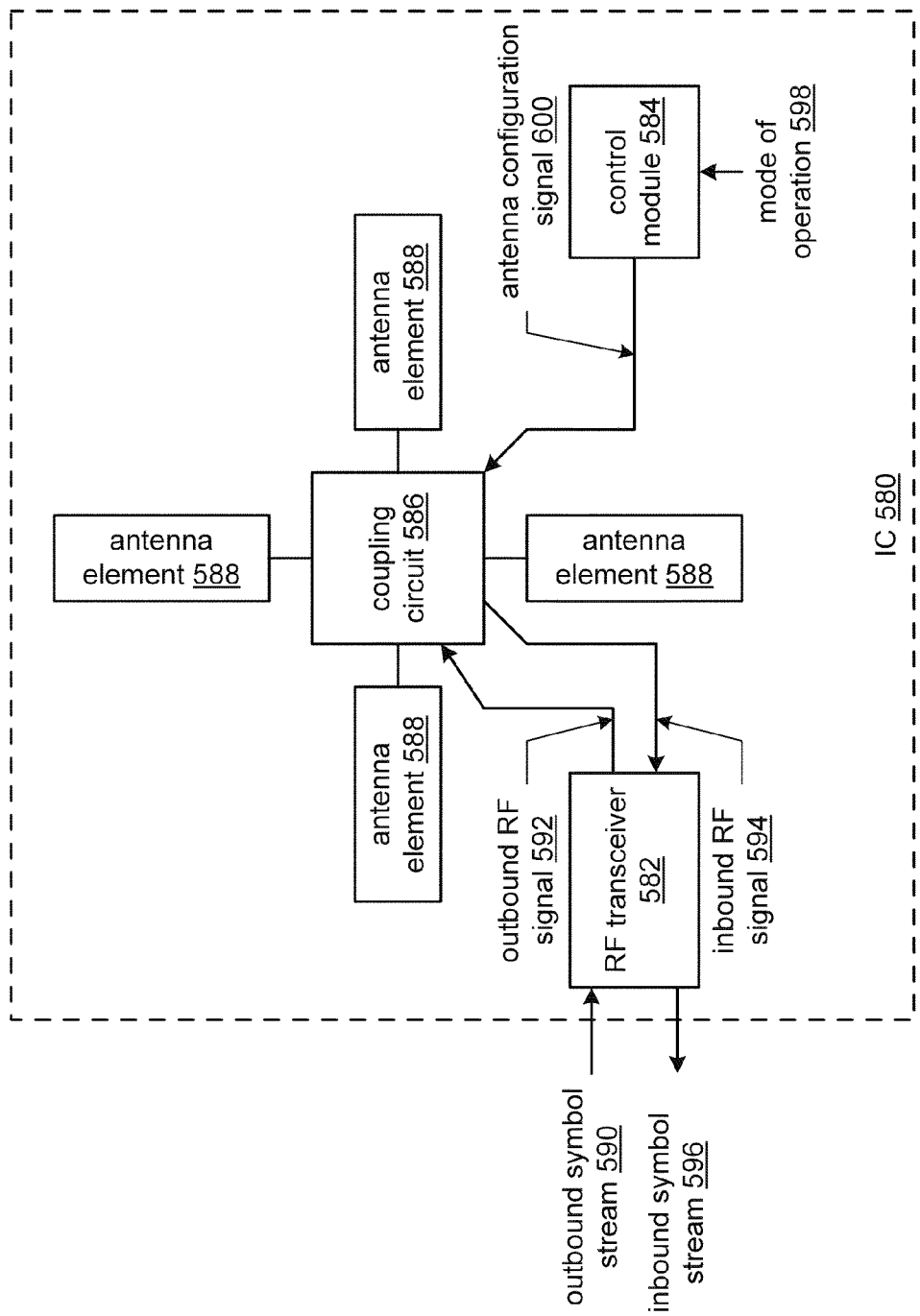
FIG. 52 is a schematic block diagram of an embodiment of an IC in accordance with the present invention.

FIG. 52 is a schematic block diagram of an embodiment of an IC 580 that includes a plurality of antenna elements 588, a coupling circuit 586, a control module 584, and an RF transceiver 582. Each of the plurality of antenna elements 588 is operable in a frequency range of approximately 55 GHz to 64 GHz. An antenna element 588 may be any type of antenna including, but not limited to, an infinitesimal antenna, a small antenna, a micro strip antenna, a meandering line antenna, a monopole antenna, a dipole antenna, a helical antenna, a horizontal antenna, a vertical antenna, a reflector antenna, a lens type antenna, and an aperture antenna.

The coupling circuit 586, which may be a switching network, transformer balun circuit, and/or transmit/receive switching circuit, is operable to couple the plurality of antenna elements 588 into an antenna structure in accordance with an antenna configuration signal. The control module 584 is coupled to generate the antenna configuration signal 600 based on a mode of operation 598 of the IC. The control module 584 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The control module 584 may have an associated memory and/or memory element, which may be a single memory device, a plurality of memory devices, and/or embedded circuitry of the control module 584. Such a memory device may be a read-only memory, random access memory, volatile memory, non-volatile memory, static memory, dynamic memory, flash memory, cache memory, and/or any device that stores digital information. Note that when the control module 584 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the control module 584 executes, hard coded and/or operational instructions corresponding to at least some of the steps and/or functions illustrated in FIGS. 52-57.

The RF transceiver 582 is coupled to convert an outbound symbol stream 590 into an outbound RF signal 592 and to convert an inbound RF signal 594 into an inbound symbol stream 596 in accordance with the mode of operation 598 of the IC. Note that the RF transceiver 582 may be implemented in accordance with one or more of the RF transceiver embodiments previously discussed. Further note that the antenna configuration signal 600 may adjust the characteristics (e.g., a desired effective length, a desired bandwidth, a desired impedance, a desired quality factor, and/or a desired frequency band) of the antenna structure for various modes of operation 598. For example, when the mode of operation changes from one frequency band to another (e.g., from a TX frequency band to an RX frequency band), the characteristics of the antenna structure may be adjusted. As another example, the mode of operation may change due to changes in wireless communication conditions (e.g., fading, transmit power levels, receive signal strength, baseband modulation scheme, etc.), and, as such, the characteristics of the antenna structure may be adjusted accordingly. As another example, the mode of operation may change from local communications to remote communications, which may benefit from a change in the characteristics of the antenna structure. As yet another example, the mode of operation may change from low data rate local communications to high data rate local communications, which may benefit from a change in the characteristics of the antenna structure. As yet another example, the antenna configuration signal 600 may cause a change in the antenna characteristics for one or more of the following modes of operation half duplex in-air beamforming communications, half duplex multiple input multiple output communications, full duplex polarization communications, and full duplex frequency off set communications.

In one embodiment, a first antenna element of the plurality of antenna elements 588 is coupled to receive the inbound RF signal 594 and a second antenna element of the plurality of antenna elements 588 is coupled to transmit the outbound RF signal 592. In addition, the first antenna element 588 may receive the inbound RF signal 594 within a receive frequency band of the frequency band and the second antenna element 588 may transmit the outbound RF signal 592 within a transmit frequency band of the frequency band.

In another embodiment, a first antenna element of the plurality of antenna elements 588 has a first polarization and a second antenna element of the plurality of antenna elements 588 has a second polarization. In addition, the first and second polarizations include a left hand circular polarization and a right hand circular polarization. In this instance, the second antenna element includes a phase shift module coupled to phase shift the inbound or outbound RF signals by a phase offset. Further, the first antenna element is orthogonally positioned with respect to the second antenna section.

In an embodiment of the IC 580, the IC 580 includes a die and a package substrate. In this embodiment, the die supports the coupling circuit 586, the control module 584, and the RF transceiver 582 and the package substrate supports the plurality of antenna elements 588. In another embodiment, the die supports the plurality of antenna elements 588, the coupling circuit 586, the control module 584, and the RF transceiver 582 and the package substrate supports the die.

Figure 53:
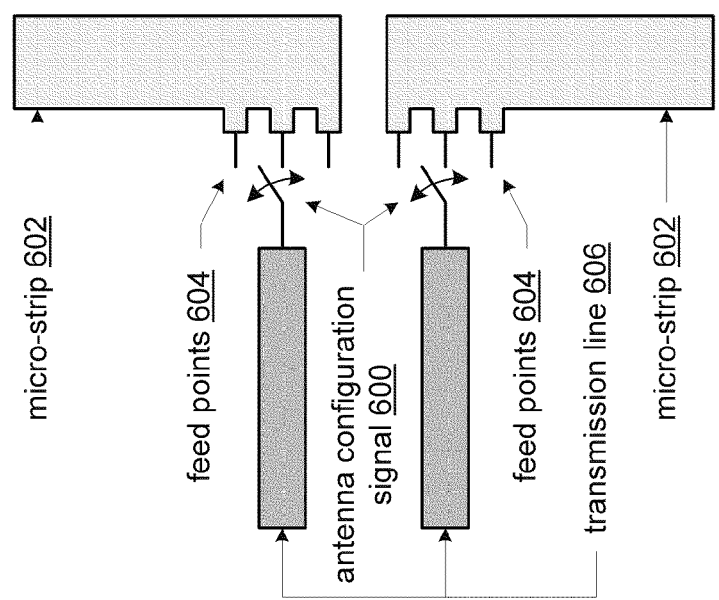

FIG. 53 is a diagram of an embodiment of an antenna structure that includes a pair of micro-strip antenna elements 602 and a transmission line 606. In this embodiment, each of the micro-strip antenna elements 602 includes a plurality of feed points 604 that are selectively coupled to the transmission line 606 in accordance with the antenna configuration signal 600. For example, each of the feed points 604 corresponds to different characteristics of the antenna structure (e.g., a different effective length, a different bandwidth, a different impedance, a different radiation pattern, a different quality factor, and/or a different frequency band).

Figure 54:
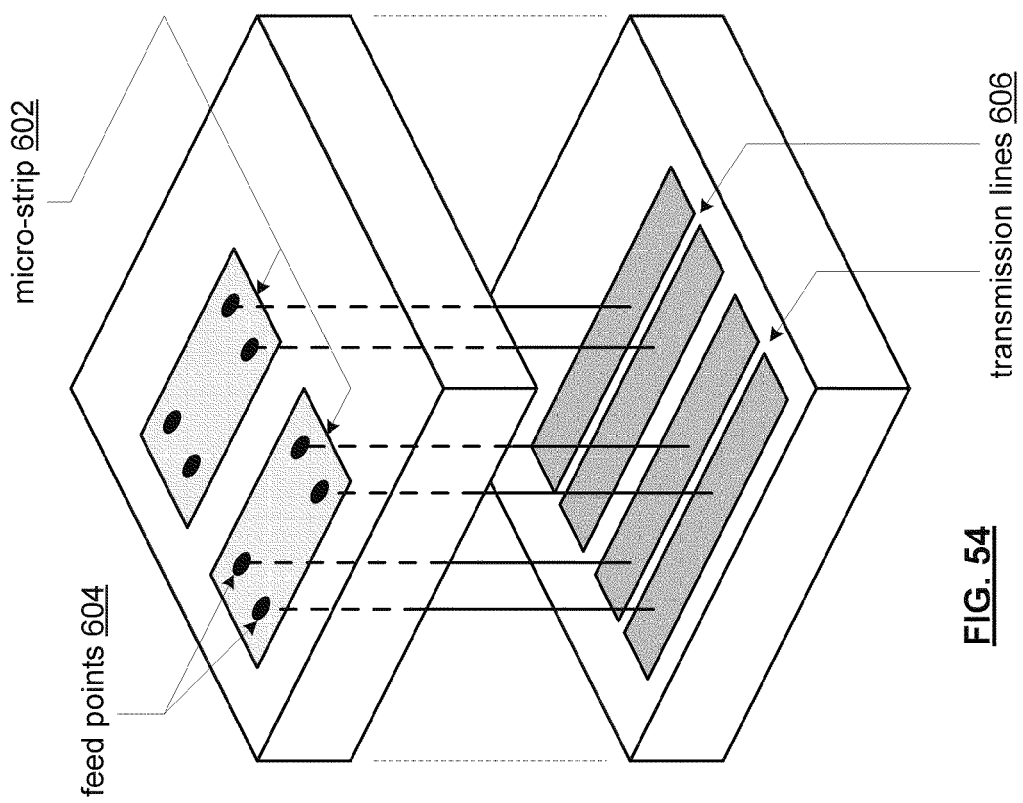

FIG. 54 is a diagram of an embodiment of an antenna structure that includes a pair of micro-strip antenna elements 602 and a transmission line 606. In this embodiment, each of the micro-strip antenna elements 602 includes a plurality of feed points 604 that are selectively coupled to the transmission line 606 in accordance with the antenna configuration signal 600. In this embodiment, the different feed points 604 cause different polarizations of the micro-strip antenna element 602.

Figure 55:
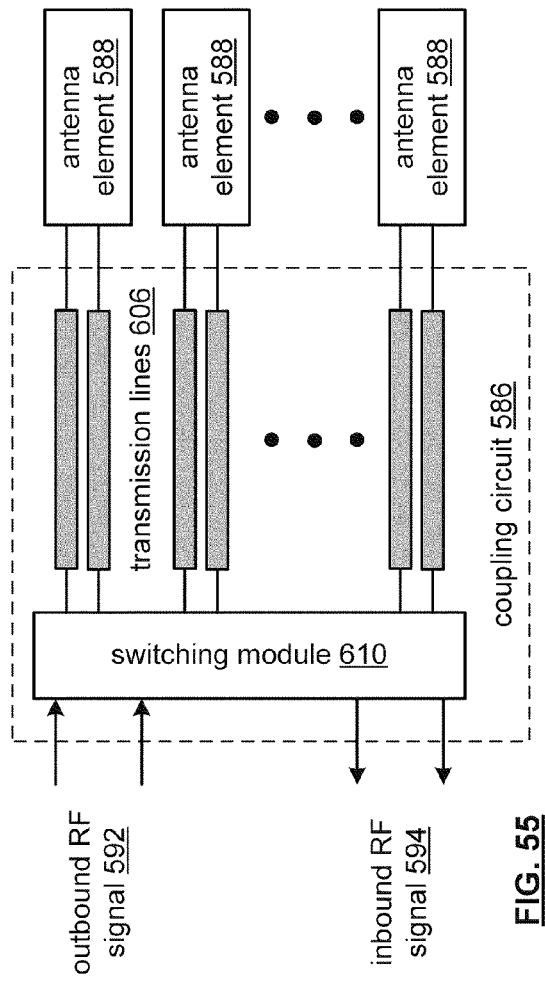

FIG. 55 is a diagram of an embodiment of an antenna structure that includes the plurality of antenna elements 588 and the coupling circuit 586. The coupling circuit 586 includes a plurality of transmission lines 606 and a switching module 610. Note that the coupling circuit 586 may further include a plurality of transformer modules coupled to the plurality of transmission lines and/or a plurality of impedance matching circuits coupled to the plurality of transformer modules.

In this embodiment, the switching module 610, which may be a switching network, multiplexer, switches, transistor network, and/or a combination thereof, couples one or more of the plurality of transmission lines 606 to the RF transceiver in accordance with the antenna configuration signal 600. For example, in a half duplex mode, the switching module 610 may couple one of the transmission lines 606 to the RF transceiver for transmitting the outbound RF signal 592 and for receiving the inbound RF signal 594. As another example, for half duplex multiple input multiple output communications, the switching module 610 may couple two or more of the transmission lines 606 to the RF transceiver for transmitting the outbound RF signal 592 and for receiving the inbound RF signal 594. As yet another example, for full duplex polarization communications, the switching module 610 may couple one of the transmission lines 606 to the RF transceiver for transmitting the outbound RF signal 592 and another transmission line 606 to the RF transceiver for receiving the inbound RF signal 594, which may be in the same frequency band as the outbound RF signal 592 or a different frequency band.

Figure 56:
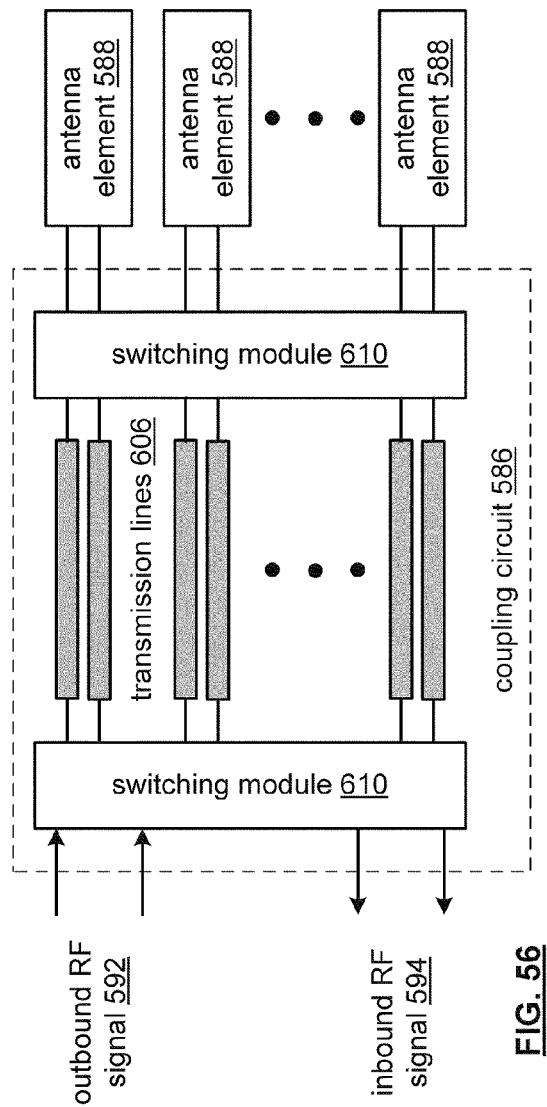

FIG. 56 is a diagram of an embodiment of an antenna structure that includes the plurality of antenna elements 588 and the coupling circuit 586. The coupling circuit 586 includes a plurality of transmission lines 606 and two switching modules 610. Note that the coupling circuit 586 may further include a plurality of transformer modules coupled to the plurality of transmission lines and/or a plurality of impedance matching circuits coupled to the plurality of transformer modules.

In this embodiment, the switching modules 610 couples one or more of the plurality of transmission lines 606 to the RF transceiver and to one of the plurality of antenna elements in accordance with the antenna configuration signal 600. In this manner, if the antenna elements have different characteristics, then the coupling circuit 586, under the control of the control module 584, may select an antenna element for the particular mode of operation of the IC 580 to achieve a desired level of RF communication. For example, one antenna element may be selected to have a first polarization while a second antennal element is selected to have a second polarization. As another example, one antenna element may be selected to have a first radiation pattern while a second antennal element is selected to have a second radiation pattern.

Figure 57:
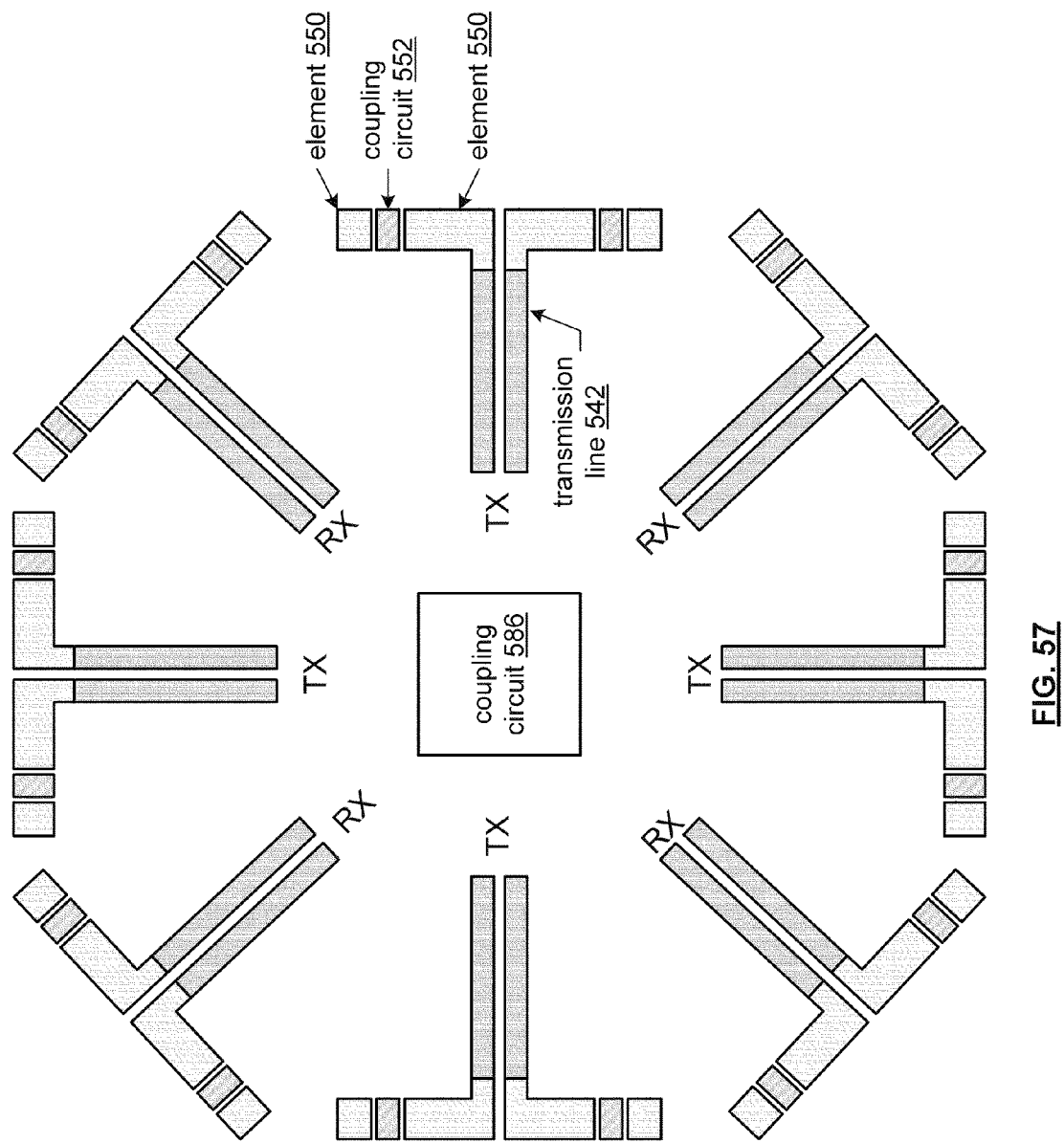

FIG. 57 is a diagram of an embodiment of an antenna array structure that includes a plurality of adjustable antenna structures and the coupling circuit 586. Each of the adjustable antenna structures includes the transmission line circuit 538, the antenna elements 550 and the coupling circuits 552. While the antenna structures are shown to have a dipole shape, they may be any other type of antenna structure including, but not limited to, an infinitesimal antenna, a small antenna, a micro strip antenna, a meandering line antenna, a monopole antenna, a dipole antenna, a helical antenna, a horizontal antenna, a vertical antenna, a reflector antenna, a lens type antenna, and an aperture antenna.

In this embodiment, the antenna array includes four transmit (TX) antenna structures and four receive (RX) antenna structures, where the RX antenna structures are interleaved with the TX antenna structures. In this arrangement, the RX antennas have a first directional circular polarization and the TX antennas have a second directional circuit polarization. Note that the antenna array may include more or less RX and TX antennas than those shown in the present figure.

The coupling circuit 586 is operable to couple one or more of the TX antenna structures to the RF transceiver and to couple one or more of the RX antenna structures to the RF transceiver in accordance with the antenna configuration signal 600. The RF transceiver converts an outbound symbol stream into an outbound RF signal and converts an inbound RF signal into an inbound symbol stream, wherein the inbound and outbound RF signals have a carrier frequency within a frequency band of approximately 55 GHz to 64 GHz. In an embodiment, the coupling circuit 586 includes a receive coupling circuit to provide the inbound RF signal from the plurality of receive antenna elements to the RF transceiver and a transmit coupling circuit to provide the outbound RF signal from the RF transceiver to the plurality of transmit antenna elements.

Figure 58:
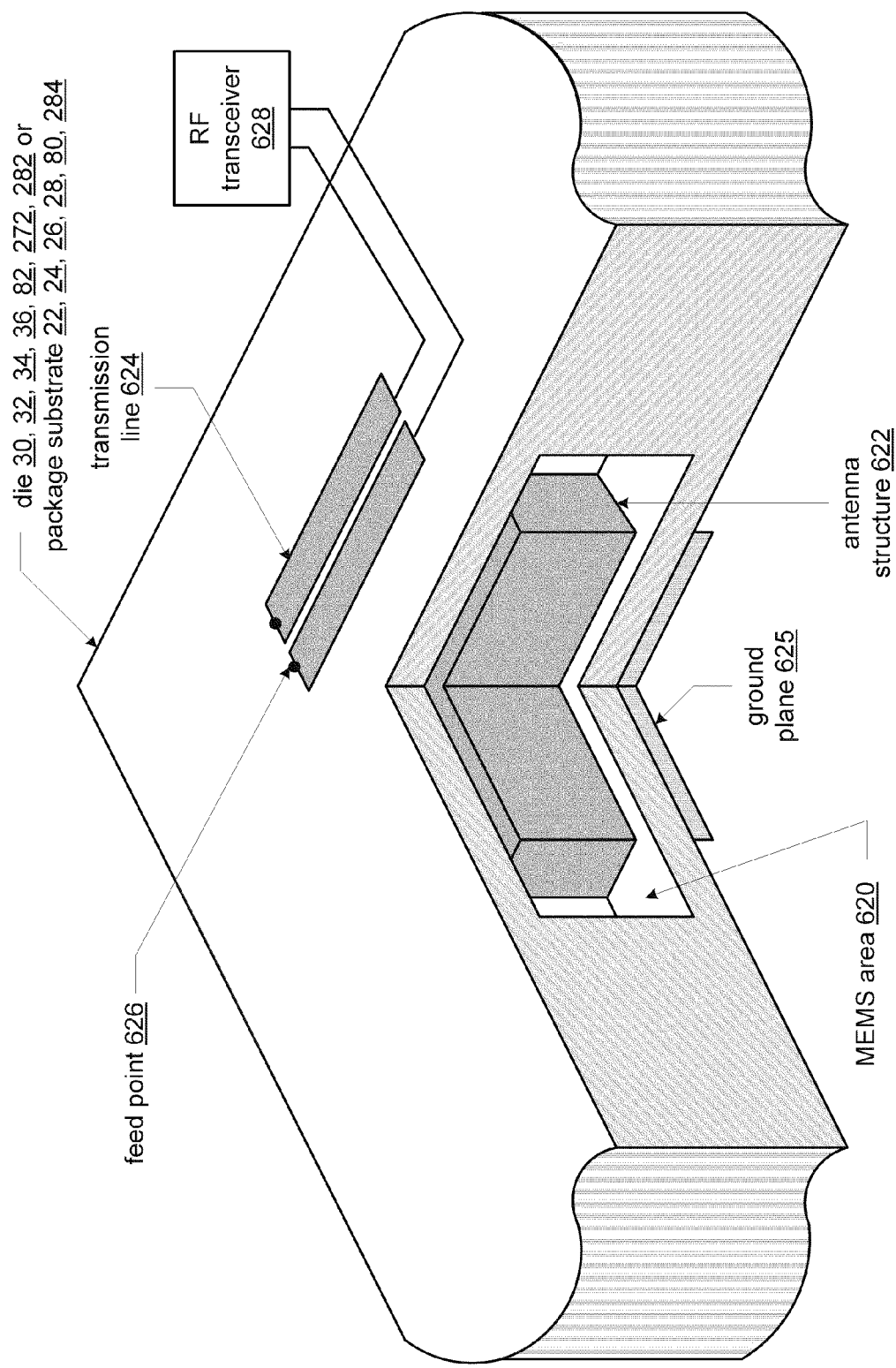

FIG. 58 is a diagram of an integrated circuit (IC) antenna structure that includes a micro-electromechanical (MEM) area 620 in a die 30, 32, 34, 36, 82, 272, or 282 and/or in a package substrate 22, 24, 26, 28, 80, or 284. The IC antenna structure further includes a feed point 626 and a transmission line 624, which may be coupled to an RF transceiver 628. The RF transceiver 628 may be implemented in accordance with any one of the RF transceivers previously discussed herein. Note that the coupling of the transmission line 624 to the RF transceiver 628 may include an impedance matching circuit and/or a transformer.

The MEM area 620 includes a three-dimensional shape, which may be cylinder in shape, spherical in shape, box in shape, pyramid in shape, and/or a combination thereof that is micro-electromechanically created within the die and/or package substrate. The MEM area 620 also includes an antenna structure 622 within its three dimensional-shape. The feed point 626 is coupled to provide an outbound radio frequency (RF) signal to the antenna structure 622 for transmission and to receive an inbound RF signal from the antenna structure 622. The transmission line 624 includes a first line and a second line that are substantially parallel, where at least the first line is electrically coupled to the feed point. Note that the antenna structure may further include a ground plane 625, which is proximal to the antenna structure 622. Further note that such an antenna structure may be used for point to point RF communications, which may be local communications and/or remote communications.

In one embodiment, the die supports the MEM area 620, the antenna structure, the feed point 626, and the transmission line 624 and the package substrate supports the die. In another embodiment, the die supports the RF transceiver and the package substrate supports the die, the MEM area 620, the antenna structure 622, the feed point 626, and the transmission line 624.

Figure 59:
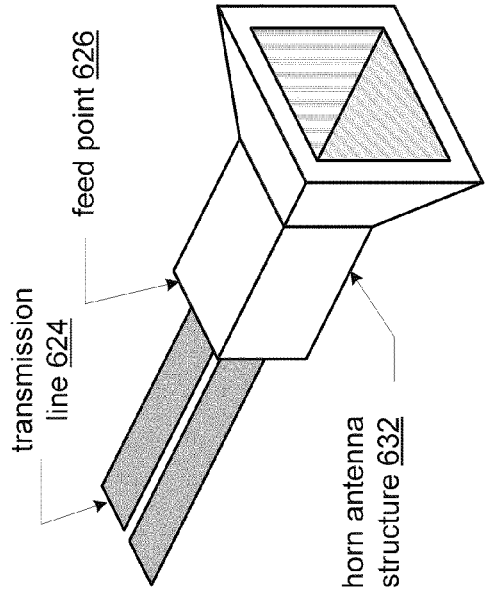
Figure 60:
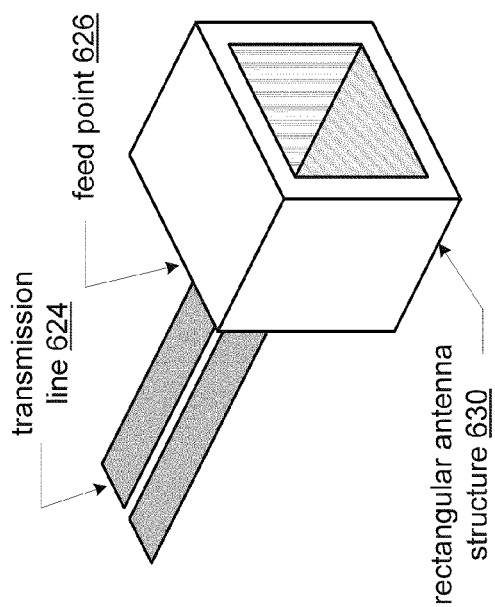

FIGS. 59-66 are diagrams of various embodiments of an antenna structure 622 that may be implemented within the MEM three-dimensional area 620. FIGS. 59 and 60 illustrate aperture antenna structures of a rectangle shape 630 and a horn shape 632. In these embodiments, the feed point is electrically coupled to the aperture antenna. Note that other aperture antenna structures may be created within the MEM three-dimensional area 620. For example, a wave guide may be created.

Figure 61:
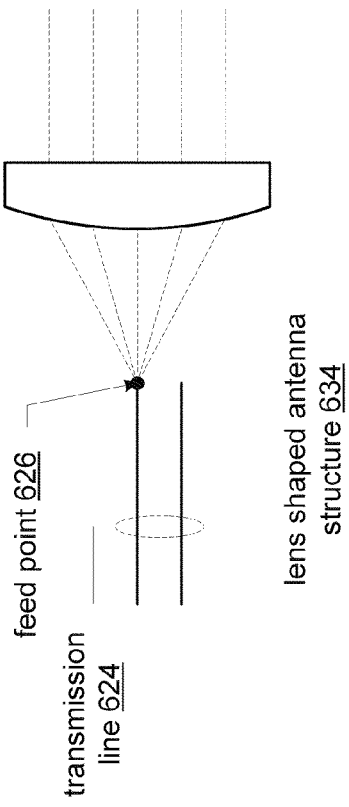

FIG. 61 illustrates a lens antenna structure 634 that has a lens shape. In this embodiment, the feed point is positioned at a focal point of the lens antenna structure 634. Note that the lens shape may be different than the one illustrated. For example, the lens shape may be one-sided convex-shaped, one-sided concave-shaped, two-sided convex-shaped, two-sided concave-shaped, and/or a combination thereof.

FIGS. 62 and 63 illustrate three-dimensional dipole antennas that may be implemented within the MEM three-dimensional area 620. FIG. 62 illustrates a biconical shape antenna structure 636 and FIG. 63 illustrates a bi-cylinder shape, or a bi-elliptical shape antenna structure 638. In these embodiments, the feed point 626 is electrically coupled to the three-dimensional dipole antenna. Other three-dimensional dipole antenna shapes include a bow tie shape, a Yagi antenna, etc.

FIGS. 64-66 illustrate reflector antennas that may be implemented within the MEM three-dimensional area 620. FIG. 64 illustrates a plane shape antenna structure 640; FIG. 65 illustrates a corner shape antenna structure 642; and FIG. 66 illustrates a parabolic shape antenna structure 644. In these embodiments, the feed point 626 is positioned at a focal point of the antenna.

Figure 67:
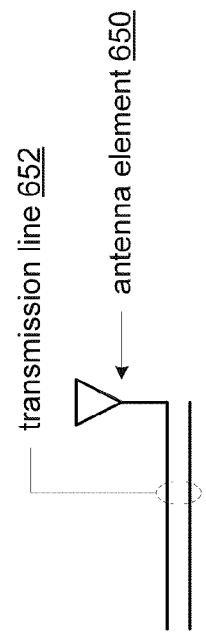
FIG. 67 is a schematic block diagram of an embodiment of an antenna structure in accordance with the present invention.

FIG. 67 is a schematic block diagram of an embodiment of a low efficiency integrated circuit (IC) antenna that includes an antenna element 650 and a transmission line 652. The antenna element 650 is on a first metal layer of a die of the IC. In one embodiment, the antenna element 650 has a length less than approximately one-tenth of a wavelength (e.g., an infinitesimal dipole antenna, a small dipole antenna) for transceiving RF signals in a frequency band of approximately 55 GHz to 64 GHz. In another embodiment, the antenna element 650 has a length greater than one-and-one-half times the wavelength (e.g., a long dipole antenna) for transceiving RF signals in the frequency band of approximately 55 GHz to 64 GHz. Regardless of the antenna element 650 length, the antenna element 650 may be implemented as a micro-strip, a plurality of micro-strips, a meandering line, and/or a plurality of meandering lines. Note that in an embodiment, the antenna element may be a monopole antenna element or a dipole antenna.

The transmission line 652 is on the die and is electrically coupled to the first feed points of the antenna element 650. In one embodiment, the transmission line 652, which includes two lines, is directly coupled to the RF transceiver. In another embodiment, the low efficiency IC antenna structure further includes a ground trace on a second metal layer of the die, wherein the ground trace is proximal to the antenna element.

An application of the low efficient IC antenna structure may be on an IC that includes a RF transceiver, a die, and a package substrate. The die supports the RF transceiver and the package substrate that supports the die. The RF transceiver functions to convert an outbound symbol stream into an outbound RF signal and to convert an inbound RF signal into an inbound RF signal, wherein a transceiving range of the RF transceiver is substantially localized within a device incorporating the IC, and wherein the inbound and outbound RF signals have a carrier frequency in a frequency range of approximately 55 GHz to 64 GHz.

The antenna structure includes the antenna element 650 and a transmission line circuit. The antenna element 650 has a length less than approximately one-tenth of a wavelength or greater than one-and-one-half times the wavelength for a frequency band of approximately 55 GHz to 64 GHz to transceive the inbound and outbound RF signals. The transmission line circuit, which includes the transmission line 652 and may also include a transformer and/or an impedance matching circuit, couples the RF transceiver to the antenna element. In one embodiment, the die supports the antenna element and the transmission line circuit.

Figure 68:
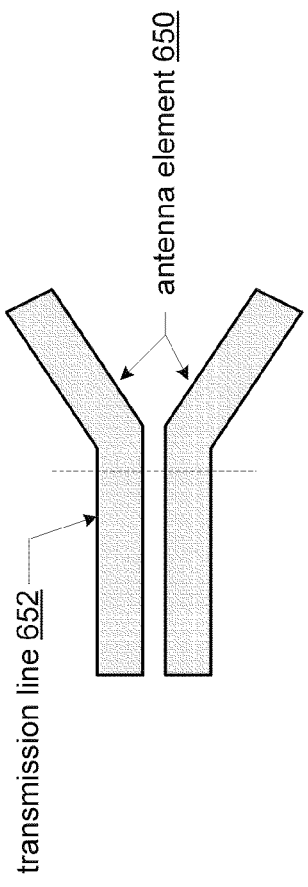
FIGS. 68 and 69 are diagrams of various embodiments of an antenna structure in accordance with the present invention.

FIG. 68 is a schematic block diagram of an embodiment of a low efficiency integrated circuit (IC) antenna that includes an antenna element 650 and a transmission line 652. The antenna element 650 includes first and second metal traces. The first metal trace has a first feed point portion and a first radiation portion, wherein the first radiation portion is at an angle of less than 90° and greater than 0° with respect to the first feed point portion. The second metal trace has a second feed point portion and a second radiation portion, wherein the second radiation portion is at an angle of less than 90° and greater than 0° with respect to the second feed point portion. In this embodiment, the fields produced by each metal trace do not fully cancel each other, thus a net radiation occurs.

Figure 69:
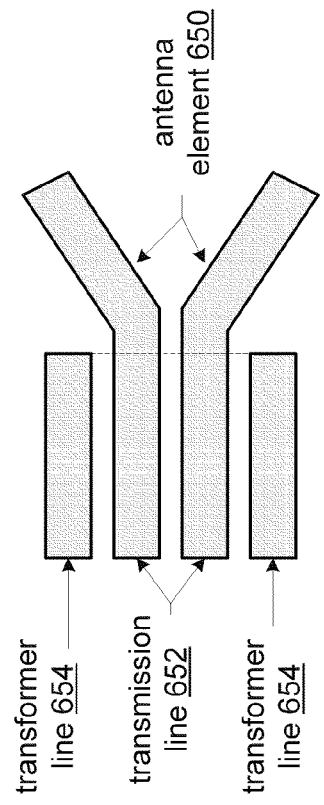

FIG. 69 is a schematic block diagram of an embodiment of a low efficiency integrated circuit (IC) antenna that includes an antenna element 650 and a transmission line 652. The antenna element 650 includes first and second metal traces. The first metal trace has a first feed point portion and a first radiation portion, wherein the first radiation portion is at an angle of less than 90° and greater than 0° with respect to the first feed point portion. The second metal trace has a second feed point portion and a second radiation portion, wherein the second radiation portion is at an angle of less than 90° and greater than 0° with respect to the second feed point portion. In this embodiment, the fields produced by each metal trace do not fully cancel each other, thus a net radiation occurs.

The low efficient IC antenna further includes first and second transformer lines electromagnetically coupled to the first and second lines of the transmission line. In this embodiment, the first and second transformer lines produce a transformer for providing an outbound radio frequency (RF) signal to the transmission line and for receiving an inbound RF signal from the transmission line.

Figure 70:
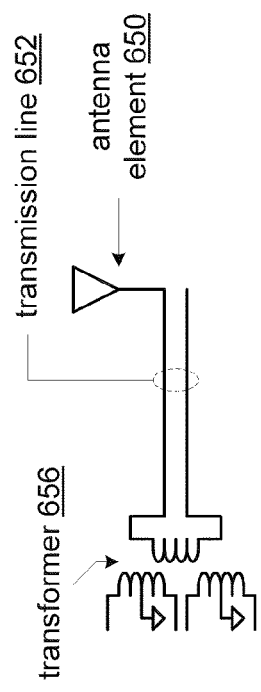
FIG. 70 is a schematic block diagram of an embodiment of an antenna structure in accordance with the present invention.

FIG. 70 is a schematic block diagram of an embodiment of a low efficient antenna structure that includes an antenna element 650, a transmission line 652, and a transformer 656. In one embodiment, the transformer 656 includes a single ended transformer winding and a differential transformer winding. The single ended transformer winding is coupled to the first and second lines of the transmission line and is on the same metal layer of the die as the transmission line 652. The differential transformer winding is electromagnetically coupled to the single ended transformer winding is on a different metal layer of the die.

The transformer 656 may further include a second differential transformer winding electromagnetically coupled to the single ended transformer winding. In one embodiment, the second differential transformer winding is on a third metal layer of the die, wherein the differential transformer winding provides an outbound radio frequency (RF) signal to the transmission line and the second differential transformer winding receives an inbound RF signal from the transmission line.

Referring generally to the FIGS. 1-70, one or more integrated circuits are presented that can be used in producing either a passive or active RFID tag that communicates with a remote device such as an RFID reader. Such an integrated circuit provides an RF transceiver operating as an RFID interface for communication via RF signaling in a millimeter wave RF band such as a 60 GHz frequency band or other millimeter wave band, a microwave frequency band, 900 MHz band, or other frequency band between one or more circuits of the integrated circuit and/or the remote RFID reader via RF signaling between the RFID interface and the remote RFID reader. An antenna section, such as one or more of the antenna previously described or described further in conjunction with FIGS. 71-81, is included on a die of the integrated circuit to facilitate such communications. The RF signaling between the RFID interface and the remote RFID reader can include reception of a millimeter wave RFID signal from the remote RFID reader and the backscattering of the millimeter wave RFID signal by the RFID interface.

Figure 71:
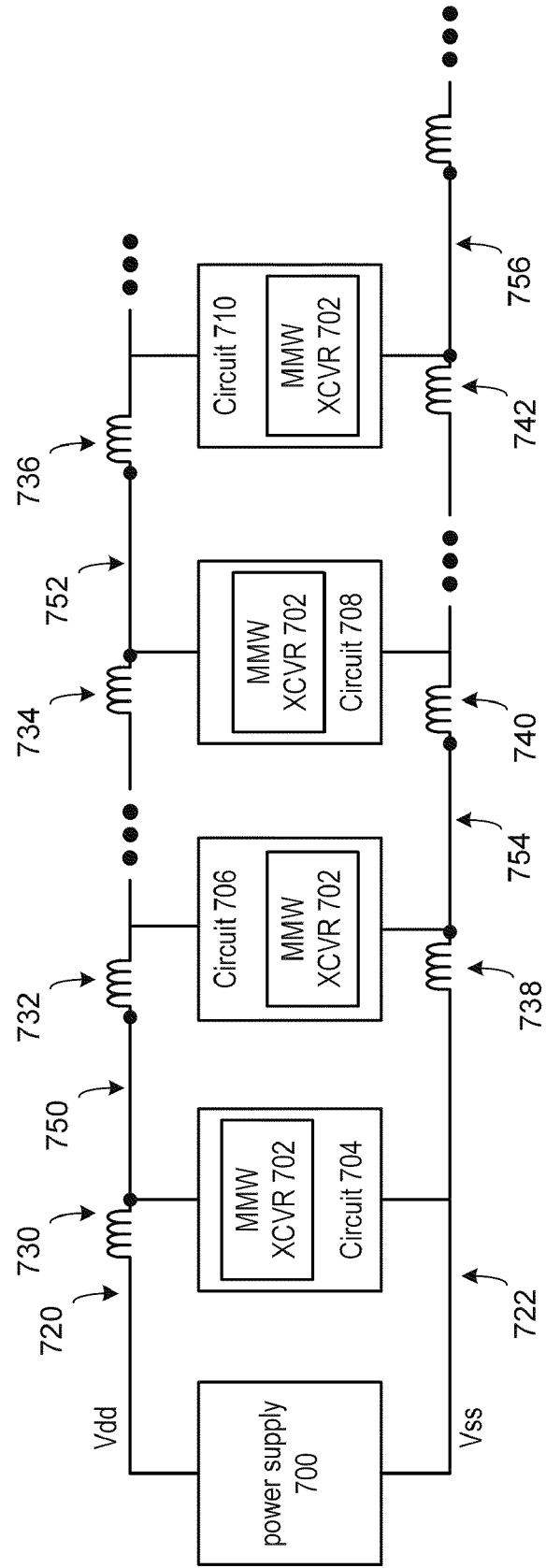
FIG. 71 is a schematic block diagram of an embodiment of an antenna structure based on power supply lines in accordance with the present invention.

FIG. 71 is a schematic block diagram of an embodiment of an antenna structure based on power supply lines in accordance with the present invention. In particular, a plurality of circuits 704, 706, 708 and 710 of an integrated circuit each include a millimeter wave interface, such as millimeter wave transceiver 702, for communicating data between the plurality of circuits 704, 706, 708 and 710 via millimeter wave RF signaling. The integrated circuit may be a component of a personal computer, a laptop computer, a hand held computer, a wireless local area network (WLAN) access point, a WLAN station, a cellular telephone, an audio entertainment device, a video entertainment device, a video game control and/or console, a radio, a cordless telephone, a cable set top box, a satellite receiver, network infrastructure equipment, a cellular telephone base station, Bluetooth head set or other device. In operation, the circuits 704, 706, 708 and 710 optionally interoperate via the communication of data between millimeter wave transceivers 702 to perform a function associated with the device.

The circuits 704, 706, 708 and 710 are powered via power supply lines 720 and 722 that supply at least one power supply signal to the plurality of circuits. While the power supply signals are represented by Vdd and Vss, these power supply signals can be a DC voltage and ground or other voltage and current signals used to supply power via one or more power supply lines to the circuits 704, 706, 708 and 710. In an embodiment of the present invention, the at least one power supply line includes a plurality of antenna elements to facilitate the communicating of data between the plurality of circuits via the millimeter wave RF signaling.

In the circuit shown, power supply line 720 includes section 750, 752, 754 and 756 that each operate as an antenna element to one of the millimeter wave transceivers 702. In operation, the inductors 730, 732, 734, 736, 738, 740, 742, etc., isolate the antenna elements from one another. In particular, at the frequencies of the millimeter wave band, the inductors provide a high impedance that isolates an antenna element from a neighboring antenna element. However, the inductors provide a current flow at low frequencies and DC operation to maintain each of the power supply signals to each of the circuits 704, 706, 708 and 710.

In an embodiment of the present invention, each of the antenna elements 750, 752, 754 and 756 is of a similar length and is sized to operate as a one-quarter wavelength or one-half wavelength monopole antenna. However, other antenna configurations are likewise possible including the implementation of one or more dipole antenna, helical antennas, polarized antennas or other antenna structures.

In an embodiment of the present invention, one or more of the circuits 704, 706, 708 and/or 710 can include or operate as an RF bus controller, such as an RF bud controller described in conjunction with FIGS. 82-88, to mediate access to millimeter wave signaling used for communication between each of the circuits. In particular, each of the circuits 704, 706, 708 and 710 can operate in accordance with a shared access protocol that controls transmission by the plurality of millimeter wave interfaces to mitigate potential interference between these circuits. Further, while discussed above in terms of intra-chip communications, one or more of the millimeter wave transceivers can further operate to engage in communication of data with a remote device, such as a separate integrated circuit or entirely separate device. In these circumstances, the RF bus controller can further operate to mediate the communication of data with the remote device, in addition to the intra-chip communications described above.

Figure 72:
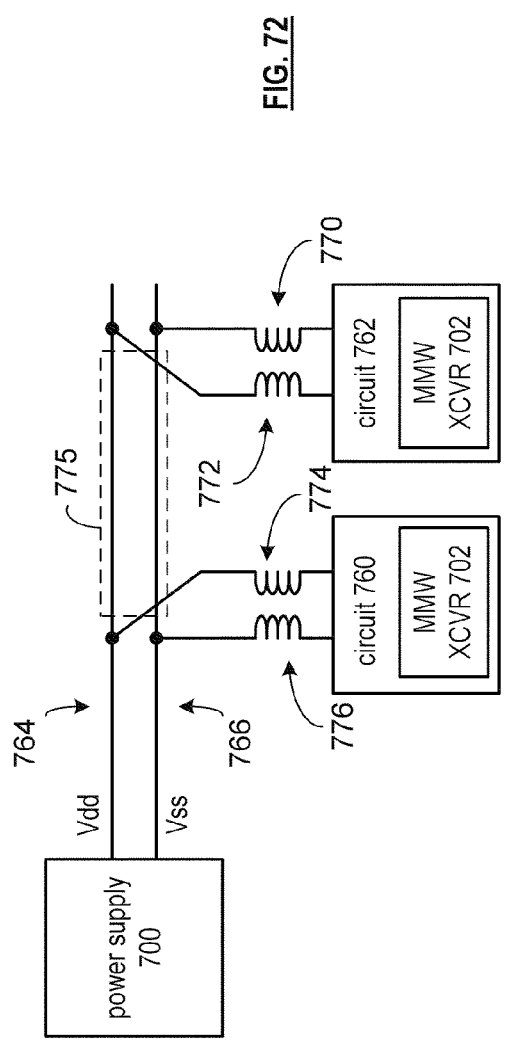
FIG. 72 is a schematic block diagram of an embodiment of a waveguide structure based on power supply lines in accordance with the present invention.

FIG. 72 is a schematic block diagram of an embodiment of a waveguide structure based on power supply lines in accordance with the present invention. In particular, a plurality of circuits 760 and 762 of an integrated circuit each include a millimeter wave interface, such as millimeter wave transceiver 702, for communicating data between the plurality of circuits 760, 762 via millimeter wave RF signaling. The integrated circuit may be a component of a personal computer, a laptop computer, a hand held computer, a wireless local area network (WLAN) access point, a WLAN station, a cellular telephone, an audio entertainment device, a video entertainment device, a video game control and/or console, a radio, a cordless telephone, a cable set top box, a satellite receiver, network infrastructure equipment, a cellular telephone base station, Bluetooth head set or other device. In operation, the circuits 760 and 762 optionally interoperate via the communication of data between millimeter wave transceivers 702 to perform a function associated with the device.

The circuits 760 and 762 are powered via power supply lines 764 and 766 that supply at least one power supply signal to the plurality of circuits. While the power supply signals are represented by Vdd and Vss, these power supply signals can be a DC voltage and ground or other voltage and current signals used to supply power via one or more power supply lines to the circuits 760 and 762. In an embodiment of the present invention, the power supply lines 764 and 766 form a waveguide 775 to facilitate the communicating of data between the plurality of circuits via the millimeter wave RF signaling. In the circuit shown, the inductors 770, 772, 774 and 776 couple the circuits 760 and 762 and their millimeter wave interfaces to the waveguide 775. The inductors provide a current flow at low frequencies and DC operation to maintain each of the power supply signals to each of the circuits 760 and 762.

In an embodiment of the present invention, particularly when additional circuits are coupled to the waveguide 775, one or more of the circuits 760 and 762 can include or operate as an RF bus controller, such as described in conjunction with FIGS. 82-88 to mediate access to millimeter wave signaling used for communication between each of the circuits. In particular, each of the circuits 760 and 762 can operate in accordance with a shared access protocol that controls transmission by the plurality of millimeter wave interfaces to mitigate potential interference between these circuits. Further, while discussed above in terms of intra-chip communications, one or more of the millimeter wave transceivers can further operate to engage in communication of data with a remote device, such as a separate integrated circuit or entirely separate device. In these circumstances, the RF bus controller can further operate to mediate the communication of data with the remote device, in addition to the intra-chip communications described above.

Figure 73:
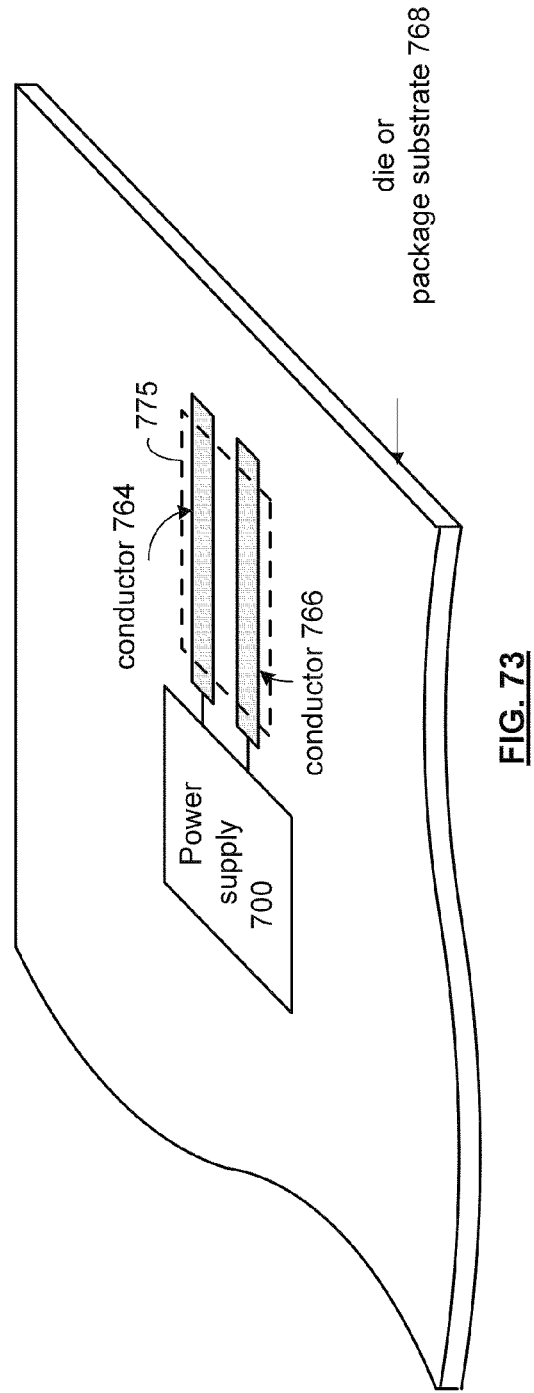
FIG. 73 is a schematic block diagram of another embodiment of a waveguide structure based on power supply lines in accordance with the present invention.

FIG. 73 is a schematic block diagram of another embodiment of a waveguide structure based on power supply lines in accordance with the present invention. In particular similar elements from FIG. 72 are referred to by common reference numerals. Conductors 784 and 786, such as power supply lines 764 and 766, are formed of metallic traces, strips or other conductive elements to form waveguide 775 on a die or package substrate 768. While not expressly shown, the conductors 784 and 786 are coupled to a plurality of circuits 760, 762, etc. to provide power to these circuits as well as a millimeter wave communication path.

Figure 74:
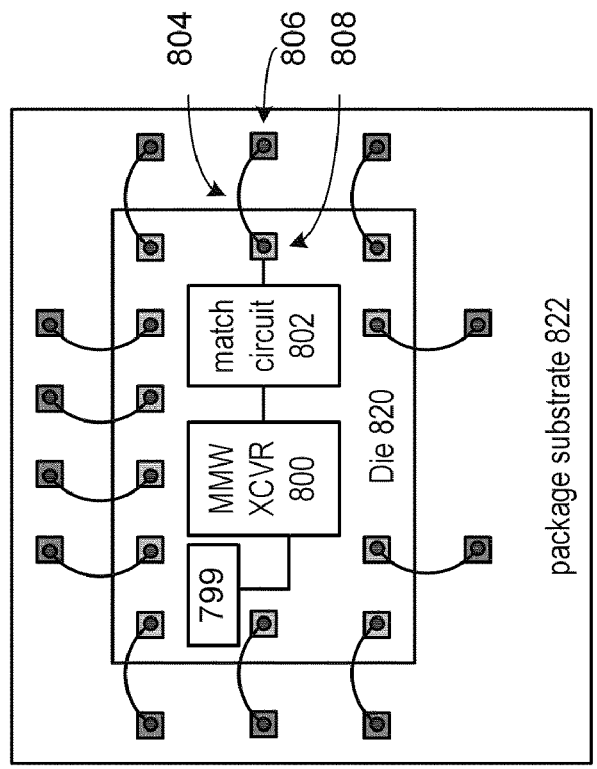
FIG. 74 is a schematic block diagram of an embodiment of an antenna structure based on bonding wires in accordance with the present invention.

FIG. 74 is a schematic block diagram of an embodiment of an antenna structure based on bonding wires in accordance with the present invention. In particular, an integrated circuit is presented that includes a die 820 supported by a package substrate 822. The package substrate 822 includes a plurality of bonding pads such as bonding pad 806 that are coupled to pads, balls, pins or other couplers for connecting the integrated circuit to other devices. In turn, each of the bonding pads is coupled to one or more bonding wires that connect to bonding pads of die 820, such as bonding pad 808. The die 820 includes a circuit 799, coupled to one of the bonding pads of die 820 that performs one or more functions associated with the integrated circuit. Millimeter wave transceiver 800 communicates via millimeter wave RF signaling with other devices via an antenna section formed via at least one bonding wire 804. Match circuit 802 provides impedance matching between the antenna 804 and the millimeter wave transceiver 800.

The integrated circuit may be a component of a personal computer, a laptop computer, a hand held computer, a wireless local area network (WLAN) access point, a WLAN station, a cellular telephone, an audio entertainment device, a video entertainment device, a video game control and/or console, a radio, a cordless telephone, a cable set top box, a satellite receiver, network infrastructure equipment, a cellular telephone base station, Bluetooth head set or other device.

In operation, the circuit 799 communicates data between millimeter wave transceivers 800 and another device to perform a function associated with the integrated circuit. The millimeter wave transceiver 800 includes a millimeter wave receiver for receiving a first millimeter wave RF signal from the remote device and a millimeter wave transmitter for transmitting a second millimeter wave signal to the remote device.

While not shown, one or more inductors can be includes in bonding wire 804 or in series with bonding wire 804 to isolate the millimeter wave RF signals produced by millimeter wave transceiver 800 from the bonding pad 806.

The bonding wire 804 can be sized to a length that is substantially one-quarter of the wavelength of the millimeter wave RF signaling, one-half of the wavelength of the millimeter wave RF signaling, or to another size. While the antenna is shown as being formed of a single bonding wire 804, more complex configurations with multiple bonding wires can be used in implementing dipole antennas, polarized antennas, helical antennas, antenna elements of element of an antenna array, a phased array antenna system or other beam forming antenna or beam steering antenna system.

Figure 75:
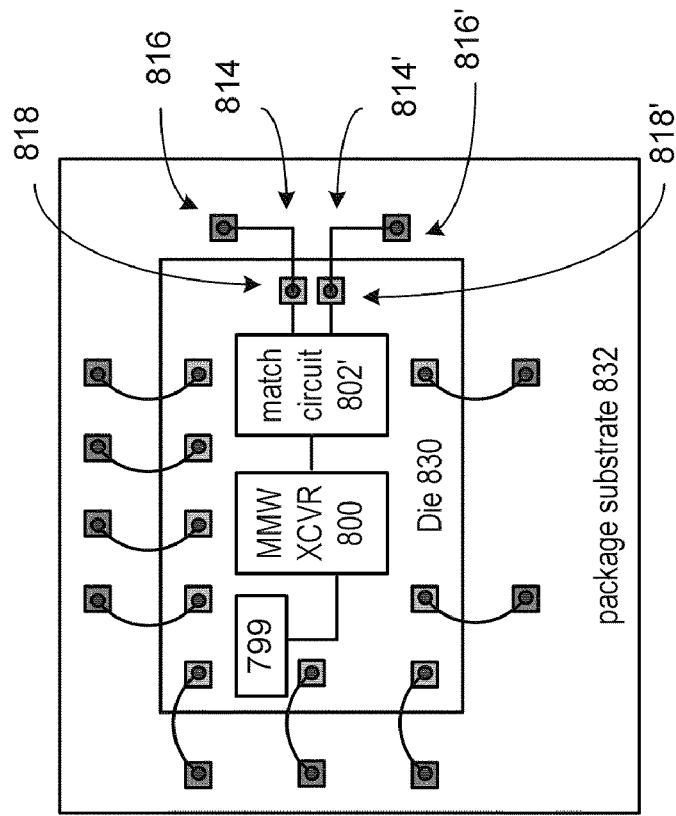
FIG. 75 is a schematic block diagram of another embodiment of an antenna structure based on bonding wires in accordance with the present invention.

FIG. 75 is a schematic block diagram of another embodiment of an antenna structure based on bonding wires in accordance with the present invention. In particular, a integrated circuit formed by die 830 and substrate 832 is shown that is similar to the integrated circuit formed by die 820 and substrate 822. In this configuration however, a dipole antenna is presented that is formed by bonding wires 814 and 814' that couple the substrate bond pads 816 and 816' to the die bond pads 818 and 818'. The use of a plurality of antenna elements can provide different beam patterns, different polarizations and greater antenna gain.

Figure 76:
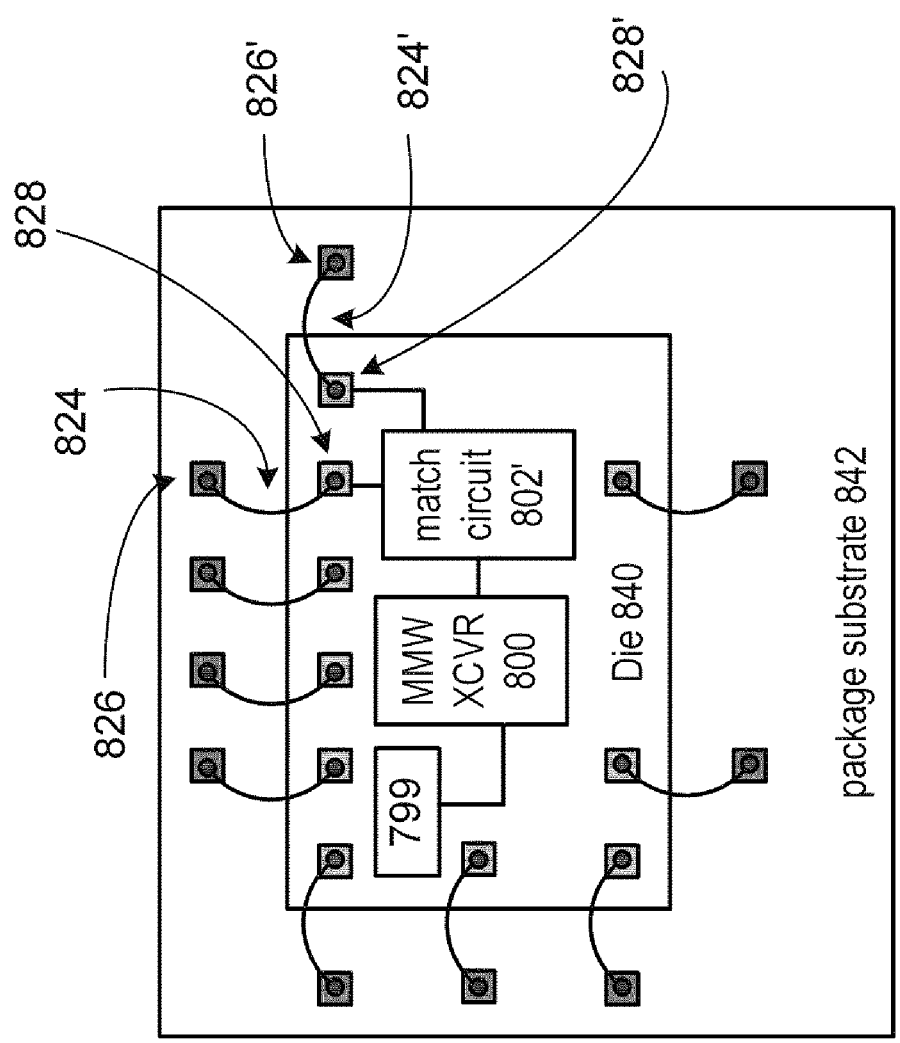
FIG. 76 is a schematic block diagram of another embodiment of an antenna structure based on bonding wires in accordance with the present invention.

FIG. 76 is a schematic block diagram of another embodiment of an antenna structure based on bonding wires in accordance with the present invention. In particular, an integrated circuit formed by die 840 and substrate 842 is shown that is similar to the integrated circuits formed by die 820 and substrate 822, and die 830 and substrate 832. In this configuration however, a polarized antenna is presented that is formed by bonding wires 824 and 824' that couple the substrate bond pads 826 and 826' to the die bond pads 828 and 828'.

Figure 77:
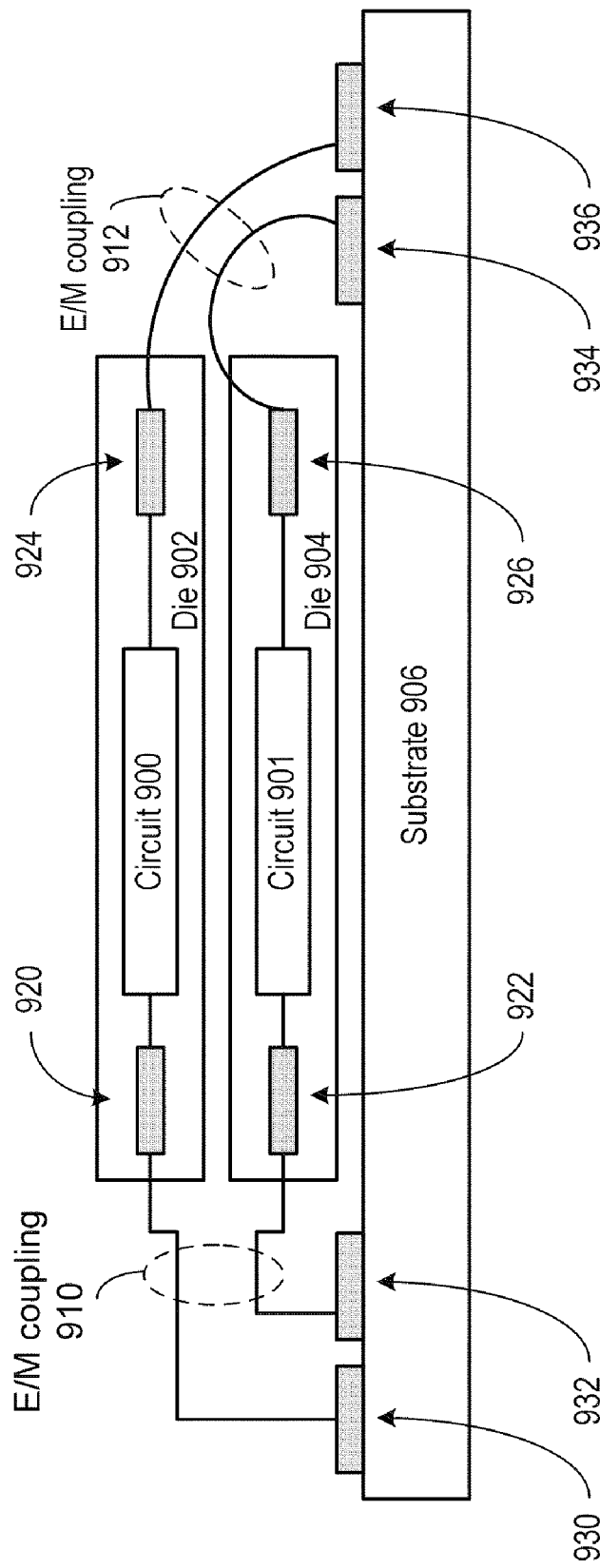
FIG. 77 is a schematic block diagram of another embodiment of an antenna structure based on bonding wires in accordance with the present invention.

FIG. 77 is a schematic block diagram of another embodiment of an antenna structure based on bonding wires in accordance with the present invention. In particular, an integrated circuit is shown that includes a substrate 906, an integrated circuit die 902 having a circuit 900 coupled to the substrate 906 via a bonding wire between bonding pads 920 and 930 and a bonding wire between bonding pads 924 and 936. The circuit 900 includes an intra-chip interface such as a millimeter wave transceiver 800 and matching circuit 822 for facilitating intrachip communication via millimeter wave signaling. Integrated circuit die 904 includes a circuit 901 coupled to the substrate 906 via a bonding wire between bonding pads 922 and 932 and a bonding wire between bonding pads 926 and 934. The circuit 901 also includes an intra-chip interface such as a millimeter wave transceiver for facilitating intrachip communication via millimeter wave signaling.

While the bonding wires can couple signals between the circuits 900 and 901 and external devices via one or more pads, balls, pins, etc; circuit 900 communicates with circuit 901 via their intra-chip interfaces. Further, the intra-chip interfaces communicate via electromagnetic couplings 910 and/or 912 between the bonding wires. Thus, while the bonding wires are electrically isolated from one another and not in electrical contact, communication between pairs of bonding wires can be established via indicate coupling, capacitive coupling or far field RF coupling.

In an embodiment of the present invention, one such electromagnetic coupling 910 and/or 912 can be an inductive or magnetic coupling formed by the mutual inductance between bonding wires. In this mode of operation, the bonding wires operate as a transformer to pass signals between circuits 900 and 901. In another embodiment of the present invention, the electromagnetic coupling 910 and/or 912 can be implemented via RF millimeter wave coupling where the bonding wires are operating as far field antennas. In a further mode of operation, the electromagnetic coupling 910 and/or 912 can be a capacitive coupling between closely spaced bonding wires.

It should be noted that different methods of electromagnetic coupling can be used in implementing electromagnetic couplings 910 and 912 for operation at different frequencies, in different interference conditions, based on a desired level of RF emissions from the integrated circuit, or for redundancy, increased reliability or for security. In an embodiment of the present invention, an intra-chip interface of circuit 900 and/or 901 initiates a first trial communication via one electromagnetic coupling (910 or 912) in a first mode of operation and a second trial communication via the second electromagnetic coupling (the other of 910 or 912) in a second mode of operation. The intra-chip interface then selects one of either the first mode of operation or the second mode of operation, based on first results of the first trial communication and second results of the second trial communication.

While the integrated circuit of FIG. 77 is shown with two such dies 902 and 904, a greater number of dies may be similarly implemented. Further, while each die (902, 904) is shown with two such electromagnetic couplings, a greater number of electromagnetic couplings can likewise be implemented on a single die.

Figure 78:
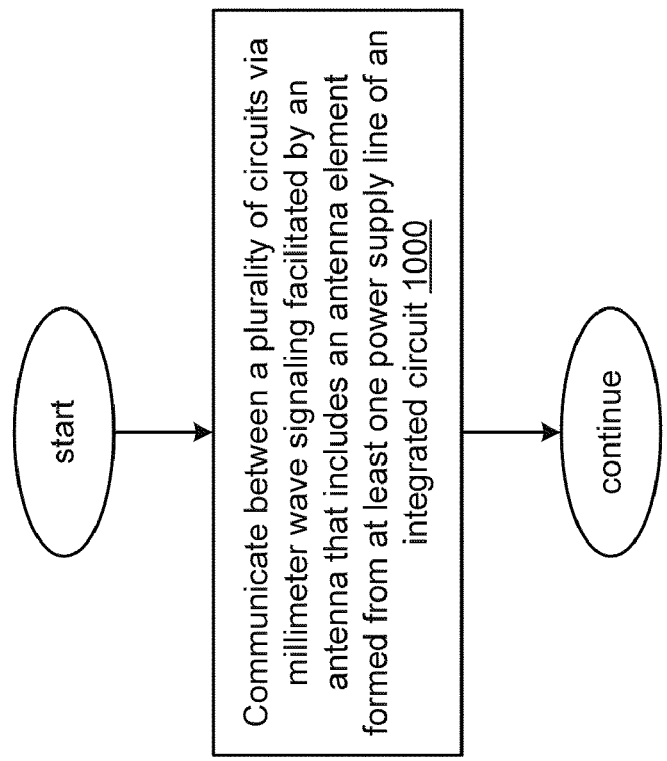
FIG. 78 is a flow chart diagram of a method in accordance with the present invention.

FIG. 78 is a flow chart diagram of a method in accordance with the present invention. In particular, a method is shown for use in conjunction with one or more of the functions and features described in conjunction with FIGS. 1-77. Step 1000 presents communicating between the plurality of circuits of an integrated circuit via millimeter wave RF signaling facilitated by an antenna that includes an antenna element formed from at least one power supply line of the integrated circuit.

Figure 79:
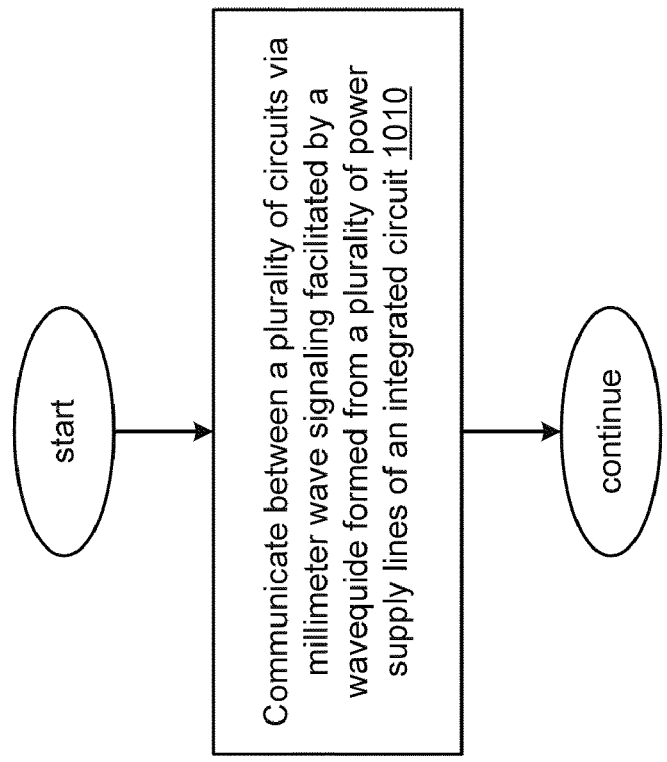
FIG. 79 is a flow chart diagram of a method in accordance with the present invention.

FIG. 79 is a flow chart diagram of a method in accordance with the present invention. In particular, a method is shown for use in conjunction with one or more of the functions and features described in conjunction with FIGS. 1-78. Step 1010 presents communicating between a plurality of circuits of an integrated circuit via millimeter wave RF signaling facilitated by a waveguide formed from a plurality of power supply lines of the integrated circuit.

Figure 80:
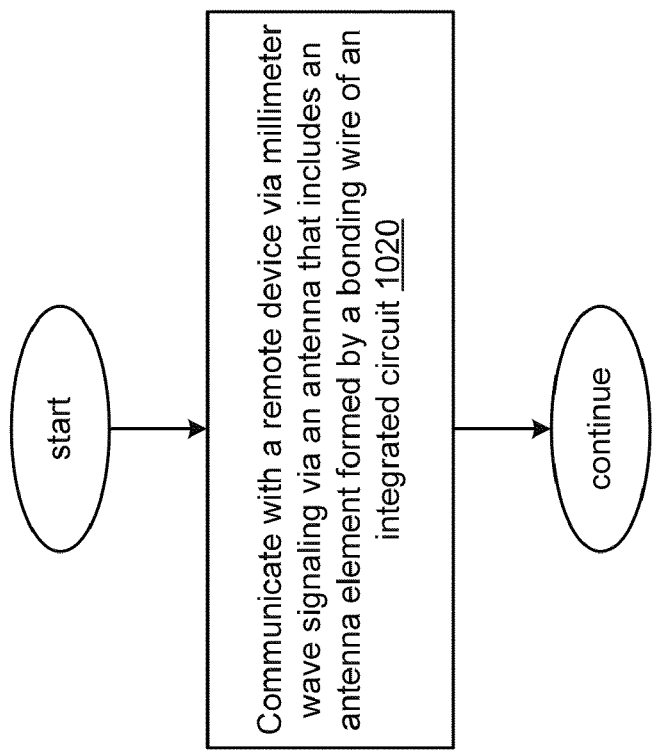
FIG. 80 is a flow chart diagram of a method in accordance with the present invention.

FIG. 80 is a flow chart diagram of a method in accordance with the present invention. In particular, a method is shown for use in conjunction with one or more of the functions and features described in conjunction with FIGS. 1-79. Step 1020 presents communicating with a remote device via millimeter wave RF signaling via an antenna that includes an antenna element formed by a bonding wire of an integrated circuit.

Figure 81:
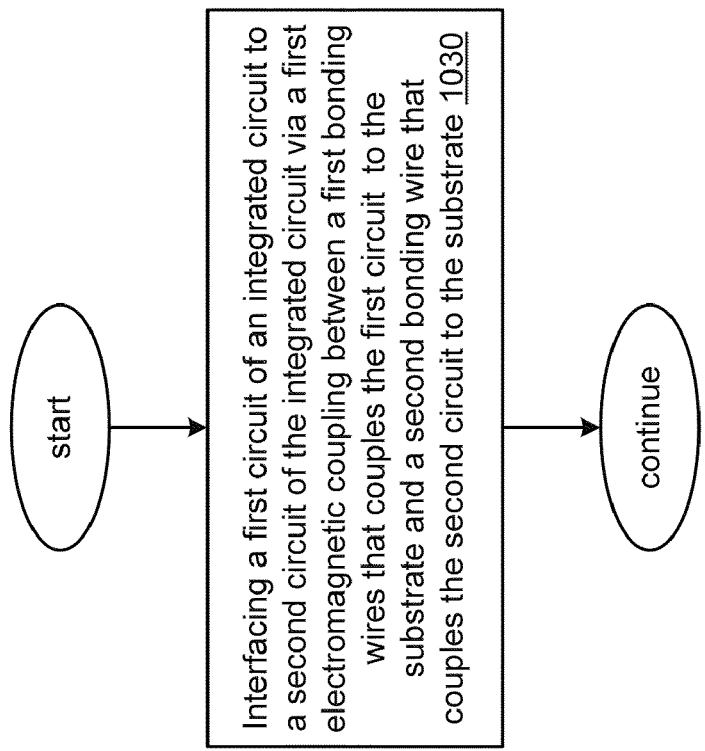
FIG. 81 is a flow chart diagram of a method in accordance with the present invention.

FIG. 81 is a flow chart diagram of a method in accordance with the present invention. In particular, a method is shown for use in conjunction with one or more of the functions and features described in conjunction with FIGS. 1-80. In step 1030, a first circuit of a first integrated circuit die is interfaced to a second circuit of a second integrated circuit via a first electromagnetic coupling between a first bonding wire that couples the first circuit to the substrate and a second bonding wire that couples the second circuit to the substrate, wherein the second bonding wire is electrically isolated from the first bonding wire.

In an embodiment of the present invention, the first electromagnetic coupling includes an inductive coupling, capacitive coupling, or millimeter wave RF coupling between the first bonding wire and the second bonding wire. Step 1030 can include, in a first mode of operation, communicating via an RF millimeter wave coupling between the first bonding wire and the second bonding wire; and in a second mode of operation, communicating via a capacitive coupling between the first bonding wire and the second bonding wire. Step 1030 can include initiating a first trial communication via the first mode of operation and a second trial communication via the second mode of operation and selecting one of: the first mode of operation, and the second mode of operation, based on first results of the first trial communication and second results of the second trial communication.

Step 1030 can include, in a first mode of operation, communicating via an RF millimeter wave coupling between the first bonding wire and the second bonding wire; and in a second mode of operation, communicating via an inductive coupling between the first bonding wire and the second bonding wire. Step 1030 can include, in a first mode of operation, communicating via an inductive coupling between the first bonding wire and the second bonding wire; and in a second mode of operation, communicating via a capacitive coupling between the first bonding wire and the second bonding wire.

When the first circuit is further coupled to the substrate via a third bonding wire, the second circuit is further coupled to the substrate via a fourth bonding wire, and the fourth bonding wire is electrically isolated from the third bonding wire; Step 1030 can further include communicating via a second electromagnetic coupling between the third bonding wire and the fourth bonding wire. The first electromagnetic coupling can be via one of: an inductive coupling, a capacitive coupling, and a millimeter wave RF coupling and the second electromagnetic coupling can also be via one of: an inductive coupling, a capacitive coupling, and a millimeter wave RF coupling. The first electromagnetic coupling may or may not differ from the second electromagnetic coupling.

Figure 82:
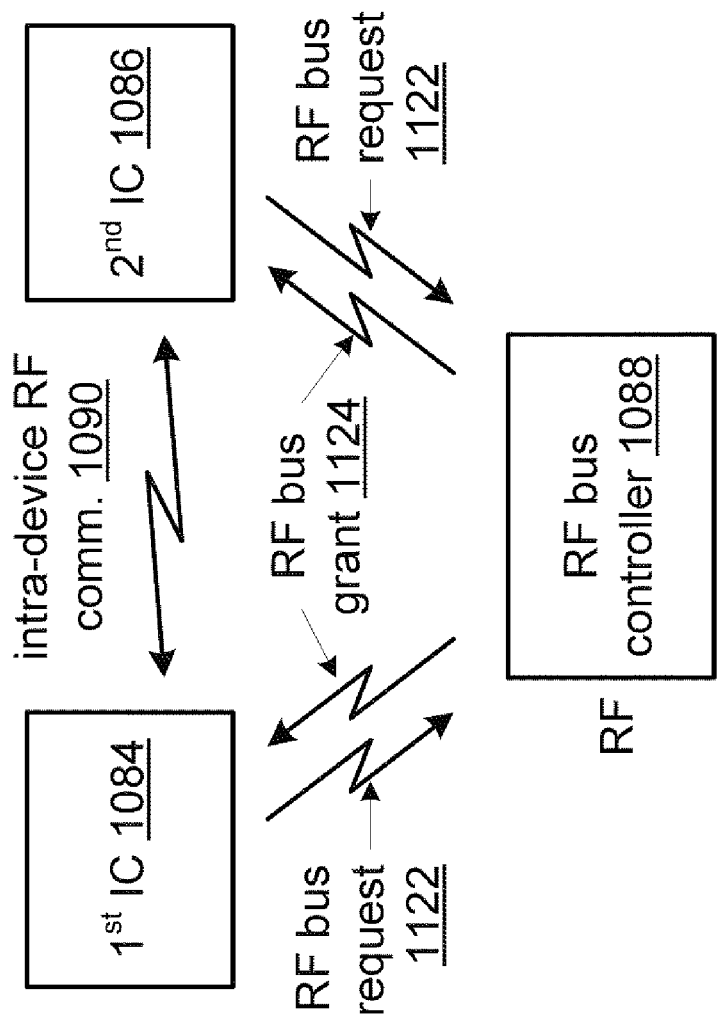

FIG. 82 is a schematic block diagram of an embodiment of an RF bus that can be used in conjunction with the devices and methods described in conjunction with FIGS. 1-81. The RF bus interfaces a plurality of integrated circuits and or integrated circuit dies 1084, and 1086, and includes an RF bus controller 1088. For example, the ICs 1084, 1086, can be any of the ICs or IC dies that include an inductive interface such as inductive interface 22, 26, or 62, and/or that include a millimeter wave interface such as millimeter wave interfaces 46 and 48. ICs 1084 and 1086 each include a circuit such as a microprocessor, microcontroller, digital signal processor, programmable logic circuit, memory, application specific integrated circuit (ASIC), analog to digital converter (ADC), digital to analog converter (DAC), digital logic circuitry, analog circuitry, graphics processor, or other analog or digital circuit.

In this embodiment, IC 1084 includes a first radio frequency (RF) bus transceiver 1108 and IC 1086 includes a second RF bus transceiver 1110 to support intra-device RF communications 1090 therebetween. The intra-device RF communications 1090 may be RF data communications, RF instruction communications, RF control signal communications, and/or RF input/output communications that are transmitted via near-field communications, magnetic communications and/or millimeter wave communications. For example, data, control, operational instructions, and/or input/output signals (e.g., analog input signals, analog output signals, digital input signals, digital output signals) that are traditionally conveyed between ICs via traces on a printed circuit board are, in millimeter wave interface 1080 transmitted via the intra-device RF communications 1090. It should be noted that ICs 1084 and 1086 can include multiple RF buses that operate in different frequency bands and/or with different modes of communications such as near-field communication, millimeter wave communication and magnetic communication. These multiple buses can operate separately or part of a multi-bus architecture.

The intra-device RF communications 1090 may also include operating system level communications and application level communications. The operating system level communications are communications that correspond to resource management of the millimeter wave interface 1080 loading and executing applications (e.g., a program or algorithm), multitasking of applications, protection between applications, device start-up, interfacing with a user of the millimeter wave interface 1080 etc. The application level communications are communications that correspond to the data conveyed, operational instructions conveyed, and/or control signals conveyed during execution of an application.

In an embodiment of the present invention the RF bus operates in accordance with a shared access/multi-access protocol such as a time division multiple access protocol, a frequency division multiple access protocol, random access protocol and a code division multiple access protocol. The RF bus controller 1088 is coupled to control the intra-device RF communications 1090 between the first and second RF bus transceivers 1108, 1110. The RF bus controller 1088 may be a separate IC or it may be included in one of the ICs 1084, 1086. In operation, the RF bus controller arbitrates access to the RF bus. In an embodiment of the present invention, the RF bus controller is operable to receive an RF bus access request, determine RF bus resource availability, determine when sufficient RF bus resources are available, and allocate at least one RF bus resource when sufficient RF bus resources are available. Also, the RF bus controller can optionally poll the plurality of inductive interfaces, and allocate at least one RF bus resource in response to poll. Further, the RF bus controller can optionally receive a request to reserve at least one RF bus resource from one of the plurality of inductive interfaces, and reserve one or more RF bus resources in response to the request.

In this embodiment, the intra-device RF communications 1090 occur over a free-space RF communication path. In other words, the intra-device RF communications 1090 are conveyed via the air. In another embodiment, the intra-device RF communications 1090 can occur via a waveguide RF communication path that, for instance, may be formed in a micro-electromechanical (MEM) area of the supporting substrate. In yet another embodiment, a dielectric layer can provide a dielectric RF communication path for the intra-device RF communications 1090.

In an embodiment of present invention the RF bus controller 1088 further functions to select a communication path or communication as well as the particular communications mode based on at least one aspect of one of the intra-device RF communications. For example, high data rate and/or non-error tolerant communications (e.g., operating system level communications) may occur over the waveguide RF communication path, while lower data rate and/or error tolerant communications (e.g., some portions of application level communications) may occur over the free-space RF communication path. As another example, the aspect on which the RF communication path is selected may be user defined, operating system level defined, and/or pre-programmed into the device. As yet another example, the aspect may correspond to the IC initiating an intra-device RF communication and/or the IC receiving it. As a further example, the aspect may correspond to the number of intra-device RF communications 1090 an IC currently has in progress.

Further functions and features of the RF bus controller 1088 will be described in greater detail with reference to the figures that follow.

FIG. 83 is a schematic block diagram of an embodiment of an RF interface 1080 that interfaces the ICs 1084, 1086 and includes the RF bus controller 1088. In this embodiment, the RF bus controller 1088 includes an RF bus transceiver 1130, IC 1084 includes a circuit module 1132 and the RF bus transceiver 1108, and IC 1086 includes a circuit module 1134 and the RF bus transceiver 1110. The circuit modules 1132, 1134 may be any type of digital circuit, analog circuit, logic circuit, and/or processing circuit. For example, one of the circuit modules 1132, 1134 may be, but is not limited to, a microprocessor, a component of a microprocessor, cache memory, read only memory, random access memory, programmable logic, digital signal processor, logic gate, amplifier, multiplier, adder, multiplexor, etc.

In this embodiment, the inter-device RF communication 1090, RF bus requests 1122, and the RF bus grants 1124 occur within the same frequency spectrum. To minimize interference between the obtaining access to the RF bus and using the RF bus for the inter-device RF communications 1090, the bus controller 1088 controls access to the frequency spectrum by allocating at least one communication slot per frame to the wireless interface and allocating at least one other communication slot per frame for the intra-device RF communications. The communication slots may be time division multiple access (TDMA) slots within a TDMA frame, frequency division multiple access (FDMA) slots of an FDMA frame, and/or code division multiple access (CDMA) slots of a CDMA frame. Note that in this embodiment, frame is equivalent to a packet.

FIG. 84 is a diagram of an example of a frame of obtaining access to an RF Bus. The frame, or packet, includes a controller inquiry field 1140, an IC response control field or fields 1142, a resource allocation field or fields 1144, and a data field or fields 1146. The RF bus controller uses the controller inquiry field 1140 to determine whether one or more ICs have an up-coming need to access the RF bus. In one embodiment, the RF bus controller 1088 addresses a single IC per frame as to whether the IC has an up-coming need for the RF bus. In another embodiment, the RF bus controller 1088 addresses two or more ICs as to whether they have an up-coming need for the RF bus. The RF bus controller 1088 may be use a polling mechanism to address the ICs, which indicates how and when to response to the polling inquiry.

The ICs 1084, 1086 respond to the RF bus controller's query in the IC response control field or fields 1142. In one embodiment, the ICs share a single IC response control field using a carrier sense multiple access (CSMA) with collision avoidance technique, using pre-assigned sub-slots, using a round robin technique, using a poll-respond technique, etc. In another embodiment, the ICs have their own IC response control field 1142. In either embodiment, the ICs 1084, 1086 response includes an indication of whether it has data to convey via the RF bus, how much data to convey, the nature of the data (e.g., application data, application instructions, operating system level data and/or instructions, etc.), the target or targets of the data, a priority level of the requestor, a priority level of the data, data integrity requirements, and/or any other information relating to the conveyance of the data via the RF bus.

The RF bus controller 1088 uses the resource allocation field or fields 1144 to grant access to the RF bus to one or more ICs 1084, 1086. In one embodiment, the RF bus controller 1088 uses a single field to respond to one or more ICs. In another embodiment, the RF bus controller 1088 responds to the ICs in separate resource allocation fields 1144. In either embodiment, the RF bus grant 1144 indicates when, how, and for how long the IC has access to the RF bus during the one or more data fields 1146. Various embodiments of requesting and obtaining access to the RF bus and transceiving via the RF bus will be described in greater detail with reference to the Figures that follow.

Figure 85:
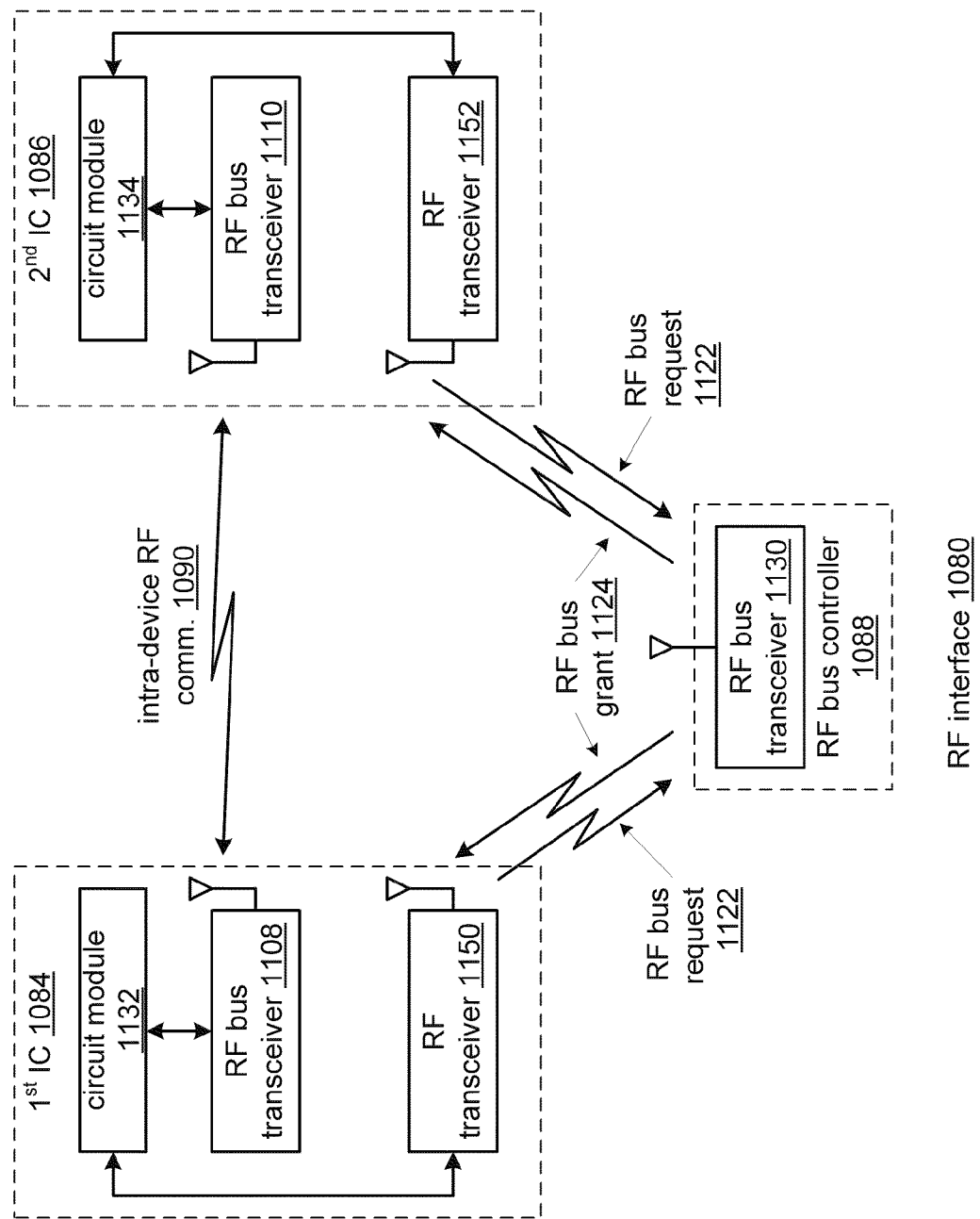
FIGS. 85-88 are schematic block diagrams of other embodiments of a device in accordance with the present invention.

FIG. 85 is a schematic block diagram of another embodiment of the RF interface 1080 that interfaces the ICs 1084, 1086 and includes the RF bus controller 1088. In this embodiment, the RF bus controller 1088 includes an RF bus transceiver 1130. IC 1084 includes the circuit module 1132 the RF bus transceiver 1108, and an RF transceiver 1160. IC 1086 includes the circuit module 1134, the RF bus transceiver 1110, and an RF transceiver 1152.

In this embodiment, the inter-device RF communications 1090 occur in a different frequency spectrum than the RF bus requests 1122 and the RF bus grants 1124. As such, they can occur simultaneously with minimal interference. In this manner, the RF bus requests 1122 and RF bus grants 1124 may be communicated using a CSMA with collision avoidance technique, a poll-response technique, allocated time slots of a TDMA frame, allocated frequency slots of an FDMA frame, and/or allocated code slots of a CDMA frame in one frequency spectrum or using one carrier frequency and the inter-device RF communications 1090 may use a CSMA with collision avoidance technique, a poll-response technique, allocated time slots of a TDMA frame, allocated frequency slots of an FDMA frame, and/or allocated code slots of a CDMA frame in another frequency spectrum or using another carrier frequency.

Figure 86:
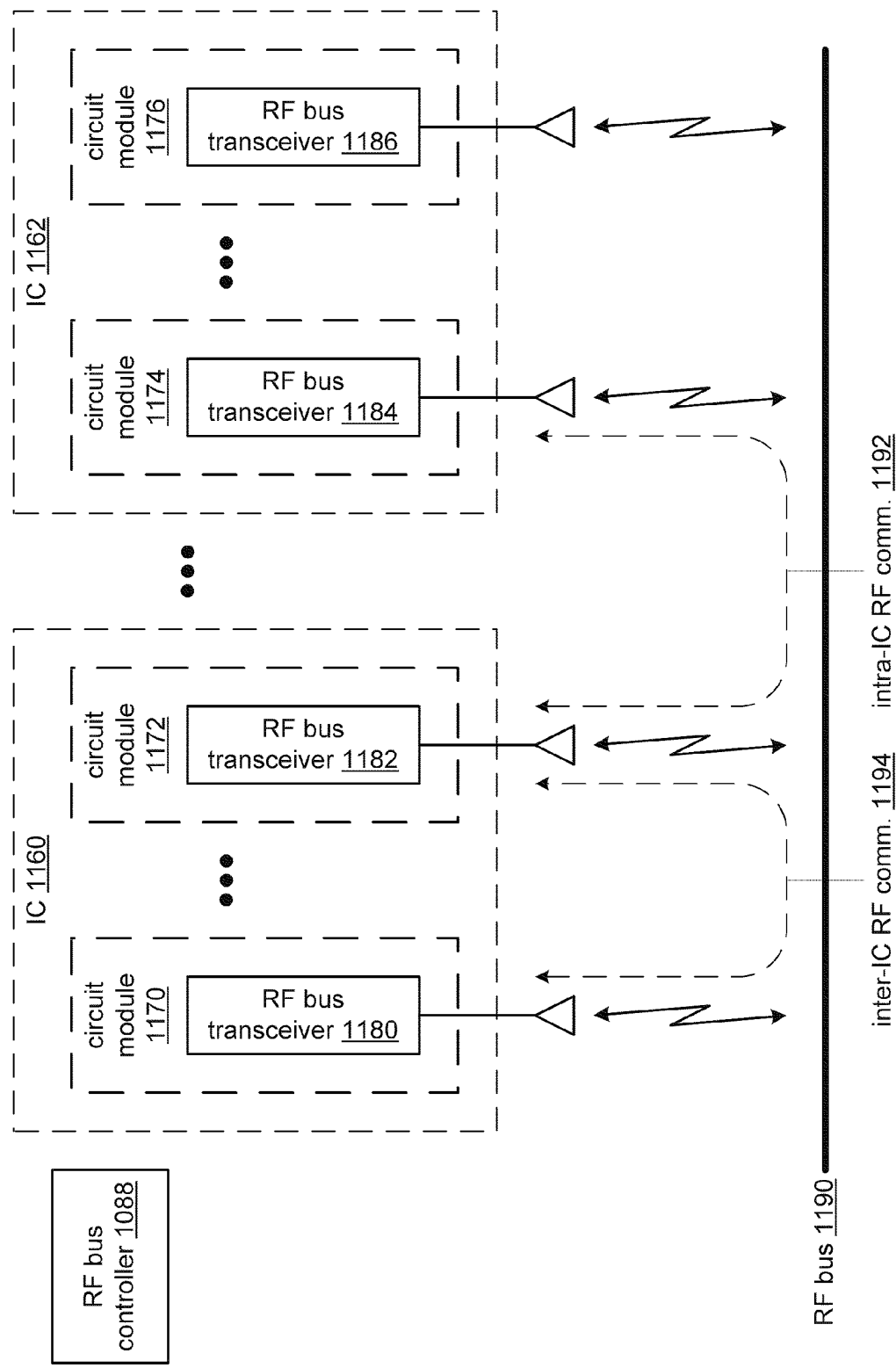

FIG. 86 is a schematic block diagram of another embodiment of the millimeter wave interface 1080 that interfaces a plurality of integrated circuits (ICs) 1160, 1162 and includes the RF bus controller 1088, and an RF bus 1190. Each of the ICs 1160, 1162 includes a plurality of circuit modules 1170-1176 and each of the circuit modules 1170-1176 includes a radio frequency (RF) bus transceiver 1180-1186. The circuit modules 1170-1176 may be any type of digital circuit, analog circuit, logic circuit, and/or processing circuit that can be implemented on an IC. For example, one of the circuit modules 1170-1176 may be, but is not limited to, a microprocessor, a component of a microprocessor, cache memory, read only memory, random access memory, programmable logic, digital signal processor, logic gate, amplifier, multiplier, adder, multiplexer, etc.

In this embodiment, the RF bus controller 1088, which may be a separate IC or contained with one of the ICs 1160-1162, controls intra-IC RF communications 1192 between circuit modules 1170-1176 of different ICs 1160, 1162 and controls inter-IC RF communications 1194 between circuit modules 1170-1172 or 1174-1176 of the same IC. In this manner, at least some of the communication between ICs and between circuit modules of an IC is done wirelessly via the RF bus transceivers 1180-1186. Note that the circuit modules 1170-1172 may also be inter-coupled with one or more traces within the IC 1160, the circuit modules 1174-1176 may also be inter-coupled with one or more traces within the IC 1162, and that IC 1160 may be coupled to IC 1162 via one or more traces on a supporting substrate (e.g., a printed circuit board).

The intra-IC RF communications 1192 and the inter-IC RF communications 1194 may be RF data communications, RF instruction communications, RF control signal communications, and/or RF input/output communications. For example, data, control, operational instructions, and/or input/output communications (e.g., analog input signals, analog output signals, digital input signals, digital output signals) that are traditionally conveyed between ICs via traces on a printed circuit board are at least partially transmitted by the RF bus transceivers 1180-1186 via the RF bus 1190.

The intra-IC RF communications 1192 and/or the inter-IC RF communications 1194 may also include operating system level communications and application level communications. The operating system level communications are communications that correspond to resource management of the millimeter wave interface 1080 loading and executing applications (e.g., a program or algorithm), multitasking of applications, protection between applications, device start-up, interfacing with a user of the device, etc. The application level communications are communications that correspond to the data conveyed, operational instructions conveyed, and/or control signals conveyed during execution of an application.

The RF bus 1190 may be one or more of a free-space RF communication path 1096, a waveguide RF communication path 1098, and/or a dielectric RF communication path 1100. For example, the RF bus 1190 may include at least one data RF bus, at least one instruction RF bus, and at least one control RF bus for intra-IC RF communications 1192 and the inter-IC RF communications 1194. In this example, intra-IC RF data communications 1192 may occur over a free-space RF communication path 1096, while the intra-IC RF instruction and/or control communications 1192 may occur over a waveguide RF communication path 1098 and/or a dielectric RF communication path 1100 within the IC 1160 or 1162. Further, inter-IC RF data communications 1194 may occur over a free-space RF communication path, while the intra-IC RF instruction and/or control communications 1194 may occur over a waveguide RF communication path magnetic communication path and/or a dielectric RF communication path within a supporting substrate of the ICs 1160-1162. As an alternative example, the inter- and intra-IC communications 1192-1194 may occur over multiple waveguide RF communication paths, multiple dielectric RF communication paths, and/or multiple free-space RF communication paths (e.g., use different carrier frequencies, distributed frequency patterns, TDMA, FDMA, CDMA, etc.).

Figure 87:
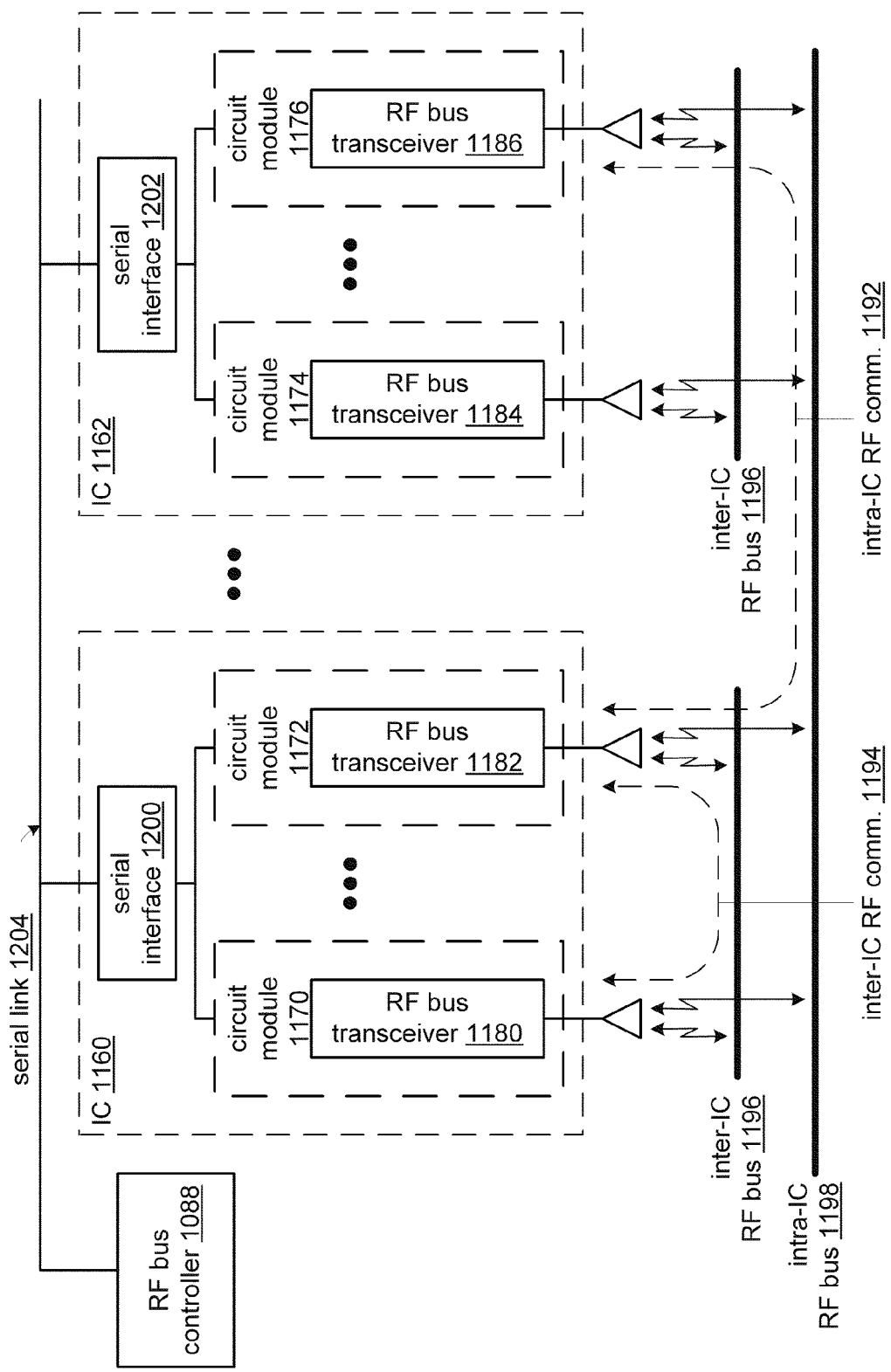

FIG. 87 is a schematic block diagram of another embodiment of the millimeter wave interface 1080 that interfaces a plurality of integrated circuits (ICs) 1160, 1162, and includes the RF bus controller 1088, a plurality of inter-IC RF buses 196, and an intra-IC RF bus 198. Each of the ICs 1160, 1162 includes a plurality of circuit modules 1170-1176 and a serial interface module 1200-1202. Each of the circuit modules 1170-1176 includes a radio frequency (RF) bus transceiver 1180-1186.

In this embodiment, the RF bus controller 1088 is coupled to the ICs 1160-1162 via a serial link 1204, such as a wireline link, to control access to the inter-IC RF buses 1196 and to the intra-IC RF bus 1198. For instance, when a circuit module 1170-1176 has data to transmit to another circuit module 1170-1176 of the same IC or of a different IC, the requesting circuit module 1170-1176 provides an RF bus request to the RF bus controller 1088 via the serial link 1204 and the corresponding serial interface module 200-202. The serial link 1204 and the corresponding serial interface modules 200-202 may be a standardized protocol, a de-facto standard protocol, or a proprietary protocol.

The RF bus controller 1088 processes the RF bus request, as will be described in greater detail with reference to figures that follow, to determine at least one of whether the requestor needs access to one of the plurality of inter-IC RF buses 1196 or to the intra-IC RF bus 1198, how much data it has to send, the type of the data, the location of the target circuit module(s), the priority of the requestor, the priority of the data, etc. When the RF bus controller 1088 has determined how and when the requestor is to access the RF bus 1196 and/or 1198, the RF bus controller 1088 provides an RF bus grant to the requestor via the serial link 1204.

As shown, the intra-IC RF bus 1198 supports intra-IC RF communications 1194 and the plurality of inter-IC RF buses 1196 support corresponding inter-IC RF communications 1192. In this manner, multiple inter-IC RF communications 1192 may be simultaneously occurring and may also occur simultaneously with one or more intra-IC RF communications 1194.

Figure 88:
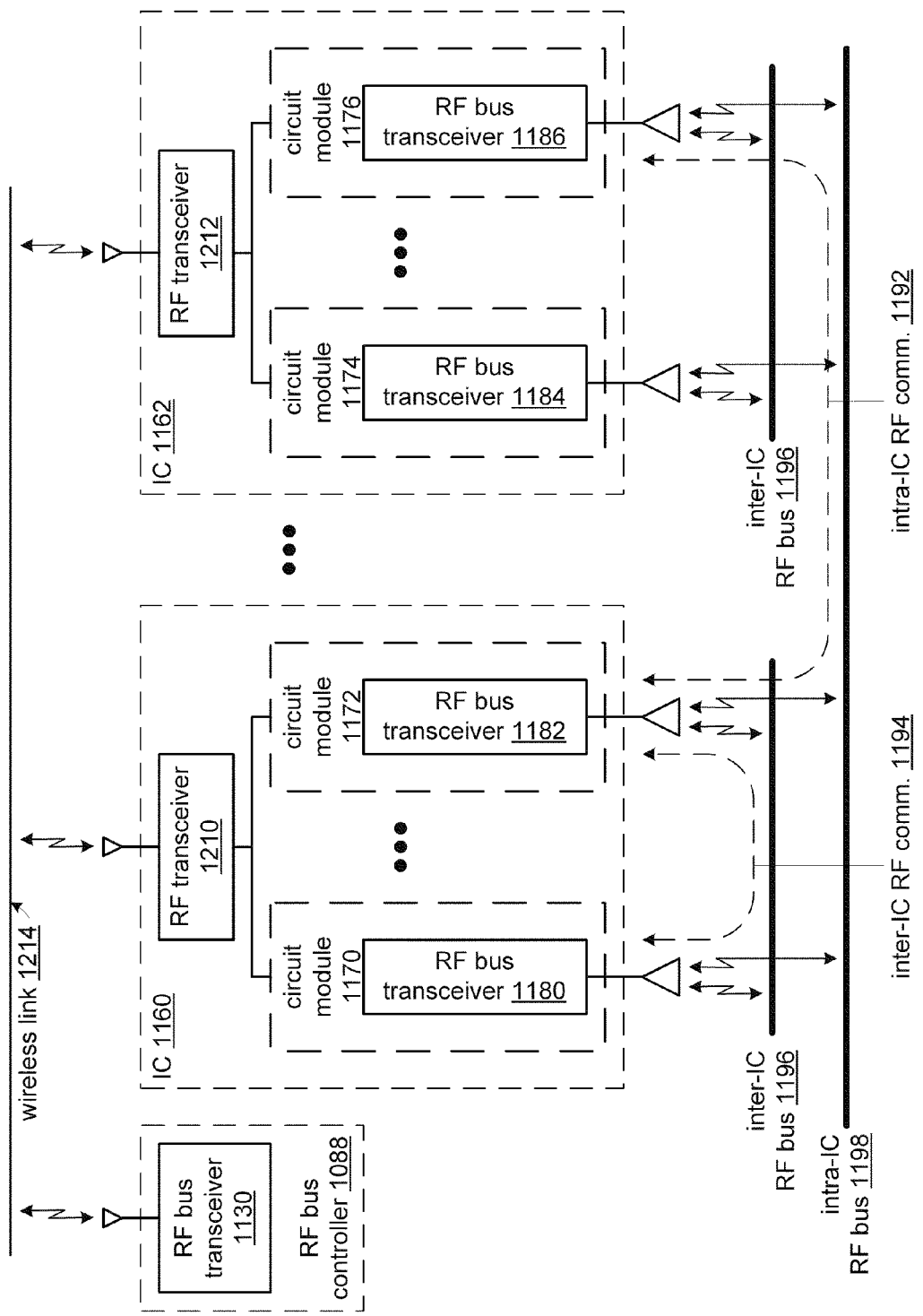

FIG. 88 is a schematic block diagram of another embodiment of RF interface 1080 that interfaces a plurality of integrated circuits (ICs) 1160, 1162, and includes the RF bus controller 1088, a plurality of inter-IC RF buses 1196, and an intra-IC RF bus 1198. Each of the ICs 1160, 1162 includes a plurality of circuit modules 1170-1176 and an RF transceiver 1210-1212 that can be implemented by any of the millimeter wave transceivers or other electromagnetic interfaces previously described. Each of the circuit modules 1170-1176 includes a radio frequency (RF) bus transceiver 1180-1186 and the RF bus controller 1088 includes the RF bus transceiver 1130.

In this embodiment, the RF bus controller 1088 is coupled to the ICs 1160-1162 via a wireless link 1214, such as an near field, far field, inductive, capacitive or other electromagnetic link to control access to the inter-IC RF buses 1196 and to the intra-IC RF bus 1198. For instance, when a circuit module 1170-1176 has data to transmit to another circuit module 1170-1176 of the same IC or of a different IC, the requesting circuit module 1170-1176 provides an RF bus request to the RF bus controller 1088 via the wireless link 1214 and the RF transceiver 1210-1212. The wireless link 1214 and the corresponding RF transceivers 1210-1212 may be a standardized protocol, a de-facto standard protocol, or a proprietary protocol.

The RF bus controller 1088 processes the RF bus request, as will be described in greater detail with reference to Figures that follow, to determine at least one of whether the requestor needs access to one of the plurality of inter-IC RF buses 1196 or to the intra-IC RF bus 1198, how much data it has to send, the type of the data, the location of the target circuit module(s), the priority of the requestor, the priority of the data, etc. When the RF bus controller 1088 has determined how and when the requestor is to access the RF bus 1196 and/or 1198, the RF bus controller 1088 provides an RF bus grant to the requestor via the wireless link 1214.

In one embodiment, the RF bus transceiver 1130 operates within a first frequency band and the intra-IC RF communications 1192 and the inter-IC RF communications 1194 occur within the first frequency band. In this instance, the RF bus controller 1088 allocates at least one communication slot to the wireless interface link 1214, allocates at least one other communication slot for the intra-IC RF communications 1192, and allocates at least another communication slot for the inter-IC RF communications 1194. The communication slots may be time division multiple access (TDMA) slots, frequency division multiple access (FDMA) slot, and/or code division multiple access (CDMA) slots.

In another embodiment, the RF bus transceiver 1130 operates within a first frequency band, the intra-IC RF communications 1192 occur within the first frequency band, and the inter-IC RF communications 1194 occur within a second frequency band. In this instance, the RF bus controller 1088 allocates at least one communication slot in the first frequency band to the wireless link 1214 and allocates at least one other communication slot in the first frequency band for the intra-IC RF communications 1192. The communication slots may be time division multiple access (TDMA) slots, frequency division multiple access (FDMA) slot, and/or code division multiple access (CDMA) slots.

In another embodiment, the RF bus transceiver 1130 operates within a first frequency band, the inter-IC RF communications 1194 occur within the second frequency band, and the intra-IC RF communications 1192 occur within the frequency band. In this instance, the RF bus controller 1088 allocates at least one communication slot in the second frequency band to the wireless link 1214 and allocates at least one other communication slot in the second frequency band for the inter-IC RF communications 1194. The communication slots may be time division multiple access (TDMA) slots, frequency division multiple access (FDMA) slot, and/or code division multiple access (CDMA) slots.

In another embodiment, the RF bus transceiver 1130 operates within a first frequency band, the intra-IC RF communications 1192 occur within the second frequency band, and the inter-IC RF communications 1194 occur within a third frequency band. With the different types of communication (e.g., RF bus access, inter-IC, and intra-IC) occurring within different frequency bands, the different types of communication may occur simultaneously with minimal interference from each other.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. An integrated circuit for use in an RFID tag, the integrated circuit comprising:
   an integrated circuit die including:
      a circuit that generates first data; and
      a radio frequency identification (RFID) interface, coupled to the circuit, for providing communication between the circuit and a remote RFID reader via RF signaling between the RFID interface and the remote RFID reader, wherein the RF signaling between the RFID interface and the remote RFID reader includes millimeter wave RF signals that carry the first data in a V-band range of frequencies;
   an antenna section, coupled to the integrated circuit die, for facilitating the RF signaling between the RFID interface and the remote RFID reader, wherein the antenna section includes at least one bonding wire that connects the integrated circuit die to couplers for electrically connecting the integrated circuit to at least one external device and further operates as at least a portion of the antenna section;
   a substrate coupled to support the first integrated circuit die and at least a portion of the antenna section.

2. The integrated circuit of claim 1 wherein the RF signaling between the RFID interface and the remote RFID reader includes reception of a millimeter wave RFID signal from the remote RFID reader and backscattering of the millimeter wave RFID signal by the RFID interface.

3. The integrated circuit of claim 1 wherein the at least one bonding wire includes:
   a first bonding wire that couples first signals between the circuit and the substrate; and
   a second bonding wire that couples second signals between the circuit and the substrate.

4. The integrated circuit of claim 1 wherein the at least one bonding wire further provides impedance matching to the RFID interface and the antenna section.

5. The integrated circuit of claim 1 wherein the at least one bonding wire further provides a transmission line.

6. The integrated circuit of claim 1 wherein the antenna section includes at least one power supply line for coupling power to the integrated circuit from a direct current power source and that further operates as at least a portion of an antenna.

7. The integrated circuit of claim 6 wherein the at least one power supply line includes:
   a first power supply line for coupling a power signal to the circuit; and
   a second power supply line for coupling the power signal to the circuit.

8. The integrated circuit of claim 7 wherein the at least one power supply line further provides impedance matching to the RFID interface and the antenna section.

9. The integrated circuit of claim 7 wherein the at least one power supply line further provides a transmission line.

10. An integrated circuit for use in an RFID tag, the integrated circuit comprising:
    an integrated circuit die including:
       a circuit; and
       a radio frequency identification (RFID) interface, coupled to the circuit, for providing communication between the circuit and a remote RFID reader via RF signaling between the RFID interface and the remote RFID reader in a millimeter wave band of frequencies;
    an antenna section, coupled to the integrated circuit die, for facilitating the RF signaling between the RFID interface and the remote RFID reader, wherein the antenna section includes at least one bonding wire that connects the integrated circuit die to couplers for electrically connecting the integrated circuit to at least one external device and further operates as at least a portion of the antenna section;

a substrate coupled to support the first integrated circuit die and at least a portion of the antenna section.

11. The integrated circuit of claim 10 wherein the RF signaling between the RFID interface and the remote RFID reader includes reception of a millimeter wave RFID signal from the remote RFID reader and the backscattering of the millimeter wave RFID signal by the RFID interface.

12. The integrated circuit of claim 10 wherein the at least one bonding wire includes:

a first bonding wire that couples first signals between the circuit and the substrate; and a second bonding wire that couples second signals between the circuit and the substrate.

13. The integrated circuit of claim 12 wherein the at least one bonding wire further provides impedance matching to the RFID interface and the antenna section.

14. The integrated circuit of claim 12 wherein the at least one bonding wire further provides a transmission line.

15. The integrated circuit of claim 10 wherein the antenna section includes at least one power supply line for coupling power to the integrated circuit from a direct current power source and that further operates as at least a portion of an antenna.

16. The integrated circuit of claim 15 wherein the at least one power supply line includes:

a first power supply line for coupling a power signal to the circuit; and a second power supply line for coupling the power signal to the circuit.

17. The integrated circuit of claim 16 wherein the at least one power supply line further provides impedance matching to the RFID interface and the antenna section.

18. The integrated circuit of claim 16 wherein the at least one power supply line further provides a transmission line.

* * * * *